United States Patent [19]
Nagayama et al.

[11] Patent Number: 5,872,618
[45] Date of Patent: Feb. 16, 1999

[54] PROJECTION EXPOSURE APPARATUS

[75] Inventors: Tadashi Nagayama, Tokyo; Yuuki Ishii, Yokohama; Masahiro Nei, Kawasaki; Tohru Kiuchi, Tokyo, all of Japan

[73] Assignee: Nikon Corporation, Tokyo, Japan

[21] Appl. No.: 807,159

[22] Filed: Feb. 27, 1997

[30]      Foreign Application Priority Data

| Feb. 28, 1996 | [JP] | Japan | .................................... 8-067219 |
| Aug. 30, 1996 | [JP] | Japan | .................................... 8-229839 |
| Dec. 25, 1996 | [JP] | Japan | .................................... 8-356264 |

[51] Int. Cl.$^6$ .............................................. G03B 27/42
[52] U.S. Cl. ................................ 355/53; 355/67; 355/71
[58] Field of Search .......................... 355/43–45, 53–67, 355/77, 71; 250/548; 356/398–400

[56]              References Cited

U.S. PATENT DOCUMENTS

| 4,829,193 | 5/1989 | Nishi | ...................................... 250/548 |
| 4,853,745 | 8/1989 | Kamiya et al. | ............................ 355/43 |
| 5,194,893 | 3/1993 | Nishi | ...................................... 355/53 |
| 5,243,195 | 9/1993 | Nishi | ...................................... 250/548 |

FOREIGN PATENT DOCUMENTS

| 61-209831 | 9/1986 | Japan . |
| 62-150721 | 7/1987 | Japan . |
| 63-70104 | 3/1988 | Japan . |
| 64-10105 | 1/1989 | Japan . |
| 1-299402 | 12/1989 | Japan . |
| 4-277612 | 10/1992 | Japan . |
| 4-324923 | 11/1992 | Japan . |
| 5-21314 | 1/1993 | Japan . |

*Primary Examiner*—D. Rutledge
*Attorney, Agent, or Firm*—Shapiro and Shapiro

[57]                ABSTRACT

A is a projection exposure apparatus has a light sending optical system exhibiting a high degree of freedom of light sending. The light sending optical system comprises a light introducing system for introducing light beams from a predetermined light source into a substrate stage, and a light irradiating system for irradiating a predetermined area with the light beams introduced into the substrate stage by the light introducing system. The light introducing system and the light irradiating system are mechanically separated but optically connectable only when the substrate stage is in a specified positional relationship with respect to the projection optical system.

31 Claims, 28 Drawing Sheets

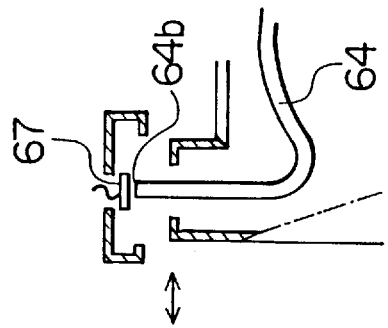
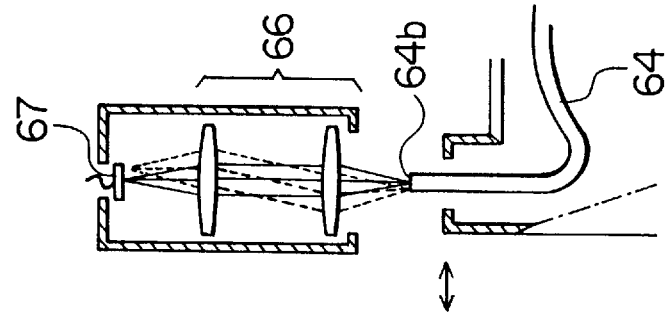
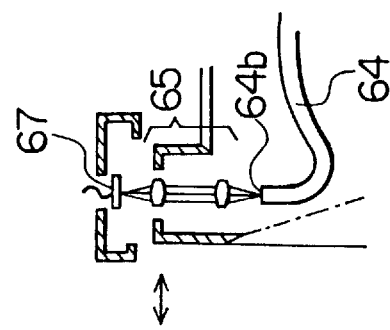
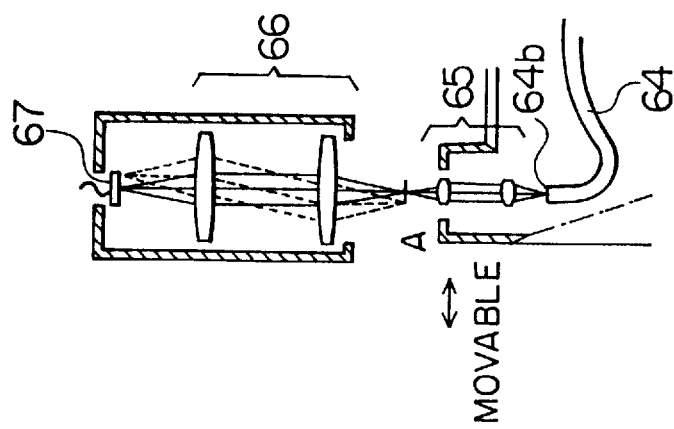

FIG. 8A
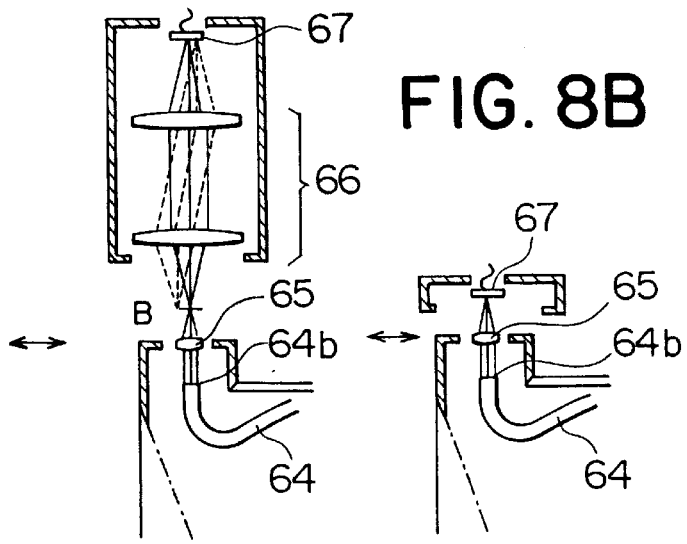
FIG. 8B
FIG. 9A  FIG. 9B
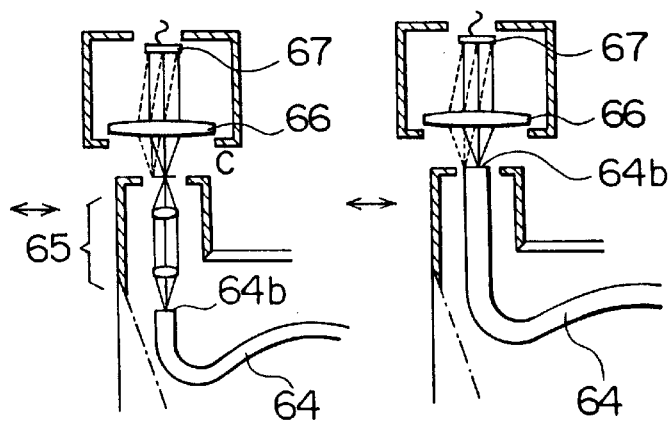
FIG. 10
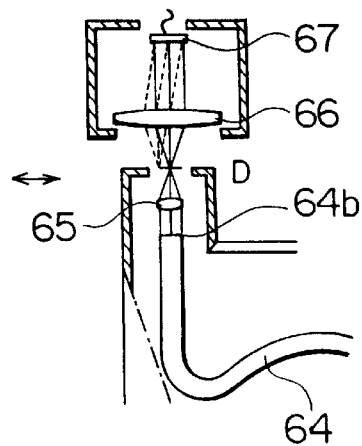

PROJECTION EXPOSURE APPARATUS

BACKGROUND OF THE INVENTION

1. Field of the Invention

The present invention relates generally to a projection exposure apparatus and method and, more particularly, to a projection exposure apparatus and method employed when manufacturing a semiconductor device or a liquid crystal display device in a lithography step.

2. Related Background Art

A projection exposure apparatus includes, as a light sending optical system incorporated into a movable wafer stage (a substrate stage), e.g., a movable light sending optical system for illuminating an index mark formed on an index plate on the wafer stage with light beams. The movable light sending optical system illuminates a moving target object such as an alignment mark with the light beams, and is therefore required to have a degree of freedom of light sending. Accordingly the movable light sending optical system involves the use of a flexible light guide composed of a bundle of a multiplicity of optical fibers in order to provide the degree of freedom of light sending.

FIG. 14 is a view schematically illustrating a construction of a prior art projection exposure apparatus including a movable light sending optical system using a flexible light guide.

Referring to FIG. 14, the light beams emitted from a light source 101 common to a main illumination optical system IL for an exposure are, after being reflected by an elliptical mirror 102, incident upon an incident end of a light guide 105 (having one incident end and two emerging ends) via a shutter 103 and a relay lens system 104. A light source image having a sufficient numerical aperture (NA) and diameter is formed at the incident end of the light guide 105.

Fluxes of light beams emerging from the two emerging ends of the light guide 105 respectively form illuminated fields having proper illumination numerical apertures (NAs) through condenser lenses 106, and Köhler-illuminate from under alignment marks 108 formed on stage substrate 107. The illumination light beams passing through the alignment marks 108 illuminate from under a mask 110 (a reticle) through a projection optical system 109. Thus, the illumination light beams passing through the alignment marks 108 are used as alignment light beams for aligning, e.g., the mask and the wafer.

Further, the projection exposure apparatus has, e.g., an illuminance scatter sensor system for measuring an illuminance distribution, in a wafer exposure area, of the main illumination light beams through the projection optical system. FIG. 15 is a view schematically showing a construction of the prior art projection exposure apparatus including the illuminance scatter sensor system.

Referring to FIG. 15, a pin hole 203 substantially flush with an exposure surface of a wafer 201 is formed on the wafer stage 202. Further, the wafer stage 201 incorporates a light receiving sensor 204. The light receiving sensor 204 receives the light beams from an illumination optical system IL via a transparent mask 205 and a projection optical system 206, through the pin hole 203.

The light receiving sensor 204 is connected to a unillustrated processing system. The processing system obtains an illuminance on the basis of a quantity of light beams reaching a light receiving surface of the light receiving sensor 204 through the pin hole 203 for, e.g., one second and an areal size of the pin hole 203. Thus, the illuminance distribution over the exposure area in the wafer 202 can be measured based on an output of the light receiving sensor 204 that is obtained by relatively moving the wafer stage 201, more particularly, the pin hole 203 with respect to the projection optical system 206.

Moreover, in the projection exposure apparatus, an optical system including the light sending optical system and the light receiving optical system that are provided in the movable wafer stage, has a focus calibration mechanism based on, e.g., a contrast detection method. FIG. 16 is a view schematically illustrating a prior art projection exposure apparatus having the focus calibration mechanism based on the contrast detection method.

Referring to FIG. 16, the light beams emitted from a light source 301 common to the main illumination optical system IL for the exposure are, after being reflected by an elliptical mirror 302, incident upon a first bifurcating end 305a of a two-way bifurcation light guide 305 via a shutter 303 and a relay lens system 304. A light source image having a sufficient numerical aperture (NA) and diameter is formed at the first bifurcating end 305a of the light guide 305.

The light beams emerging from an end 305b of the light guide 305 form an illuminated field having a proper illumination numerical aperture (NA) through the condenser lens 306, and Köhler-illuminate from under a transmissive pattern 308 formed on a stage substrate 307 provided on a wafer stage 312. The illumination light beams passing through the pattern 308 are incident on the undersurface of a mask 310 conjugate to a forming surface of the pattern 308 through a projection optical system 309. The light beams reflected by the undersurface of the mask 310 form a pattern image in superposition on the pattern 308 on the stage substrate 307 again through the projection optical system 309.

The light beams from the pattern image passing through the pattern 308 on the stage substrate 307 are incident on the end 305b of the light guide 305 via the condenser lens 306. The light beams emerging from a second bifurcating end 305c after being led to the light guide 305, are received by a light receiving sensor 311 having a light receiving surface located by the second bifurcating end 305c. Then, it is feasible to detect a best focus position with respect to a projection optical system 309.

Thus, there are secured the degree of freedom of the light sending for illuminating the moving target object (the transmissive pattern 308) with the light beams and the degree of freedom of the light receiving for receiving the light beams through the moving target object by use of the flexible light guide 305.

With a higher precision of the projection exposure apparatus in recent years, however, even if the light guide exhibits a high flexibility, an influence exerted on driving accuracies (a stepping accuracy and a scan accuracy) of the wafer stage is going to be unignorable. Further, when the light receiving sensor is incorporated into the wafer stage, and even if a high-performance air-conditioning mechanism is provided around the wafer stage, there can not be ignored influences exerted, by the heat evolved from the light receiving sensor, on the accuracies of other alignment systems as well as on the accuracy of a wafer stage laser interferometer.

SUMMARY OF THE INVENTION

It is a primary object of the present invention, which was contrived in view of the problems described above, to provide a projection exposure apparatus having a light sending optical system exhibiting a high degree of freedom of light sending.

It is another object of the present invention to provide a projection exposure apparatus having a light receiving optical system capable of minimizing an influence caused by a heat emission when receiving light beams and exhibiting a high degree of freedom of light receiving.

It is still another object of the present invention to provide a projection exposure apparatus having a light sending optical system having a high degree of freedom of light sending and a light receiving optical system having a high degree of freedom of light receiving.

To accomplish the above objects, according to a first embodiment of the present invention, a projection exposure apparatus for projecting a transfer pattern on a mask upon a photosensitive substrate, comprises an illumination optical system having a light source, a mask support member, disposed on a light path of illumination light beams from the illumination optical system, for supporting the mask formed with the transfer pattern, a projection optical system for forming an image of the pattern on the substrate on the basis of the illumination light beams from the mask, and a substrate stage, for holding the substrate, which is movable at least within a predetermined plane to locate the substrate with respect to the projection optical system. Also, a light sending optical system comprises a predetermined light source existing outside the substrate stage, a light introducing system so constructed as to introduce the light beams from the predetermined light source into the substrate stage, and a light irradiating system so constructed as to lead the light beams introduced into the substrate stage by the light introducing system, to a predetermined position on the substrate stage. Therein, the light introducing system and the light irradiating system are mechanically separated, and are located so that the light introducing system and the light irradiating system are optically connectable only when the substrate stage is in a specified positional relationship with respect to the projection optical system.

According to a second embodiment invention, a projection exposure apparatus for projecting a transfer pattern on a mask upon a photosensitive substrate, comprises an illumination optical system having a light source, a mask support member, disposed on a light path of illumination light beams from the illumination optical system, for supporting the mask formed with the transfer pattern, a projection optical system for forming an image of the pattern on the substrate on the basis of the illumination light beams from the mask, and a substrate stage, for holding the substrate, which is movable at least within a predetermined plane to locate the substrate with respect to the projection optical system. Also, a light receiving optical system comprises a light lead-out system so constructed as lead, outside the substrate stage, the light beams from the projection optical system that have been introduced into the substrate stage, and a light receiving system provided in such a position as to receive the light beams led outside the substrate stage by the light lead-out system. Therein, the light lead-out system and the light receiving system are mechanically separated, and are located so that the light lead-out system and the light receiving system are optically connectable in accordance with a positional relationship of the substrate stage versus the projection optical system.

According to a third embodiment, a projection exposure apparatus for projecting a transfer pattern on a mask upon a photosensitive substrate, comprises an illumination optical system having a light source, a mask support member, disposed on a light path of illumination light beams from the illumination optical system, for supporting the mask formed with the transfer pattern, a projection optical system for forming an image of the pattern on the substrate on the basis of the illumination light beams from the mask, and a substrate stage, for holding the substrate, which is movable at least within a predetermined plane for locating the substrate with respect to the projection optical system. Also, a light sending optical system comprises a predetermined light source existing outside the substrate stage, a light introducing system so constructed as to introduce the light beams from the predetermined light source into the substrate stage, and a light irradiating system so constructed as to lead the light beams introduced into the substrate stage by the light introducing system, to a predetermined position on the substrate stage. Therein, the light introducing system and the light irradiating system are mechanically separated and located so that the light introducing system and the light irradiating system are optically connectable in accordance with a positional relationship of the substrate stage versus the projection optical system. Further, a light receiving optical system comprises a light lead-out system so constructed as to lead, outside the substrate stage, the light beams from the projection optical system that have been introduced into the substrate stage, and a light receiving system provided in such a position as to receive the light beams led outside the substrate stage by the light lead-out system. Therein, the light lead-out system and the light receiving system are mechanically separated and located so that the light lead-out system and the light receiving system are optically connectable in accordance with a positional relationship of the substrate stage versus the projection optical system.

BRIEF DESCRIPTION OF THE DRAWINGS

Other objects and advantages of the present invention will become apparent during the following discussion in conjunction with the accompanying drawings, in which:

FIGS. 7A to 7D are partially enlarged views schematically showing constructions of the principal portions in modified embodiments of a light lead-out portion and a light receiving portion in accordance with a third embodiment;

FIGS. 8A and 8B are partially enlarged views schematically illustrating constructions of the principal portions in modified embodiments of the light lead-out portion and the light receiving portion in the third embodiment;

FIGS. 9A and 9B are partially enlarged views schematically illustrating constructions of the principal portions in modified embodiments of the light lead-out portion and the light receiving portion in the third embodiment;

FIG. 10 is a partially enlarged portion schematically illustrating a construction of the principal portion in a modified embodiment of the light lead-out portion and the light receiving portion in the third embodiment;

DETAILED DESCRIPTION OF THE PREFERRED EMBODIMENTS

Figure 1:
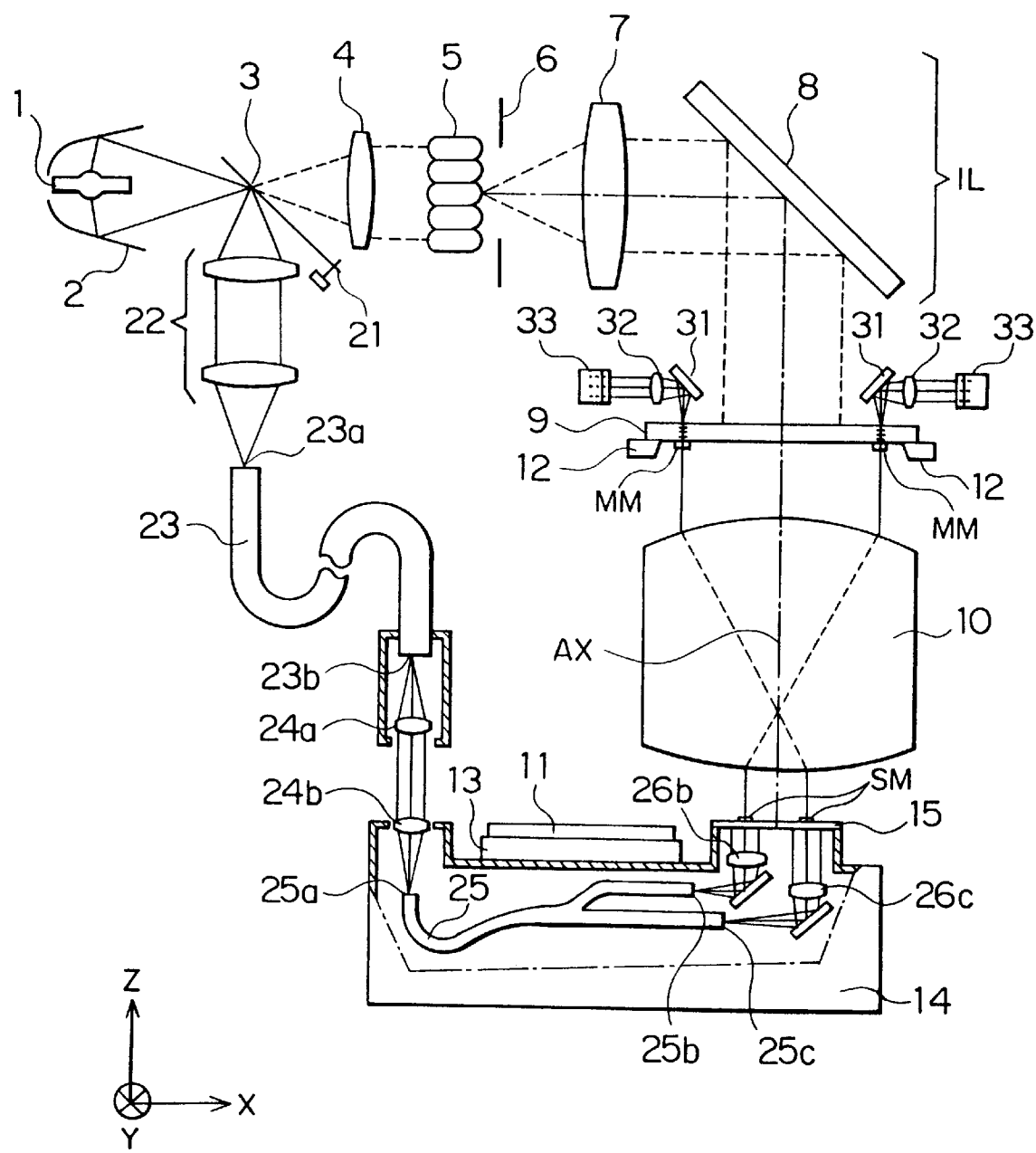
FIG. 1 is a view schematically illustrating a construction of a projection exposure apparatus in accordance with a first embodiment of the present invention.

In a light sending optical system provided in a projection exposure apparatus of the present invention, a light introducing system for introducing light beams from a predetermined light source into a substrate stage and a light irradiating system for irradiating a predetermined area with the thus introduced light beams through and within a substrate stage, are mechanically separated and unconnected. Then, the light introducing system and the light irradiating system are so constructed as to be optically connectable only when the substrate stage is in a specified position with respect to a projection optical system.

According to a preferred mode thereof, the light sending optical system comprises a first light guide member for guiding the light beams from a predetermined light source to a predetermined position outside the substrate stage, and a second light guide member for guiding the light beams emerging from an emerging end of the first light guide member to a predetermined position inside the substrate stage.

The emerging end of the first light guide member and the incident end of the second light guide are so located as to be optically conjugate through, e.g., a relay lens system. In this case, a part of lens elements of the relay lens system is fixedly provided in the substrate stage, while the remaining lens element of the relay lens system is provided outside outwardly of the substrate stage. Then, in accordance with a positional relationship of the substrate stage versus the projection optical system, an optical axis of the lens element fixedly provided in the substrate stage is substantially coincident with an optical axis of the lens element provided outside the substrate stage. In this state, the two lens elements constitute the relay lens system.

Further, the emerging end of the first light guide member can be located in close proximity to the incident end of the second light guide member.

Moreover, according to another preferred mode, the projection exposure apparatus comprises a first light guide member for guiding the light beams from a predetermined light source to a predetermined position between the projection optical system and the mask, and a second light guide member for guiding the light beams guided into the substrate stage through the projection optical system after emerging from the emerging end of the first light guide member, to a predetermined position within the substrate stage.

A lens system for optically connecting the emerging end of the first light guide member to the incident end of the second light guide member is further provided on one of optical paths between the emerging end of the first light guide member and the projection optical system and between the projection optical system and the incident end of the second light guide member. Then, in accordance with the positional relationship of the substrate stage versus the projection optical system, the emerging end of the first light guide member is optically connected to the incident end of the second light guide member through the lens system.

Further, in the projection exposure apparatus described above, the projection optical system has a predetermined projection field on the substrate stage. The light introducing system and the light irradiating system are optically connected when in a state where the predetermined position on the substrate stage exists within the projection field. In this case, a predetermined pattern area is formed in the predetermined position on the substrate stage.

Moreover, according to still another preferred mode thereof, the light introducing system in the light sending optical system introduces the light beams to the light irradiating system within the substrate stage from the side of the projection optical system of the substrate stage. At this time, it is unnecessary for the optical axis of the light introducing system to be parallel to the optical axis of the projection optical system. If there is a constraint in terms of disposition of the light introducing system, the system may be constructed to lead the light beams in the direction oblique to the optical axis of the projection optical system (with such a construction that the optical axis of the light introducing system bears a twisted relationship with the optical axis of the projection optical system). In this case, it is desirable that the optical axis of the light introducing system be parallel to the optical axis of the light irradiating system.

Thus, in the light sending optical system provided in the projection exposure apparatus of the present invention, unlike the prior art in which the exterior and interior of the substrate stage are connected via the light guide, it is possible to actually provide a the light sending optical system exhibiting an extremely high degree of freedom of the light sending without exerting any influence on the driving accuracies of the substrate stage.

Further, in the light sending optical system provided in the projection exposure apparatus of the present invention, the optical connection is made only when the substrate stage is in a specified positional relationship with the projection optical system, and hence there is no necessity for following up the substrate stage at all times in the light introducing system of the light sending optical system. It is therefore feasible to highly simplify the construction of the light sending optical system itself without providing, e.g., a movable mirror in the light introducing system.

Furthermore, supposing that the light beams having a predetermined a light flux diameter and a predetermined numerical aperture are optically connected between the light introducing system and the light irradiating system in the light sending optical system, there must be adopted a complicated optical system such as a double-conjugate maintaining optical system as the light introducing system and the light irradiating system as well in order to follow up the substrate stage at all times. If constructed to make the optical connection only when the projection optical system and the substrate stage are in the specified relationship, however, it is feasible to optically connect the light beams having the predetermined light flux diameter and the predetermined numerical aperture even without adopting the intricate optical system described above.

Note that the "specified positional relationship between the projection optical system and the substrate stage" implies not only that the position of the substrate stage with respect to the projection optical system exists in one specified place but also that the position of the substrate stage exists within an area narrower than the movable range of the substrate stage and containing one specified place given above according to the present invention.

Additionally, in a light receiving optical system provided in the projection exposure apparatus of the present invention, the light lead-out system for leading, outside the substrate stage, the light beams introduced into the substrate stage, is mechanically separated from and unconnected to the light receiving system for receiving the light beams lead outside the substrate stage. Then, in accordance with the positional relationship of the substrate stage versus the projection optical system, the light lead-out system and the light receiving system are so constructed as to be optically connectable.

The light lead-out system and the light receiving system are optically connectable only when the substrate stage is in a specified positional relationship with respect to the projection optical system. In this case, the projection optical system has a predetermined projection field on the substrate stage, and the light lead-out system and the light receiving system are optically connected when in a state where the predetermined position on the substrate stage exists within the projection field.

According to a preferred mode thereof, the above light receiving optical system includes a third light guide member for guiding the light beams introduced into the substrate stage through the projection optical system to a predetermined position inside or outside the substrate stage, and a light receiving portion for receiving the light beams emerging from an emerging end of the third light guide in the predetermined position outside the substrate stage.

The emerging end of the third light guide member and the light receiving surface of the light receiving portion are so located as to be optically conjugate through, e.g., the relay lens system. In this case, a part of the lens elements of the relay lens system is fixedly provided in the substrate stage, while the remaining lens element of the relay lens system is provided outside of the substrate stage.

Then, in accordance with the positional relationship of the substrate stage versus the projection optical system, the optical axis of the lens element fixedly provided in the substrate stage is substantially coincident with the optical axis of the lens element provided outside of the substrate stage. In this state, these two lens elements constitute the relay lens system.

Moreover, the emerging end of the third light guide member can be located in close proximity to the light receiving surface of the light receiving portion. Thus, also in the light receiving optical system provided in the projection exposure apparatus of the present invention, unlike the prior art in which the exterior and interior of the substrate stage are connected through the light guide, it is feasible to actually provided the light receiving optical system exhibiting the extremely high degree of freedom of light receiving without exerting any influence on the driving accuracies of the substrate stage. Further, unlike the prior art in which the substrate stage incorporates the light receiving portion, the light receiving portion is located in the desired position outside the substrate stage, and an influence by the heat emission when receiving the light beams can be refrained.

Also, a projection exposure apparatus of the present invention comprises the light sending optical system having the above light introducing system and light irradiating system, and the light receiving optical system having the above light lead-out system and light receiving system. According to a preferred mode of the present invention, the introducing system and the light irradiating system are so located as to be optically connectable only when the substrate stage is in a specified positional relationship with respect to the projection optical system. The light lead-out system and the light receiving system are so located as to be optically connectable only when the substrate stage is in the specified positional relationship of the substrate stage versus the projection optical system.

Further, the projection optical system has a predetermined projection field on the substrate stage, and the specified positional relationship is a state where the predetermined position on the substrate stage exists within the projection field.

A predetermined pattern area is formed in the predetermined position on the substrate stage.

Moreover, the light irradiating system leads the light beams from the light introducing system to the predetermined pattern area, and the light introducing system receives the light beams from the predetermined pattern, which beams travel in a sequence such as the projection optical system, the mask and the projection optical system.

Additionally, an optical member, closest to the substrate stage, of the light introducing system and an optical member, closest to the substrate stage, of the light receiving system, are located with substantially the same plane.

Also, the projection exposure apparatus further comprises a fine adjustment mechanism for finely moving at least one of the light introducing system and the light receiving system.

Moreover, at least one of the light introducing system and the light receiving system has a field, a size of which is substantially equal to the field of the projection optical system.

The projection exposure apparatus further comprises a double-purpose optical system serving as the light introducing system of the light sending optical system and as the light receiving system of the light receiving optical system.

Further, the light sending optical system comprises a fourth light guide member so located as to guide the light beams from the predetermined light source to the outside predetermined position, and a fifth light guide member so located as to guide the light beams emerging from an emerging end of the fourth light guide member. The light receiving optical system comprises a sixth light guide member so located as to guide the light beams from the projection optical system, which have been introduced into the substrate stage, to a predetermined position outside the substrate stage, and a light receiving portion, located in the predetermined position outside the substrate stage, for receiving the light beams emerging from an emerging end of the sixth light guide member.

The fifth light guide member and the sixth light guide member are composed of a common double-purpose light guide member.

Moreover, a light receiving surface of the light receiving portion is so located as to be capable of receiving the light beams from the light lead-out system through the fourth light guide member.

Furthermore, the light introducing system leads the light beams to the light irradiating system within the substrate stage from the side of the projection optical system of the substrate stage.

A method of manufacturing a semiconductor device according to the present invention comprises a step of transferring a circuit pattern formed on a mask onto a photosensitive substrate through a projection optical system by use of the projection exposure apparatus.

The method of manufacturing the semiconductor device further comprises a step of detecting a position of the mask with respect to the predetermined pattern on the substrate stage.

Also, according to a preferred mode of the present invention, the projection exposure apparatus includes an illumination system for illuminating a mask formed with a pattern with the light beams, a projection optical system for projecting a pattern image on a sensitive substrate, and a substrate stage for two-dimensionally moving the sensitive substrate in X- and Y-directions along an image forming surface of the projection optical system and moving the sensitive substrate in a Z-direction perpendicular the image forming surface. This projection exposure apparatus further comprises a first optical system (a light receiving optical system) for irradiating the substrate stage with the light beams from a light source provided separately from the substrate stage, and a second optical system (a light receiving optical system), provided in the substrate stage to receive the light beams irradiated from the first optical system, for leading the incident light beams to a predetermined pattern area on the substrate stage. The first optical system and the second optical system are mechanically separated and optically connectable in such a position of the substrate stage that a predetermined area exists within at least a field of the projection optical system.

With this construction, in the stage requested to have a high-precision movement, it is feasible to prevent a trouble caused by connecting the interior and exterior of the stage via the optical fibers (the light guide), for example, to prevent the stress of the optical fibers with the movement of the stage from exerting the influence on the control accuracy of the stage.

According to a preferred mode of the present invention, in the above projection exposure apparatus, the first optical system includes the light sending optical system (the light introducing system) for sending the light beams from the light source to the substrate stage, and the light receiving optical system (the light irradiating system) for receiving the light beams from the second optical system. The second optical system includes the light sending optical system (the light lead-out system) for sending the light beams received from the light sending optical system of the first optical system to a predetermined pattern area, and the light receiving optical system (the light receiving system) for receiving the reflected light beams with which the pattern area and the mask are irradiated through the projection optical system.

Further, an interval between the light sending optical system' and the light receiving optical system that are provided in the first optical system, is set substantially equal to an interval between the light sending optical system and the light receiving optical system' that are provided in the second optical system.

Moreover, according to a still further mode thereof, the light sending optical systems and the light receiving optical systems, including the first and second optical systems, respectively, are so constructed as to each exist within the same plane.

Furthermore, the first optical system includes a light sending/receiving optical system serving as the light sending optical system for sending the light beams from the predetermined light source to the substrate stage, and as the light receiving optical system for receiving the light beams sent from the second optical system. The construction of the whole apparatus can be thereby simplified.

With a construction containing a fine movement mechanism for finely moving the first optical system, the first optical system and the second optical system can be optically connected accurately, thereby making a final high-accuracy exposure possible.

Moreover, the first optical system contains a condenser lens for defining such a field as to cover a size substantially equal to an intra-effective-field size of the projection optical system. With this construction, the first optical system and the second optical system can be optically connected easily at all times without depending on the positional change of the second optical system with the movement of the stage.

Embodiments of the present invention will hereinafter be described in detail with reference to the accompanying drawings.

Figure 2:
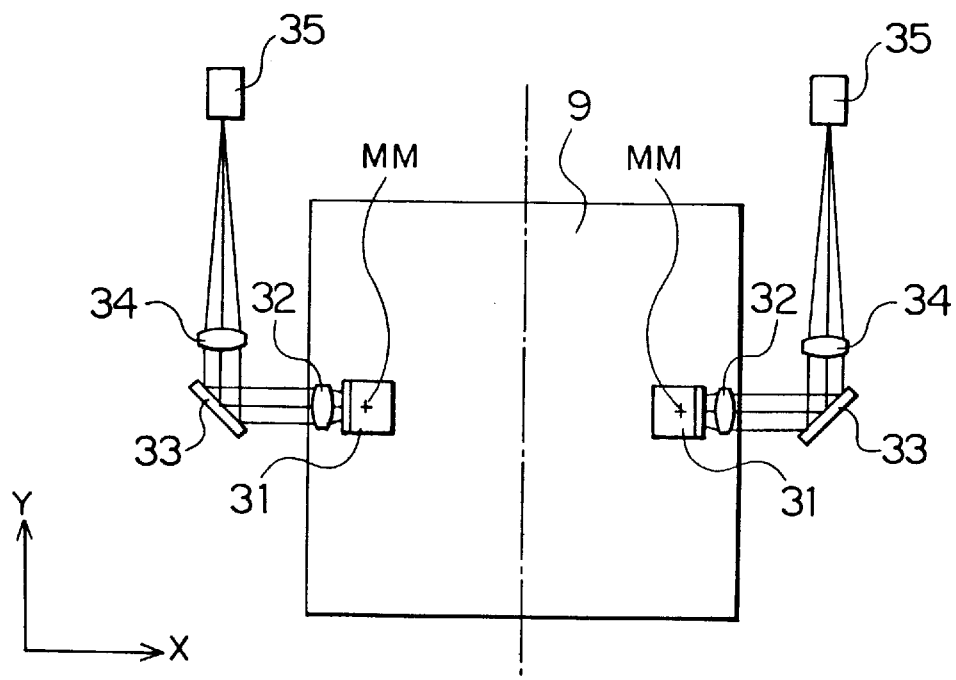
FIG. 2 is a top view of a detection optical system of an alignment system shown in FIG. 1.

FIG. 1 is a view schematically illustrating a construction of a projection exposure apparatus in accordance with a first embodiment of the present invention. Further, FIG. 2 is a top view showing a detection optical system in an alignment system. The first embodiment is contrived suitably for the projection exposure apparatus including a stage light emitting type alignment system.

Referring to FIG. 1, a Z-axis is set parallel to an optical axis AX of a projection optical system 10, an X-axis is set parallel to the sheet surface of FIG. 1 within a plane perpendicular to the optical axis AX, and a Y-axis is set perpendicular to the sheet surface of FIG. 1 within the plane perpendicular to the optical axis AX.

Generally, the projection exposure apparatus is used for manufacturing the semiconductor device or the liquid crystal display device. In the projection exposure apparatus, a mask (or a photo mask) such as, e.g., a reticle, is illuminated with exposure light, and a mask pattern image is projected through the projection optical system on a photosensitive substrate such as a wafer (or a glass plate, etc.) coated with a photo resist. Note that the exposure light involves the use of emission line (g-line, i-line, etc.) of a mercury lamp, and excimer laser beams.

In the projection exposure apparatus, when performing an exposure, it is required that the mask and the wafer be precisely aligned. For this purpose, the projection exposure apparatus incorporates an alignment system for aligning the mask and the wafer. When carrying out the alignment, to start with, the mask is located on a mask stage. Subsequently, after finishing locating the mask, a relative position of the mask to a wafer stage is measured. Based on a result of this measurement, the mask or the wafer is moved, thereby aligning the mask and the wafer. For example, a stage light-emitting type alignment system has hitherto been used as an alignment system.

The projection exposure apparatus shown in FIG. 1 has a light source 1 consisting of, e.g., a mercury lamp. The light source 1 is located in a first focal position of an elliptical mirror 2 having a reflection surface consisting of a rotary elliptical surface. Hence, illumination light beams emitted from the light source 1 form a light source image (a primary light source) in a second focal position 3 of the elliptical mirror 2.

The light beams from this light source image are collimated into substantially parallel light beams by an input lens 4, and are thereafter incident upon a bandpass filter (unillustrated) that transmits only the light beams having a desired wavelength band. The illumination light beams having an exposure wavelength (e.g., the i-line having a wavelength of 265 nm, or the g-line with a wavelength of 436 nm) selected by the bandpass filter, fall upon a fly-eye lens 5. The light beams incident upon the fly-eye lens 5 are split by a plurality of lens elements constituting the fly-eye lens 5, thus forming a secondary light source consisting of a plurality of light source images.

Figure 3:
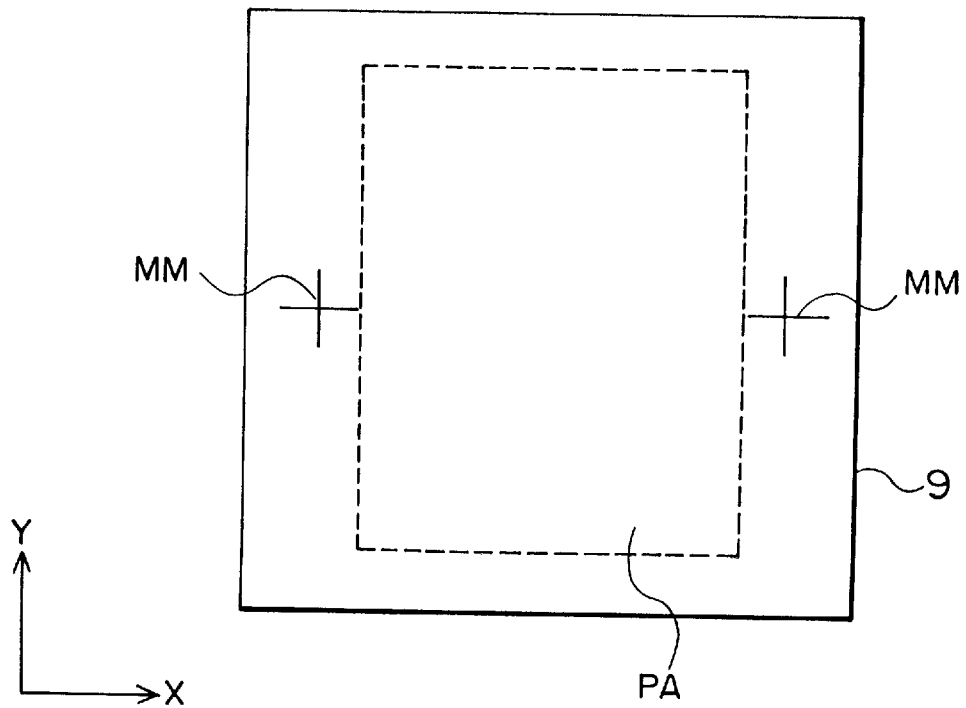
FIG. 3 is a view showing cross-shaped mask marks MM formed on a mask 9.

The light beams coming from the secondary light source are stopped down by an aperture stop 6, and thereafter illuminate in superposition the mask 9 formed with a predetermined pattern via a main condenser lens 7 and a deflection mirror 8. The mask 9 is held on the mask stage 12 within an XY-plane. XY-coordinates of the mast stage 12 and more particularly the XY-coordinates of the mask 9 are measured at all times by an unillustrated mask stage laser interferometer. Further, as depicted in FIG. 3, cross-shaped mask marks MM are formed respectively at both edge portions of a pattern area PA of the mask 9 in an X-direction. Note that each mask mark MM is a so-called reflection pattern constructed so that the mark portion reflects the light beam.

Thus, a main illumination optical system IL for illuminating the mask 9 with the exposure illumination light beams is constructed of the light source 1, the elliptical mirror 2, the input lens 4, the fly-eye lens 5, the aperture stop 6, the main condenser lens 7 and the deflection mirror 8.

The light beams penetrating the pattern of the mask 9 reach the wafer 11 defined as a photosensitive substrate via the projection optical system 10. Thus, the pattern image of the mask 9 is formed on the wafer 11.

The wafer 11 is held on a wafer stage 14 within the XY plane through a wafer holder 13. The wafer stage 14 is constructed of an XY-stage for locating the wafer 11 two-dimensionally within the XY plane, a Z-stage for locating the wafer 11 in a Z-direction, and a leveling stage for compensating an inclined angle of the wafer 11. XY-coordinates of the wafer stage 14 and more particularly XY-coordinates of the wafer 11 are measured at all times by an unillustrated wafer stage laser interferometer.

Accordingly, the projection exposure is performed while the wafer 11 is two-dimensionally drive-controlled, whereby the pattern of the mask 9 can be sequentially transferred on each of exposure areas of the wafer 11.

Figure 4:
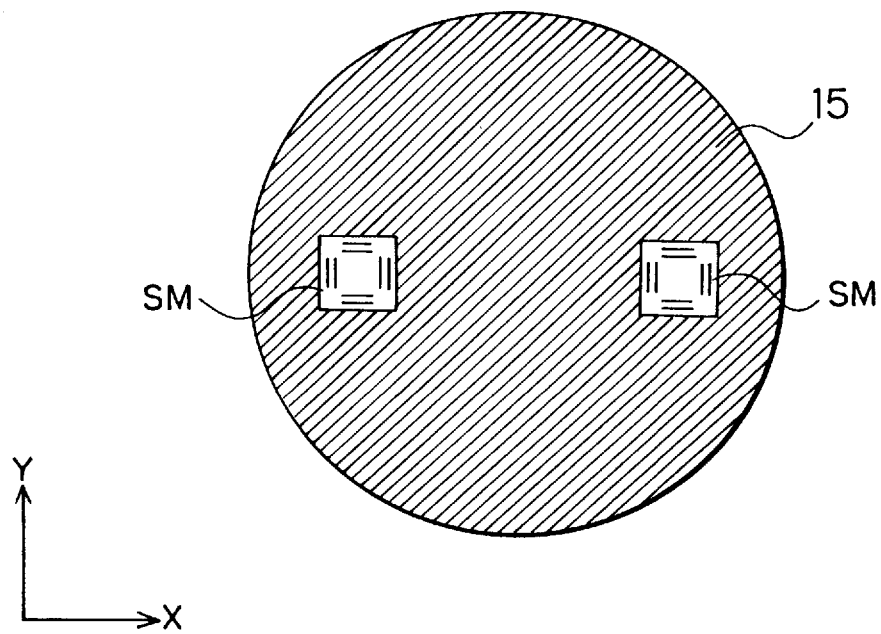
FIG. 4 is a view illustrating fiducial marks SM formed on the upper surface of a stage substrate 15.

A light transmissive stage substrate 15 composed of, e.g., a glass substrate is provided in the vicinity of the wafer holder 13. Note that an upper surface of the stage substrate 15 is set substantially flush with (substantially in the same height position as) an exposure surface of the wafer 11. Further, fiducial marks SM are, as illustrated in FIG. 4, formed in two areas showing a center symmetry about, e.g., the X-axis on the upper surface of the stage substrate 15. The fiducial marks SM are formed of reflection patterns (reflecting on mark portions) within, e.g., rectangular openings.

The projection exposure apparatus in FIG. 1 is provided with the alignment system for detecting relative positions of the mask marks MM with respect to the wafer stage 14.

The alignment system includes a shutter 21 for selectively guiding the light beams from the exposure light source 1 to an optical path of the alignment system from a light path of the main illumination optical system. The alignment illumination light beams guided via the shutter 21 are incident on an incident end 23a of a light guide 23 via a relay lens system 22. The incident end 23a of the light guide 23 is formed with a light source image having a sufficient numerical aperture (NA) and a diameter.

The light beams falling upon the incident end 23a of the light guide 23 are guided to an emerging end 23b thereof. The light beams from the emerging end 23b of the light guide 23 are incident upon an incident end 25a of a light guide 25 having one incident end and two emerging ends, and then guided to emerging ends 25b, 25c thereof.

The light beams from the emerging ends 25b, 25c of the light guide 25 form an illuminated field having a proper illumination numerical aperture (NA) through condenser lenses 26b, 26c, respectively, and Köhler-illuminate the pair of fiducial marks formed on the stage substrate 15.

Thus, a light sending optical system for illuminating the fiducial marks SM with the alignment light beams is constructed of the light source 1, the elliptical mirror 2, the shutter 21, the relay lens system 22, the light guide 23, the relay lens system 24, the light guide 25 and the condenser lens 26. Then, the light source 1, the elliptical mirror 2, the shutter 21, the relay lens system 22, the light guide 23 and the lens 24a are located outside of the wafer stage 14, and constitute a light introducing portion for introducing the alignment light beams into the wafer stage 14. Further, the lens 24b, the light guide 25 and the condenser lens 26 are fixedly provided inside the wafer stage 14, and constitute a light irradiating portion for irradiating the fiducial marks SM with the alignment light beams introduced into the wafer stage 14.

Thus, the pair of fiducial marks SM are Köhler-transmission-illuminated with the light beams from beneath by the light sending optical system of the alignment system. The light beams penetrating the respective fiducial marks SM consisting of the reflection patterns illuminate the corresponding mask marks MM formed on the undersurface of the mask 9.

Note that the alignment light beam has the same wavelength as the exposure light beam, and the center of the stage substrate 15 is located with respect to the optical axis AX of the projection optical system 10 when effecting the alignment. Accordingly, images of the corresponding fiducial marks SM are formed in superposition on the respective mask marks MM. That is, the corresponding mask marks MM are illuminated with the light beams owing to the images of the fiducial marks SM.

The illumination light beams through the mask marks MM are incident on a detection optical system of the alignment system. The detection optical system comprises a first detection optical system for detecting a relative position of one mask mark of the pair of mask marks MM, and a second detection optical system for detecting a relative position of the other mask mark. Note that the two detection optical systems each having the same configuration are, as illustrated in FIGS. 1 and 2, disposed in symmetry with respect to the Y-axis.

Figure 5:
FIG. 5 is a view schematically showing a synthetic image of the fiducial mark SM and the mask mark MM that are formed on an imaging plane of a two-dimensional imaging device 35 shown in FIG. 2.

The illumination light beams passing through the respective mask marks MM are reflected by a light path deflection mirror 31, and thereafter form a synthetic image of the fiducial mark SM and the mask mark MM on an image forming surface of a two-dimensional imaging device 35 consisting of a two-dimensional CCD, etc. through a first objective lens 32, a mirror 33 and a second objective lens 34. FIG. 5 is a diagram schematically illustrating the synthetic image of the fiducial mark SM and the mask mark MM, which is formed on the image forming surface of the two-dimensional imaging device 35.

As described above, the mask mark MM is transmission-illuminated with the light beams passing through the image of the fiducial mark SM. Hence, if both of a transmissivity of a light shielding portion of the mask mark MM and a transmissivity of a light shielding portion of the fiducial mark SM are small (normally, this condition is satisfied), the synthetic image with a good contrast can be obtained in the image forming surface of the two-dimensional imaging device 35.

Then, a positional deviation of the mask mark MM from the fiducial mark SM is detected by, e.g., a visual observation on the basis of two-dimensional image data given from the two-dimensional imaging device 35. Furthermore, the two-dimensional image data are image-processed, thereby detecting the positional deviation of the mask mark MM as a positional deviation quantity along the X- and Y-coordinates on the wafer stage 14.

Thus, positional relationships (the two-dimensional positional deviation quantity, and an angle of rotation about the Z-axis) of the mask 9 versus the wafer stage 14, are obtained based on the positional deviation quantities of the two mask marks MM formed on the mask 9 with respect to the wafer stage 14.

Next, the mask 9 is properly moved by driving the mask stage 12 so that the positional relationships of the mask 9 versus the wafer stage 14 fall within a desired allowable range. Then, the positional relationships of the wafer versus the wafer stage 14 are re-measured, and it is confirmed that the measured positional relationships fall within the desired allowable range, thus finishing the alignment.

As discussed above, in accordance with the first embodiment, the light introducing portion for introducing the alignment light beams into the wafer stage 14, is spaced away from the light irradiating portion for irradiating the fiducial marks SM with the alignment light beams introduced into the wafer stage 14. Then, when executing the alignment, the stage substrate 15 is located with respect to the projection optical system 10, at which time the optical axis of the lens 24a of the light introducing portion is substantially coincident with the optical axis of the lens 24b, and the pair of lenses 24a, 24b constitute the relay lens system.

That is, in the first embodiment, the light introducing portion and the light irradiating portion are mechanically separated but are not connected in the light sending optical system of the alignment system. Then, only when aligned, the light introducing portion and the light irradiating portion are optically connected through the relay lens system 24. Accordingly, unlike the prior art wherein the exterior and interior of the wafer stage 14 are connected via the light guide, it is feasible to attain the light sending optical system exhibiting an extremely high degree of freedom of the light sending without exerting any influence upon a driving accuracy of the wafer stage. Note that the detection optical system of the alignment system may be, as a matter of course, constructed the same as the prior art.

Note that the light introducing portion and the light irradiating portion are optically connected through the relay lens system 24 in the first embodiment. Hence, it is possible to easily optically connect the light introducing portion and the light irradiating portion to each other while sufficiently securing the space in between the two lenses constituting the relay lens system 24. Herein, the system is constructed so that the emerging edge 23b of the light guide 23 is conjugate to the incident end 24a of the relay lens system 24. The emerging end 23b and the incident end 24a may not be, however, conjugate to each other. Further, any number of relay lens systems may be provided, and the relay lens system may be provided on the side of only the light introducing portion or the light irradiating portion.

If there exists no particular spatial restraint between the light introducing portion and the light irradiating portion, however, the light introducing portion may be optically connected to the light irradiating portion by making the emerging end 23b of the light guide 23 of the light introducing portion sufficiently proximal to the incident end 25a of the light guide 25 of the light irradiating portion through no intermediary of the relay lens system 24.

Figure 17:
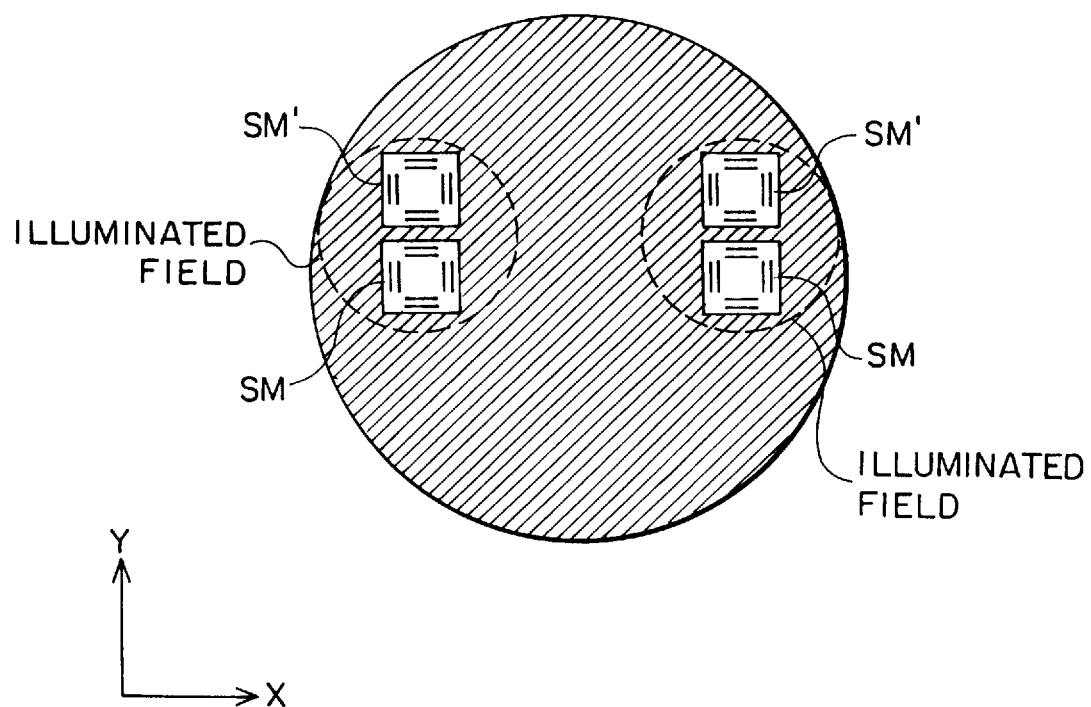
FIG. 17 is a view showing how a fiducial mark SM' is disposed in a position shifted in a Y-axis direction within the same field in the vicinity of the fiducial mark SM on the stage substrate 15 in the first embodiment.
Figure 18A:
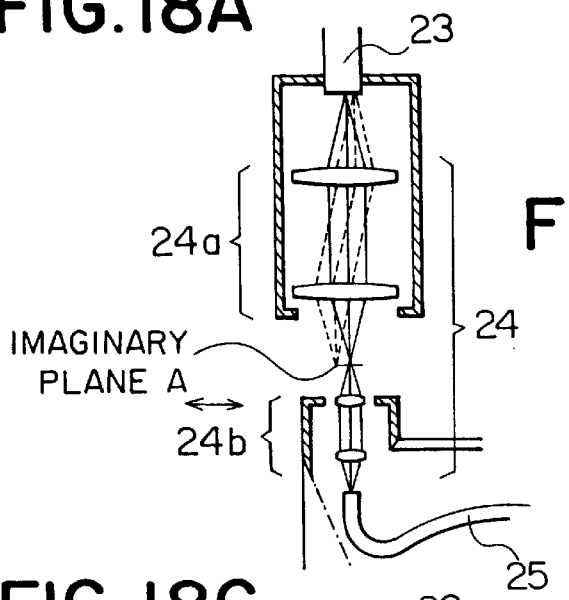
FIGS. 18A to 18F are partially enlarged views schematically showing constructions of the principal portions in modified embodiments of the light introducing portion and the light irradiating portion in the first embodiment.
Figure 18B:
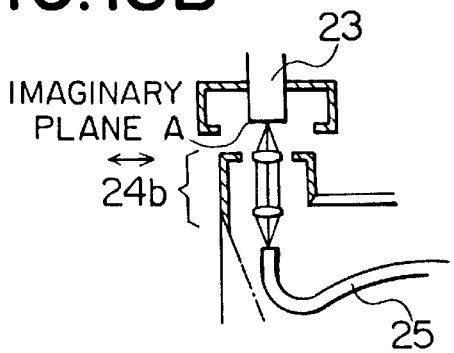
Figure 18C:
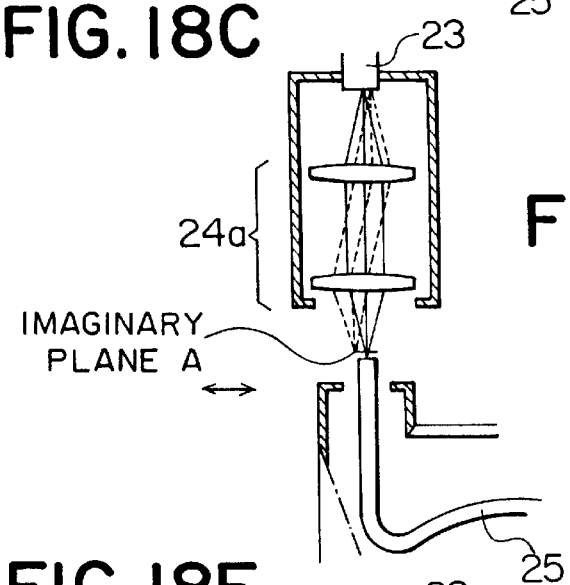
Figure 18D:
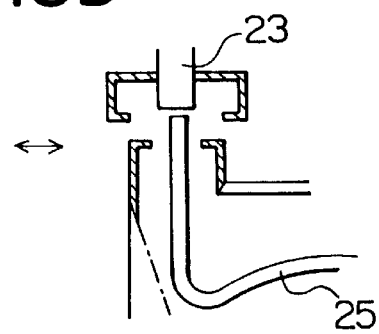
Figure 18E:
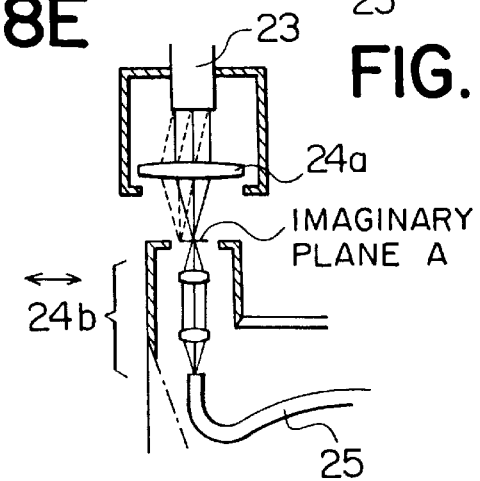
Figure 18F:
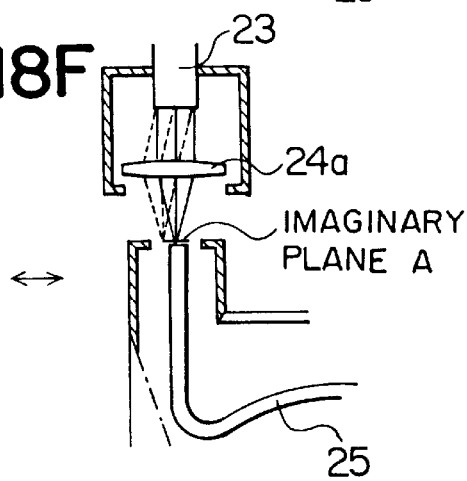

Furthermore, in the first embodiment, for simplifying the explanation, the light beams are sent only when locating the stage substrate 15 in a certain position (one point) with respect to the projection optical system 10 when aligned. A fixed area is easily illuminated inside with the light beams without being limited particularly to one point. This is applied to, for instance, such a case that, as illustrated in FIG. 17, a fiducial mark SM' is set in a position shifted in the Y-axis direction within the same field in the vicinity of the fiducial mark SM on the stage substrate 15, and the alignment mark of the mask is illuminated with the light beams by use of the fiducial mark SM' instead of the fiducial mark SM.

In this case, if constructed so that the light beams incident upon the incident end 25a of the light guide 25 on the wafer stage do not change due to the movement of the wafer stage, the stable illumination can be always given. FIG. 18 shows constructions in cases wherein when the incident position of the light irradiating portion on the wafer stage is set as an imaginary plane A in the first embodiment in FIG. 1, the imaginary plane A is conjugate to the incident end 25a of the light guide 25 within the wafer stage ((a), (b) and (e)), and the imaginary plane A is the same as the incident end 25a ((c), (d) and (f)). Herein, a relationship between the emerging end 23b of the light guide 23 and the imaginary plane A is conjugate in (a) and (c), and is substantially the same in (b) and (d). Also, the above relationship therebetween becomes a relationship of Köhler illumination (the emerging end 23b is in a pupil position with respect to the imaginary plane A) in (e) and (f). In any case, a secondary light source is, it can be considered, formed on the imaginary plane A. If a diameter of this secondary light source is amply large for the movement of the wafer stage, and if the illumination NA within the area is uniform, the light beams falling on the incident end 25a of the light guide 25 remain unchanged even when the wafer stage moves.

Figure 19A:
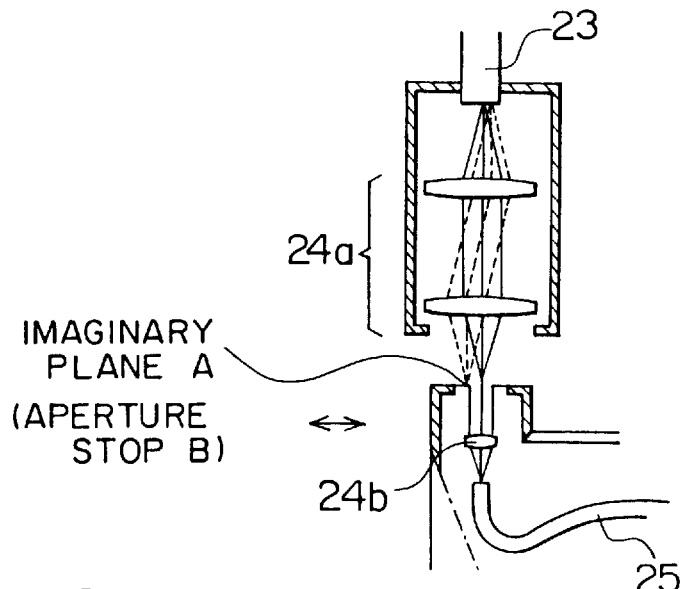
FIGS. 19A to 19C are partially enlarged views schematically illustrating constructions of the principal portions in modified embodiments of the light introducing portion and the light irradiating portion in the first embodiment.
Figure 19B:
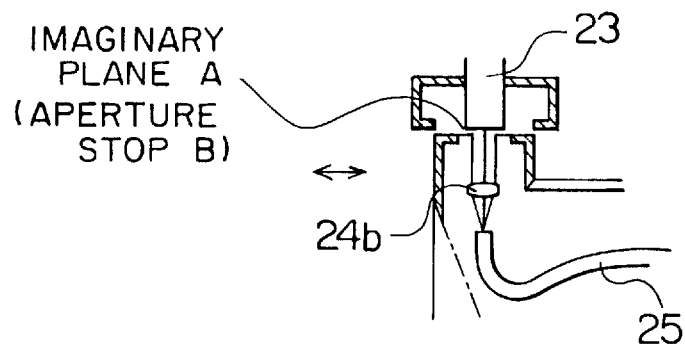
Figure 19C:
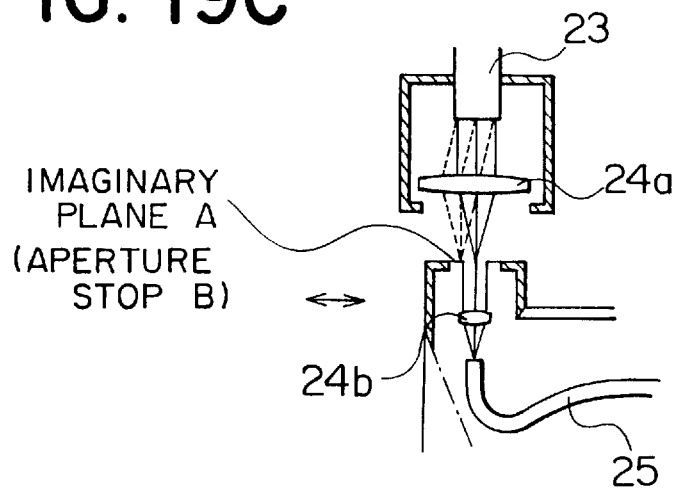

Further, FIG. 19 illustrates a construction in a case where the imaginary plane A and the incident end 25a of the light guide 25 are in the relationship of Köhler illumination (the imaginary plane A is in the pupil position with respect to the incident end 25a). Herein, the relationship between the imaginary plane A and the emerging end 23b of the light guide 23 is conjugate in (a), and is substantially the same in (b). This relationship is of the Köhler illumination (the emerging end 23b is in the pupil position with respect to the imaginary plane A) in (c). In any case, it can be conceived that the secondary light source is formed on the imaginary plane A. If a diameter of this secondary light source is sufficiently large for the movement of the wafer stage, and if the illumination NA within the area is uniform, it is feasible to provide such a construction that the light beams incident upon the incident end 25a of the light guide 25 remain unchanged even when the wafer stage moves by disposing an aperture stop B in the position of the imaginary plane A. Based on those methods, it is possible to observe the mask marks and make the alignment by use of any one of the fiducial marks SM and SM'.

Figure 21:
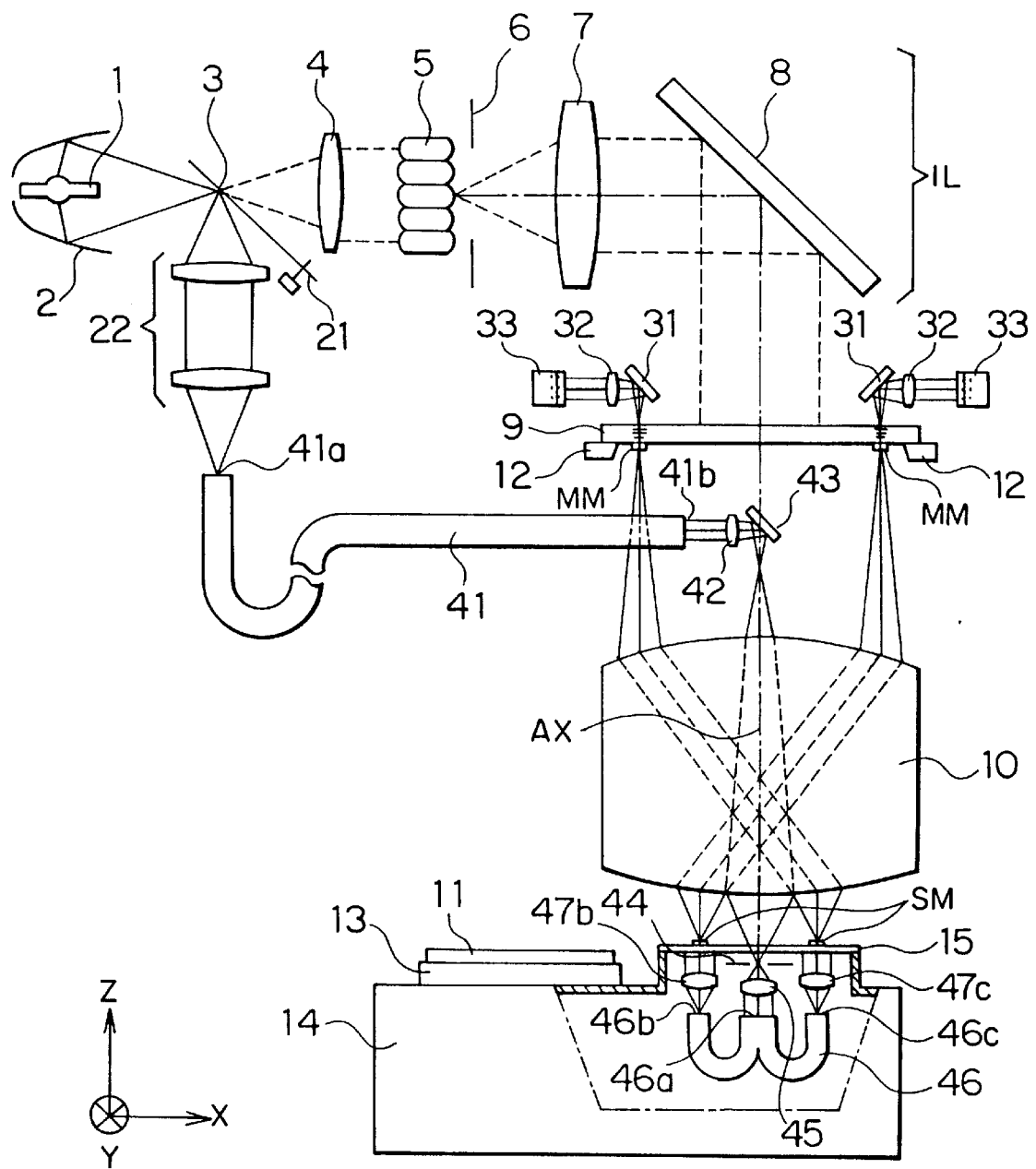
FIG. 21 is a schematically showing a construction of the projection exposure apparatus in the second embodiment of the present invention.
Figure 22:
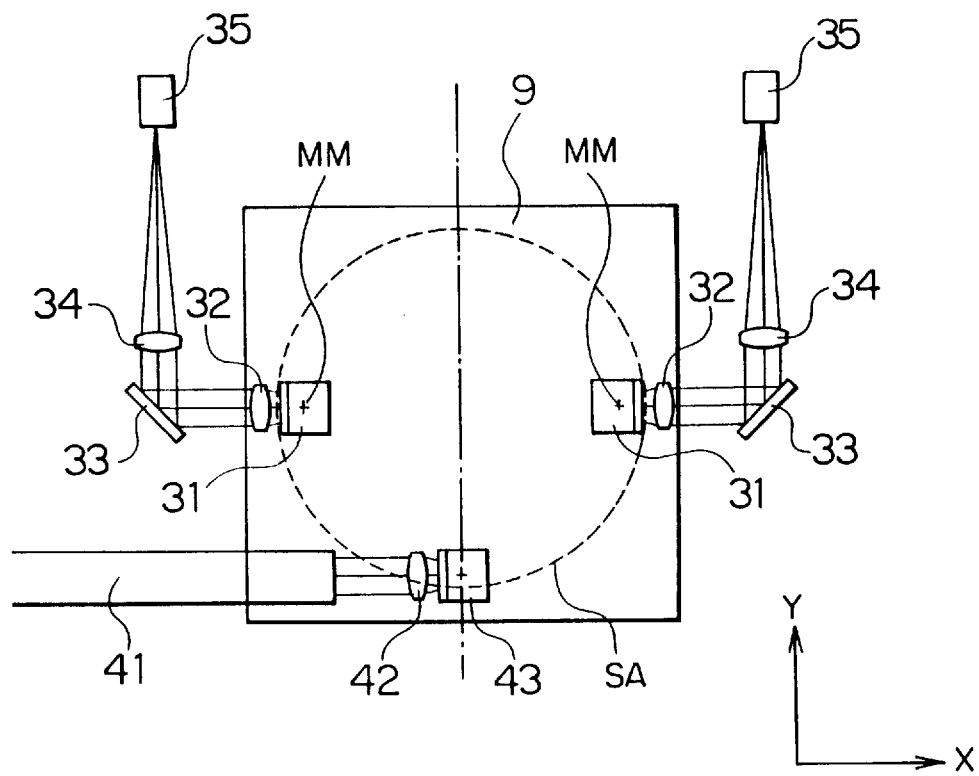
FIG. 22 is a top view showing a part of the detection optical system and a part of the light introducing portion in FIG. 21.
Figure 23A:
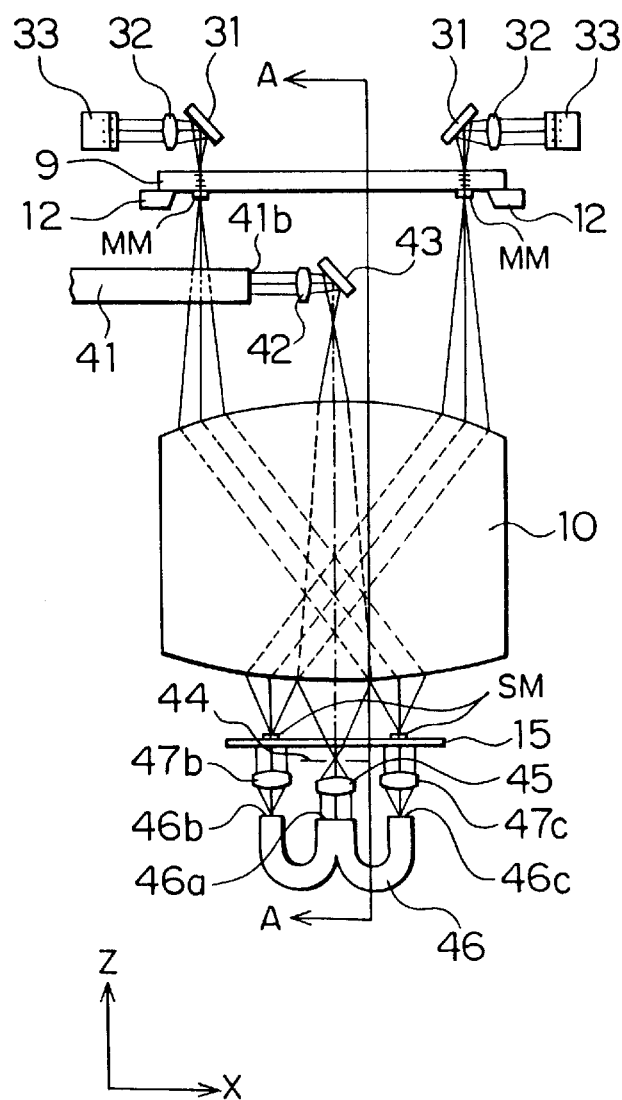
FIG. 23A is a side view of a light sending optical system in FIG. 21.
Figure 23B:
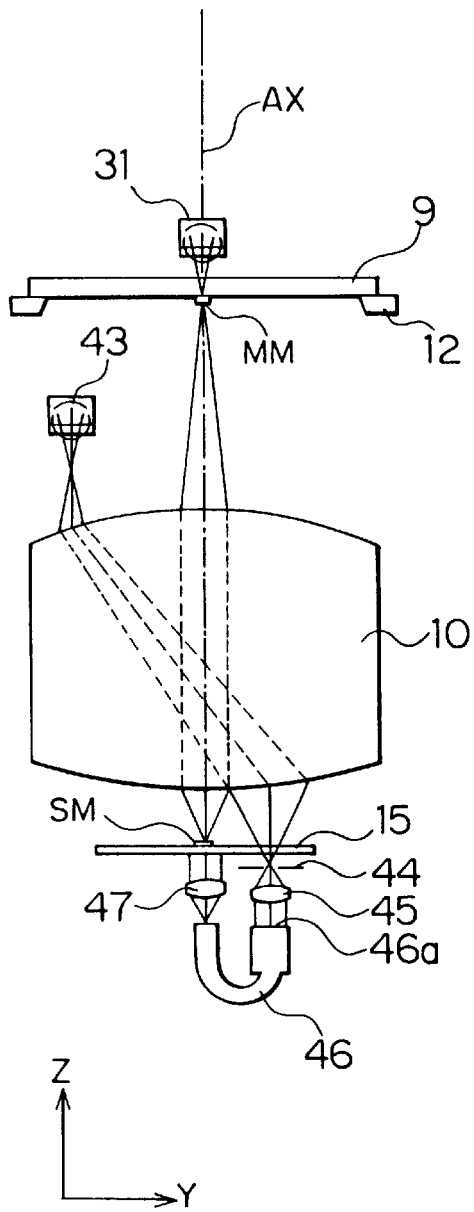
FIG. 23B is a sectional view taken along the line A—A in the side view of FIG. 23A.

FIG. 21 is a view schematically illustrating a construction of the projection exposure apparatus in accordance with a second embodiment of the present invention. Further, FIG. 22 is a top view showing the detection optical system and a part of the light introducing portion. Also, FIG. 23A is a side view of the light sending optical system in FIG. 21. FIG. 23B is a sectional view taken along the line A—A in the side view of FIG. 23A.

The second embodiment has a construction similar to the first embodiment. What is basically different in the second embodiment from the first embodiment is, however, such a point that the light beams from the light source are introduced into the wafer stage through the projection optical system. Incidentally, referring to FIG. 21, the components having the same functions as those of the components in the first embodiment are marked with the same reference numerals as those in FIG. 1. Hereinafter, the second embodiment will be discussed while putting an emphasis on the difference from the first embodiment.

In the second embodiment, the light beams guided by the alignment system with the operation of the shutter 21, are incident on an incident end 41a of a light guide 41 via the relay lens system 22. Thus, a light source image having a sufficient numerical aperture (NA) and diameter is formed at the incident end 41a of the light guide 41. The light beams falling upon the incident end 41a of the light guide 41 are guided to an emerging end 41b thereof. The light beams from the emerging end 41b of the light guide are incident on the projection optical system 10 via a lens 42 and a mirror 43. Thus, the alignment light beams via the projection optical system 10 fall on the stage substrate 15.

Figure 24:
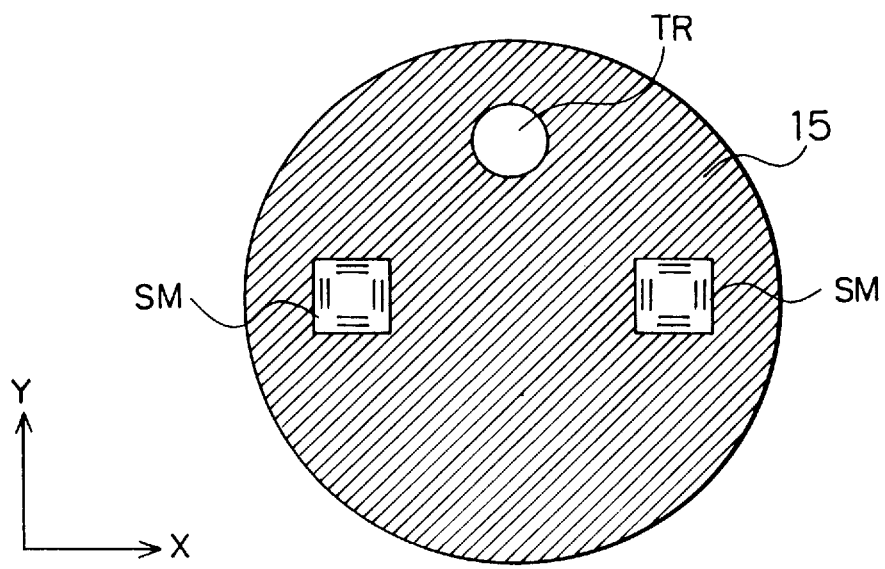
FIG. 24 is a view showing the fiducial mark SM formed on the upper surface of the stage substrate 15 in FIG. 21 and a light transmissive area TR.

As depicted in FIG. 24, in addition to the two fiducial marks SM, e.g., a circular light transmissive area TR is formed on the upper surface of the stage substrate 15. Accordingly, when the stage substrate 15 is located with respect to the optical axis AX of the projection optical system 10 on the occasion of the alignment, the alignment light beams via the projection optical system 10 pass through the light transmissive area TR of the stage substrate 15 and are guided into the wafer stage 14. Thus, the alignment illumination light beams introduced into the wafer stage 14 are incident upon an incident end 46*a* of a light guide 46 including one incident end and two emerging ends through an aperture stop 44 and a lens 45. Herein, the lens 42, the projection optical system 10, and the lens 45 constitute a relay optical system for providing a conjugate connection between the emerging end 41*b* of the light guide 41 and an incident end 46*a* of a light guide 46. Accordingly, the light source image, having the ample numerical aperture (NA) and diameter, is formed at the incident end 46*a* of the light guide 46. The light beams incident on the incident end 46*a* of the light guide 46 are guided to the emerging ends 46*b* and 46*c*.

The light beams from the emerging ends 46*b*, 46*c* of the light guide 46 form an illuminated field having a proper illumination numerical aperture (NA) through condenser lenses 47*b*, 47*c* respectively, and Köhler-illuminate the pair of fiducial marks SM formed on the stage substrate 15.

Thus, the light source 1, the elliptical mirror 2, the shutter 21, the relay lens system 22, the light guide 41, the lens 42, the mirror 43 and the projection optical system 10 are located outside of the wafer stage 14, and constitute a light introducing portion for introducing the alignment light beams into the wafer stage 14. Further, lens 45, the light guide 46 and the condenser lens 47 are fixedly provided within the wafer stage 14, and constitute a light irradiating portion for irradiating the fiducial marks SM with the alignment light beams introduced into the wafer stage 14.

Thus, the pair of fiducial marks SM are Köhler-transmission-illuminated with the light beams from beneath by the light sending optical system consisting of the light introducing portion and the light irradiating portion. The light beams penetrating the respective fiducial marks SM illuminate the corresponding mask marks MM formed on the undersurface of the mask 9. Thus, as in the first embodiment, the images of the corresponding fiducial marks SM are formed in superposition on the respective mask marks MM. Then, the first and second detection optical systems detect the positional deviation quantities of the mask marks MM from the fiducial marks SM.

In this way, in accordance with the second embodiment, the two fiducial marks SM are illuminated from beneath with the light beams, while the light transmissive area TR is illuminated from above with the light beams. Hence, it is of importance that the two fiducial marks SM are spaced far from the light transmissive area TR on the stage substrate 15. Then, in the second embodiment, as illustrated in FIGS. 22 and 23, the alignment light beams are rendered incident on the projection optical system 10 in a position spaced in a −Y-axis direction far from the optical axis AX. That is, as shown in FIG. 22, the mirror 43 of the light introducing portion is so located as to be eccentric in the −Y-axis direction with respect to a field area SA, for the projection optical system 10, on the mask 9. Accordingly, as illustrated in FIG. 24, a position of the light transmissive area TR is eccentric in a +Y-axis direction on the stage substrate 15, corresponding to an incident position of the alignment light beam upon the projection optical system 10. Incidentally, as a matter of course, it is required that the light introducing portion (41–43) be constructed so as not to intercept the alignment light beams, and the exposure light beams as well.

FIG. 25 is a view showing a positional relationship between the exposure light beam, the alignment light beam and the light introducing portion (41–43).

Figure 25A:
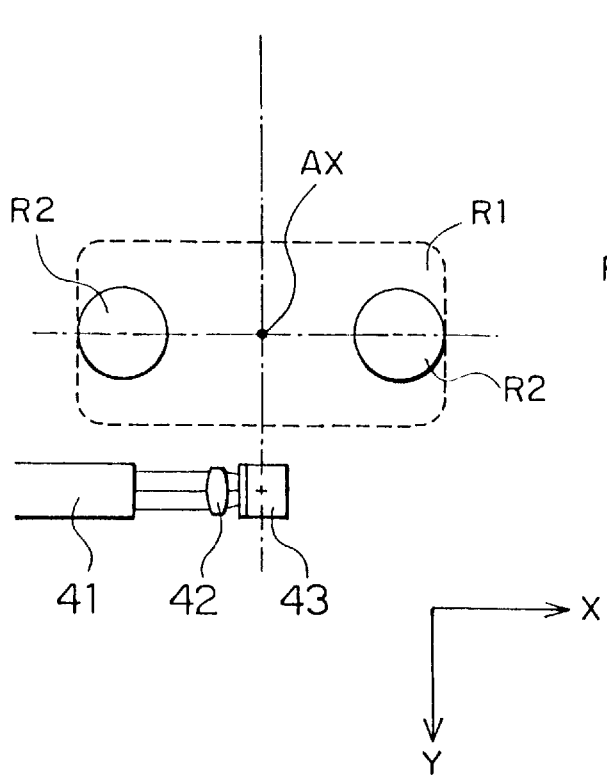
FIGS. 25A and 25B are views each showing a positional relationship between the exposure light beam, the alignment light beam and the light introducing portion (41–43) in the second embodiment.

As shown in FIG. 25A, an area R1 occupied by the light beams, the exposure light beams forming an actual field of the projection optical system 10 when effecting the projection-exposure, takes a narrow elongate rectangular shape extending in the X-axis direction, and areas R2 occupied by the alignment light beams are spaced in the X-axis direction. In this case, the light guide 41, the lens 42 and the mirror 43 that constitute the light introducing portion do not, even when fixed in the positions shown in FIG. 25A, intercept the exposure light beams.

Figure 25B:
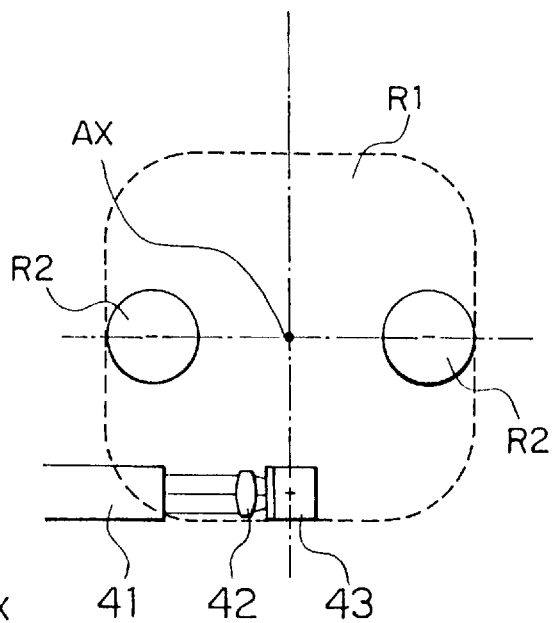

As illustrated in FIG. 25B, however, if the area R1 occupied by the exposure light beams assumes a square shape extending in the X- and Y-axis directions, it is impossible to fixedly provide the light introducing portion so as not to intercept the exposure light beams. Therefore, in this case, it is required that the light introducing portion be disposed in a predetermined position sufficiently apart from the areas R2 occupied by the alignment light beams, and be moved off the area R1 occupied by the exposure light beams.

As discussed above, in the second embodiment also, the light introducing portion for introducing the alignment light beams into the wafer stage 14, is mechanically separated from and unconnected to the light irradiating portion for irradiating the alignment light beams. Then, when the stage substrate 15 is located with respect to the projection optical system 10 on the occasion of alignment, there must be substantially the coincidence between the optical axis of the lens 42 of the light introducing portion, the center of the light transmissive area TR and the optical axis of the lens 45 of the light irradiating portion. Then, the pair of lenses 42, 45 and the projection optical system 10 constitute a relay lens system. That is, only when aligned, the light introducing portion is optically connected via the above-described relay lens system to the light irradiating portion. Accordingly, in accordance with the second embodiment, as in the first embodiment, it is feasible to actually provide the light sending optical system exhibiting an extremely high degree of freedom of the light sending without influencing the driving accuracy of the wafer stage. Further, in the second embodiment, the light beams are introduced into the wafer stage 14 through the stage substrate 15, and hence the wafer stage 14 can be constructed more compactly than in the first embodiment.

Note that the alignment light beams are introduced into the wafer stage 14 through the light transmissive area TR formed on the stage substrate 15 in the second embodiment, but it is not an indispensable condition in terms of the construction that the alignment light beams penetrate the stage substrate 15 and reach inside the wafer stage 14. hence, the alignment light beams can be also introduced into the wafer stage 14 via the adequate light transmissive area formed in a portion excluding the stage substrate 15.

Further, in the second embodiment, as in the first embodiment, there is employed the light guide composed of optical fibers in the light introducing portion and in the light irradiating portion. However, a light introducing optical system consisting of a combination of, e.g., the lens and the mirror is usable as a light guiding unit in place of the light guide composed of the optical fibers. Therefore, according to the present invention, the light guide unit has a broad concept embracing a general light introducing system for propagating the light beams. Note that the optical fibers bundled at random are desirable when using the optical fibers as the light guide unit.

Figure 26:
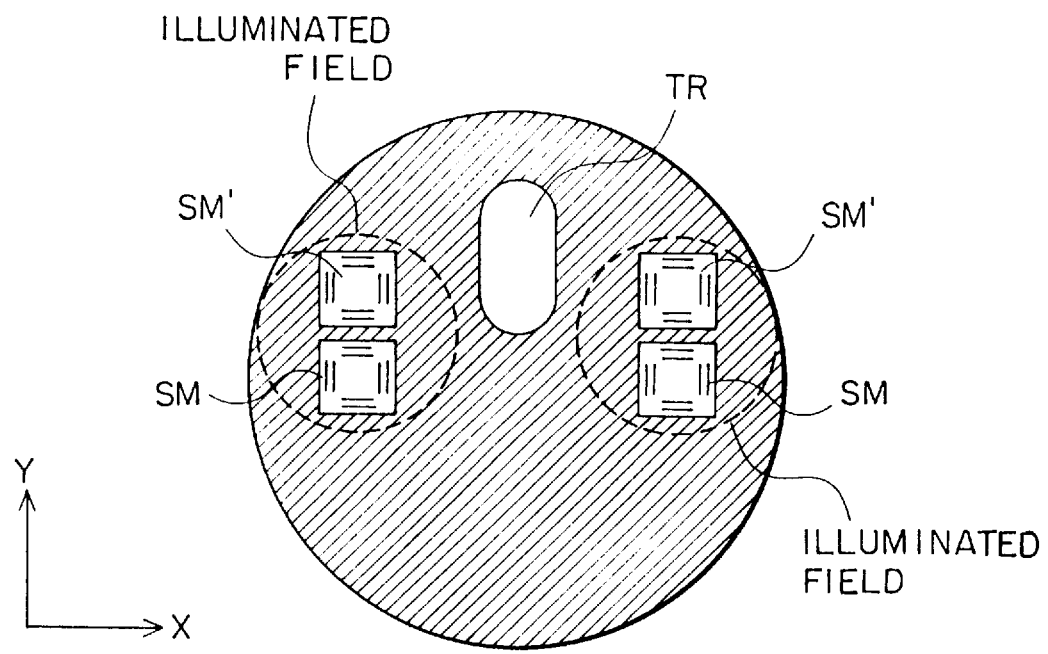
FIG. 26 is a view showing how the fiducial mark SM' is disposed in the position shifted in the Y-axis direction within the same field in the vicinity of the fiducial mark SM on the stage substrate 15 in the second embodiment.

Also, in accordance with the second embodiment, for simplifying the explanation, the light beams are sent only when the stage substrate 15 is located in a certain position (one point) with respect to the projection optical system 10. However, a fixed area is easily illuminated inside with the light beams without being limited particularly to one point. This is applied to, for example, such a case that, as illustrated in FIG. 26, a fiducial mark SM' is set in a position shifted in the Y-axis direction within the same field in the vicinity of the fiducial mark SM on the stage substrate 15, and the alignment mark of the mask is illuminated with the light beams by use of the fiducial mark SM' instead of the fiducial mark SM. In this case, as shown in FIG. 26, the light transmissive area TR takes an elliptical shape extending in the Y-axis direction.

Figure 27A:
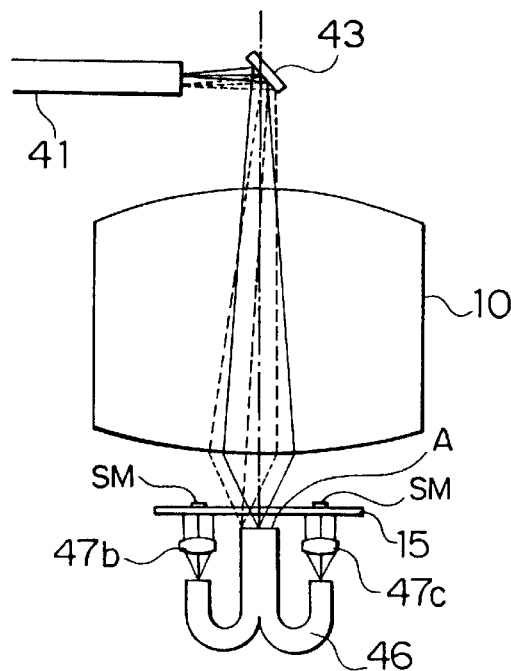
FIGS. 27A and 27B are partially enlarged views schematically illustrating constructions of the principal portions in modified embodiments of the light introducing portion and the light irradiating portion in the second embodiment.
Figure 27B:
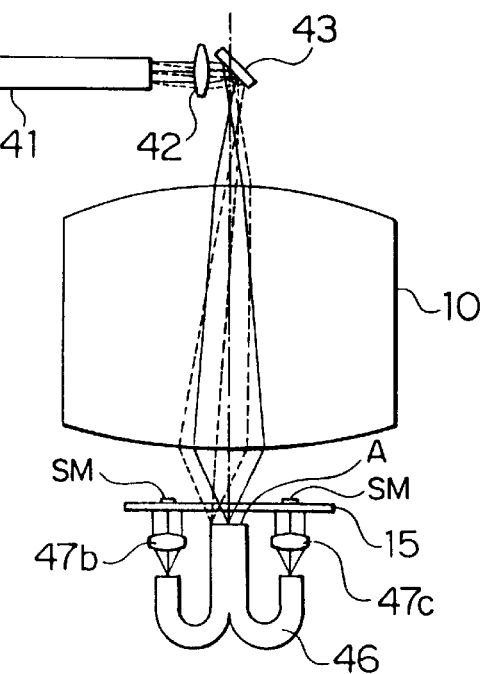

In such a case, if constructed so that the light beams incident upon the incident end 46a of the light guide 46 on the wafer stage do not change due to the movement of the wafer stage, the stable illumination can be always given. FIG. 27 shows a construction in a case wherein when the incident position of the light irradiating portion on the wafer stage is set as an imaginary plane A in the second embodiment in FIG. 21, the imaginary plane A and the incident end 46a of the light guide within the wafer stage are the same. Herein, a relationship between the emerging end 41b of the light guide 41 and the imaginary plane A is conjugate in (a), and becomes a relationship of Köhler illumination (the emerging end 41b is in the pupil position with respect to the imaginary plane A). In any case, the secondary light source is, it can be considered, formed on the imaginary plane A. If the diameter of this secondary light source is amply large for the movement of the wafer stage, and if the illumination NA within the area is uniform, the light beams falling on the incident end 46a of the light guide 46 remain unchanged even when the wafer stage moves.

Figure 28A:
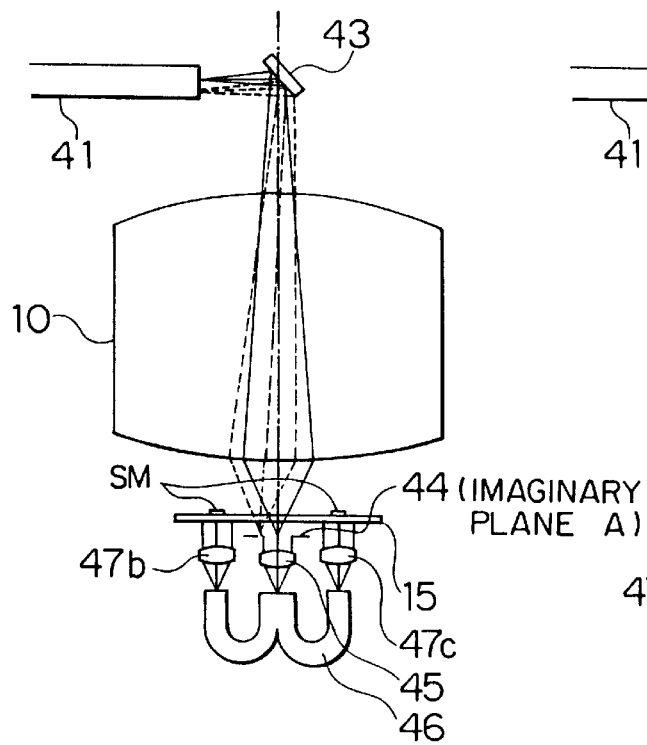
FIGS. 28A and 28B are partially enlarged views schematically showing constructions of the principal portions in modified embodiments of the light introducing portion and the light irradiating portion in the second embodiment.
Figure 28B:
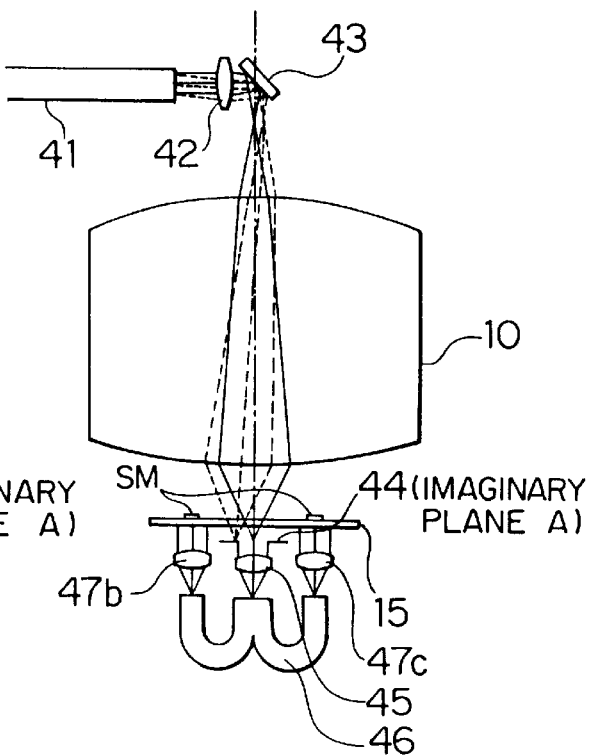

Further, FIG. 28 illustrates a construction in a case where the imaginary plane A and the incident end 46a of the light guide 46 are in the relationship of Köhler illumination (the imaginary plane A is in the pupil position with respect to the incident end 46a). Herein, the relationship between the imaginary plane A and the emerging end 41b of the light guide 41 is conjugate in (a), and is of the Köhler illumination (the emerging end 41b is in the pupil position with respect to the imaginary plane A) in (b). It can be conceived that the secondary light source is formed on the imaginary plane A. Note that the configuration shown in FIG. 28B is nothing but a part of the construction of the second embodiment in FIG. 21. If the diameter of this secondary light source is sufficiently large for the movement of the wafer stage, and if the illumination NA within the area is uniform, it is feasible to provide such a construction that the light beams incident upon the incident end 46a of the light guide 46 remain unchanged even when the wafer stage moves by disposing the aperture stop B in the position of the imaginary plane A. Based on those methods, it is possible to observe the mask marks and make the alignment by use of any one of the fiducial marks SM and SM'.

Figure 6:
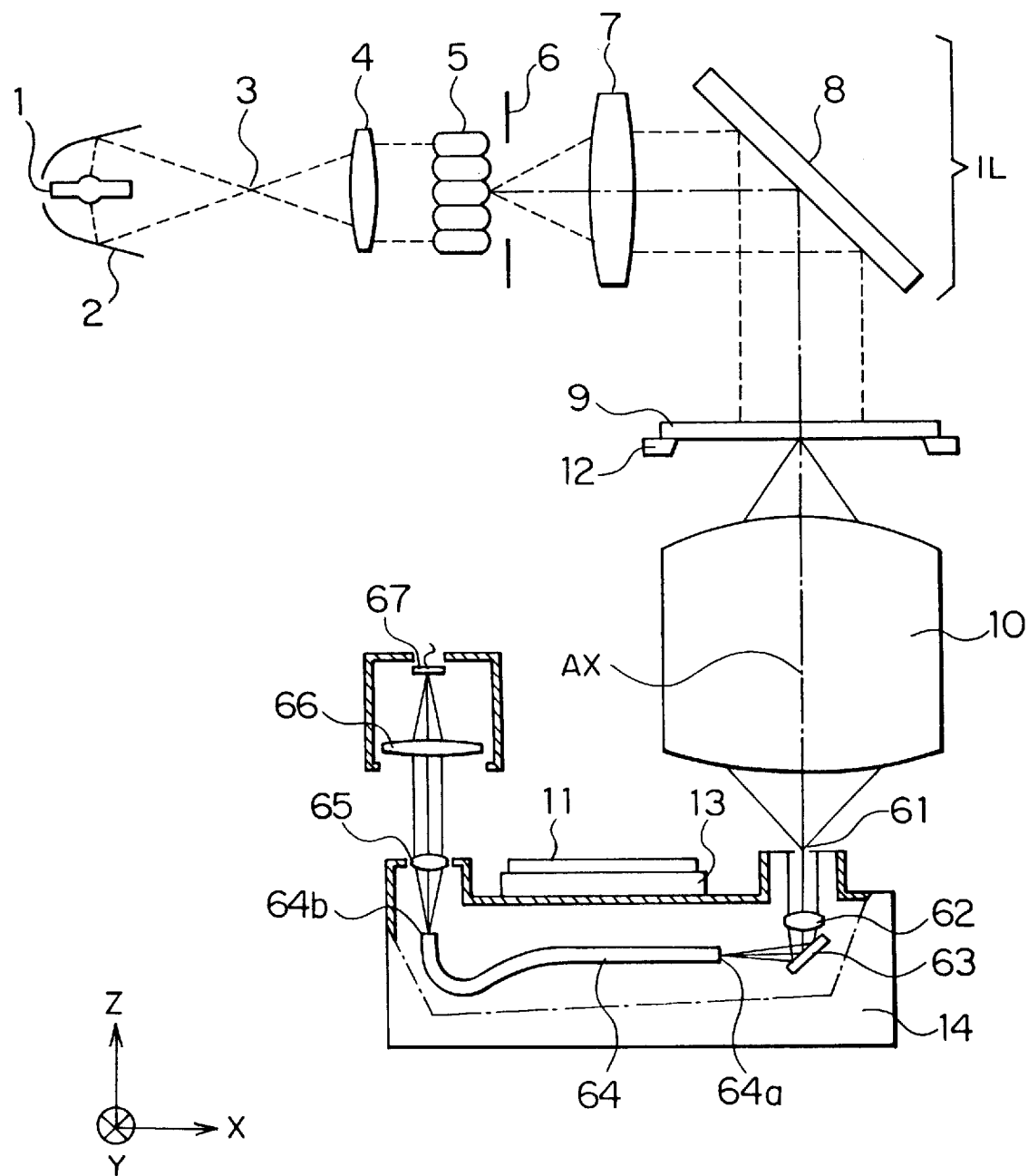
FIG. 6 is a view schematically illustrating a construction of the projection exposure apparatus in a third embodiment of the present invention.

FIG. 6 is a view schematically illustrating a construction of the projection exposure apparatus in accordance with a third embodiment of the present invention. In the third embodiment, the present invention is applied to the projection exposure apparatus including an illuminance scatter sensor system. Note that the illuminance scatter sensor system is a device for measuring an illuminance distribution of main illumination light beams (exposure light beams) within a wafer exposure area.

Incidentally, referring to FIG. 6, the basic construction of the projection exposure apparatus excluding the illumination scatter sensor system is the same as that in the first embodiment. Accordingly, in FIG. 6, the components having the same functions as those of the components in the first embodiment are marked with the like reference numerals as those in FIG. 1. Hereinafter, the third embodiment will be discussed while emphasizing the differences from the first embodiment.

Referring again to FIG. 6, a pin hole 61 is so formed as to be substantially flush with the exposure surface of the wafer 11. Then, when measuring an illumination scatter, the wafer stage 14 is driven so that the pin hole 61 is located within the exposure area of the projection optical system 10. Therefore, the main illumination light beams supplied from the main illumination optical system IL, after traveling through the mask 9 and the projection optical system 10, pass via the pin hole 61 and fall upon a light receiving lens 62. The light beams passing through the light receiving lens 62 are reflected by a mirror 63 and thereafter incident on an incident end 64a of the light guide 64. The light beams guided by the light guide 64 emerge from an emerging end 64b thereof and are thereafter led outside the wafer stage 14 through a light sending lens system 65.

The light beams led outside the wafer stage 14 are received by a light receiving sensor 67 through a light receiving lens system 66. An output of the light receiving sensor 67 is connected to an input of an unillustrated processing system. In the processing system, an illuminance can be obtained based on a quantity of the light beams reaching a light receiving surface of the light receiving sensor 67 via the pin hole 61 for, e.g., one second, and an area of the pin hole 61. Thus the illuminance distribution over the entire wafer exposure area can be measured based on the output of the light receiving sensor 67 that is obtained by relatively moving the wafer stage 14 and more particularly the pin hole 61.

Thus, a light receiving optical system of the illuminance scatter sensor system is constructed of the light receiving lens 62, the mirror 63, the light guide 64, the light sending lens system 65, the light receiving lens system 66 and the light receiving sensor 67. Then, the light receiving lens 62, the mirror 63, the light guide 64 and the light sending lens system 65 are fixedly provided inwardly of the wafer stage 14, and constitute the light lead-out portion for leading, outside the wafer stage 14, the light beams traveling via the pin hole 61. Further, the light receiving lens system 66 and the light receiving sensor 67 are located outside the wafer stage 14, and constitute a light receiving portion for receiving the light beams led outside the wafer stage 14.

Note that it is preferably required to stepping drive the wafer stage 14 within a predetermined range in order to measure the illuminance over the entire wafer exposure area. As a result, with the stepping drive of the wafer stage 14, it follows that the light lead-out portion of the light receiving optical system moves with respect to the light receiving portion. Then, in accordance with the third embodiment, sizes of the respective lenses are specified so that all the light beams passing through the light sending lens system 65 of the light lead-out portion, which move within the predetermined range, are incident upon the light receiving lens system 66 of the light receiving portion.

In the third embodiment, the light beams passing through the pin hole 61 are led outside the wafer stage 14 through the light lead-out portion fixedly provided inwardly of the wafer stage 14. The light beams led outside the wafer stage 14 are received by the light receiving portion including the light receiving sensor provided outside the wafer stage 14. That is, the light lead-out portion and the light receiving portion are mechanically separated and unconnected to each other. Then, only when measuring the illuminance scatter, the light lead-out portion and the light receiving portion are optically connected through the light sending lens system 65 and the light receiving lens system 66.

Thus, in accordance with the third embodiment, the light receiving sensor 67 is disposed in a desired position outside of the wafer stage 14, and therefore an emission of heat of the light receiving sensor 67 exerts no damaging influence upon the precision of the wafer stage laser interferometer and of other alignment systems. Further, the exterior and the interior of the wafer stage 14 are not connected via the light guide, and hence it is possible to actually provide the light receiving optical system with an extremely high degree of freedom of light receiving so that the light guide exerts no damaging influence on the driving accuracy of the wafer stage, unlike the prior art.

FIGS. 7 to 10 are partially enlarged views each schematically showing a construction of the principal portion in a modified embodiment of the light lead-out portion and the light receiving portion in the third embodiment.

Referring to FIG. 7A, the construction is that an emerging end surface 64b of the light guide 64 is conjugate to the imaginary plane A existing in a space between the light sending lens system 65 and the light receiving lens system 66. Further, the imaginary plane A is conjugate to the light receiving surface of the light receiving sensor 67 through the light receiving lens system 66.

In this case, as illustrated in FIG. 7B, the light receiving lens system 66 may be omitted, and the imaginary plane A and the light receiving surface of the light receiving sensor 67 may be coincident with each other. Also, as shown in FIG. 7C, with an omission of the light sending lens system 65, an emerging end surface 64b of the light guide 64 may be coincident with the imaginary plane A. Moreover, as depicted in FIG. 7D, with omissions of the light sending lens system 65 and of the light receiving lens system 66, the emerging end surface 64b of the light guide 64 may be made sufficiently proximal to the light receiving surface of the light receiving sensor 67.

Referring to FIG. 8A, an imaginary plane B is disposed in a pupil position of the emerging end surface 64b of the light guide 64 through the light sending lens system 65. Then, the imaginary plane B and the light receiving surface of the light receiving sensor 67 are so disposed as to be conjugate to each other.

In this case, as shown in FIG. 8B, the light receiving lens system 66 is omitted, and the imaginary plane B may be coincident with the light receiving surface of the light receiving sensor 67.

In the modified embodiments shown in FIGS. 7 and 8, as indicated by broken lines in the Figures, the received light beams move on the light receiving surface with the movement of the wafer stage, however, an angle of incidence of the received light beams with respect to the light receiving surface, does not change. Hence, in the case of having such a characteristic that a sensitivity of the light receiving surface of the light receiving sensor depends on the angle of incidence, it is preferable to adopt the constructions in the modified embodiments illustrated in FIGS. 7 and 8 so that the angle of incidence upon the light receiving surface does not change even when the wafer stage moves.

Referring to FIG. 9A, an imaginary plane C, existing in a space between the light sending lens system 65 and the light receiving lens system 66, is conjugate to the emerging end surface 64b of the light guide 64 through the light sending lens system 65. Further, the light receiving surface of the light receiving sensor 67 is disposed in the pupil position of the imaginary plane C through the light receiving lens system 66.

In this case, as illustrated in FIG. 9B, with an omission of the light sending lens system 65, the emerging end surface 64b of the light guide 64 may be located in the position of the imaginary plane C.

Referring to FIG. 10, an imaginary plane D is disposed in the pupil position of the emerging end surface 64b of the light guide 64 through the light sending lens system 65. Then, the light receiving surface of the light receiving sensor 67 is disposed in the pupil position of the imaginary plane D through the light receiving lens system 66.

In the modified embodiments illustrated in FIGS. 9 and 10, as indicated by broken lines in the Figures, although the angle of incidence of the received light beams upon the light receiving surface changes with the movement of the wafer stage, an incident position upon the light receiving surface of the received light beams does not shift. Accordingly, in the case of such a characteristic that the sensitivity of the light receiving surface of the light receiving sensor depends on the incident position, it is preferable to adopt the constructions in the modified embodiments shown in FIGS. 9 and 10 so that the incident position upon the light receiving surface does not change even when the wafer stage moves.

Figure 11:
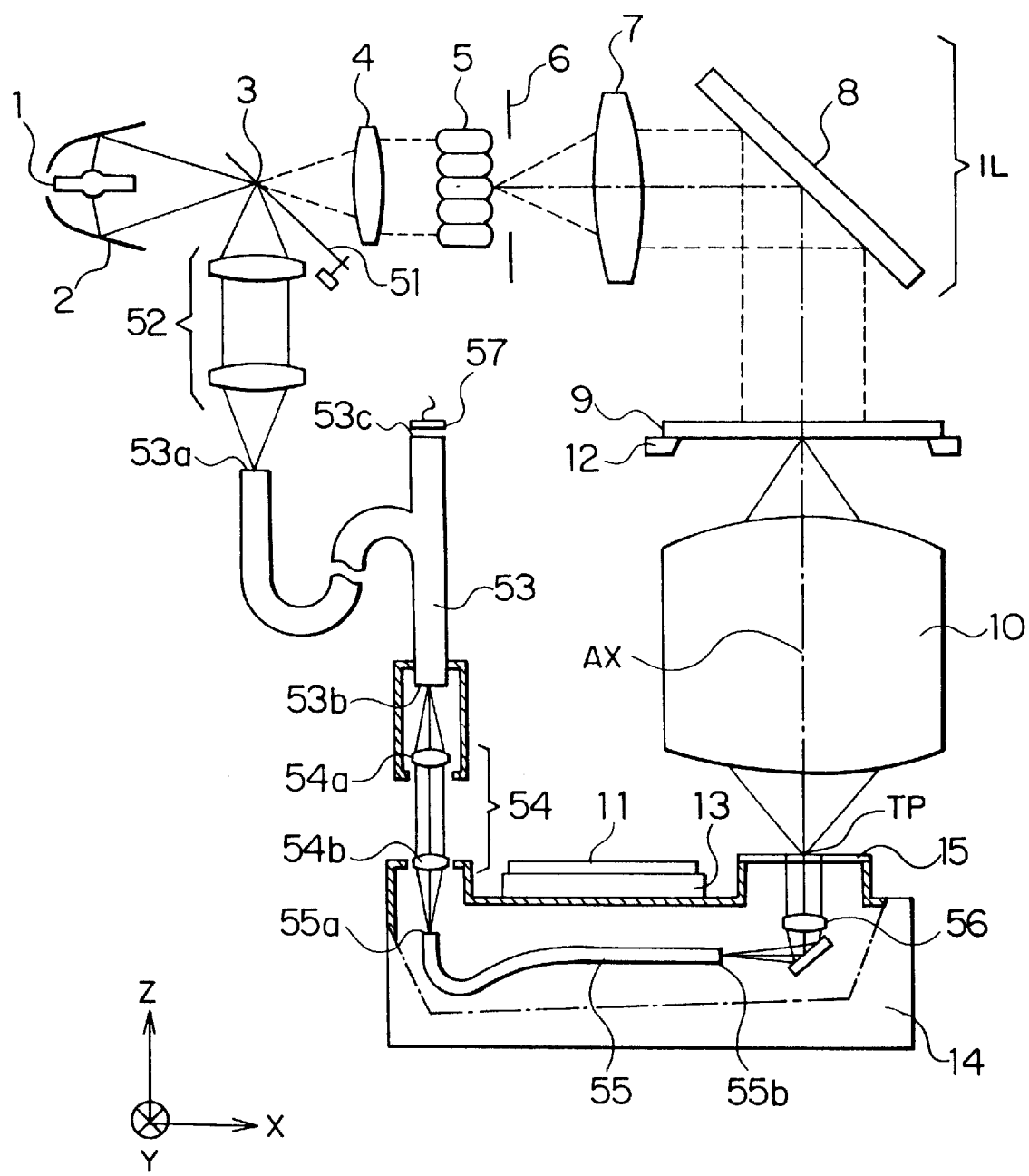
FIG. 11 is a view schematically illustrating a construction of the projection exposure apparatus in a fourth embodiment of the present invention.

FIG. 11 is a view schematically illustrating a construction of the projection exposure apparatus in accordance with a fourth embodiment of the present invention. In the fourth embodiment, the present invention is applied to the projection exposure apparatus incorporating a focus calibration mechanism based on a contrast detection method.

Incidentally, referring to FIG. 11, the basic construction of the projection exposure apparatus excluding the focus calibration mechanism is the same as that in the first embodiment. Therefore, in FIG. 11, the components having the same functions as those of the components in the first embodiment are marked with the like reference numerals as those in FIG. 1. Hereinafter, the fourth embodiment will be discussed while emphasizing the differences from the first embodiment.

In the projection exposure apparatus, when actuating the apparatus, the wafer is preferably required to be located in a best focus position so that the undersurface (a pattern surface) of the mask is conjugate to the upper surface (an exposure surface) of the wafer through the projection optical system. In this case, the following operation may be executed. A test mark formed on the mask is printed on the wafer through the projection optical system while shifting the wafer position along the optical-axis direction of the projection optical system, and a developing process is carried out. Then, the best focus position of the wafer is detected by observing a resist image with an optical microscope.

For detecting the best focus position without actually performing the projection exposure, however, it is convenient to employ, e.g., the focus calibration mechanism based on the contrast detection method. According to the focus calibration mechanism by the contrast detection method, the stage substrate set substantially flush with the wafer surface on the wafer stage, is illuminated with the light beams having the same wavelength as that of the exposure light beams. The light beams penetrating the light transmissive pattern formed on the stage substrate are reflected by the undersurface of the mask through the projection optical system, and thereafter form a pattern image in superposition on the pattern of the stage substrate again through the projection optical system. Detected then is an intensity of the light beams from the pattern images that penetrate the patterns. Thus, the focus calibration mechanism based on the contrast detection method is capable of detecting such a wafer position, i.e., the best focus position, as to reach the maximum light intensity detected.

The focus calibration mechanism shown in FIG. 11 includes a shutter 51 for selectively leading the light beams from the light source 1 for the exposure, out of an optical path of a main illumination optical system IL. Focus detection light beams from the exposure light source 1, which have been led through the shutter 51, fall upon a first bifurcating end 53a of a two-way bifurcation light guide 53 through the relay lens system 52. A light source image having a sufficient numerical aperture (NA) and diameter is formed at the first bifurcating end 53a of the light guide 53. The light beams incident on the first bifurcating end 53a of the light guide 53 are led to an emerging end 53b thereof. The light beams emerging from the emerging end 53b of the light guide 53 are incident on an incident end 55a of a light guide 55 via a relay lens system 54 consisting of a pair of lenses 54a, 54b.

Figure 12:
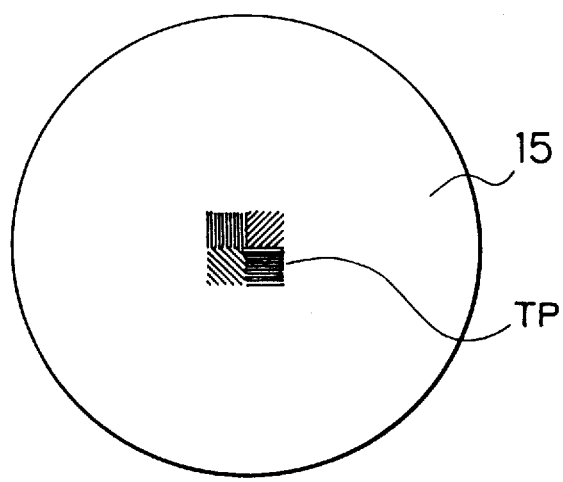
FIG. 12 is a view showing a transmissive pattern TP formed on the upper surface of the stage substrate 15 shown in FIG. 11.

The light source image having the sufficient numerical aperture (NA) and diameter is again formed at the incident end 55a of the light guide 55. The light beams incident on the incident end 55a of the light guide 55 are led to an emerging end 55b thereof. The light beams from the emerging end 55b of the light guide 55 form an illuminated field having a proper illumination numerical aperture (NA) through a condenser lens 56, and Köhler-illuminate the stage substrate 15. Note that a transmissive pattern TP such as, e.g., a line-and-space pattern is, as illustrated in FIG. 12, formed on the upper surface of the stage substrate 15.

Thus, a light sending optical system for illuminating the transmissive pattern TP formed in the stage substrate 15 with the detection light beams, is constructed of the light source 1, the elliptical mirror 2, the shutter 51, the relay lens system 52, the light guide 53, the relay lens system 54, the light guide 55 and the condenser lens 56. Then, the light source 1, the elliptical mirror 2, the shutter 51, the relay lens system 52, the light guide 53 and the lens 54a are located outside of the wafer stage 14, and constitute a light introducing portion for introducing the detection light beams into the wafer stage 14. Further, the lens 54b, the light guide 55 and the condenser lens 56 are fixedly provided inside the wafer stage 14, and constitute a light irradiating portion for irradiating the transmissive pattern TP with the detection light beams introduced into the wafer stage 14.

Thus, the pattern TP is Köhler-transmission-illuminated with the light beams from beneath by the light sending optical system of the focus calibration mechanism. The light beams penetrating the pattern TP, after being reflected by the undersurface of the mask 9 through the projection optical system 10, are incident upon the stage substrate 15 again through the projection optical system 10.

Note that the detection light beam has the same wavelength as the exposure light beam, and the center of the pattern TP is located with respect to the optical axis AX of the projection optical system 10 when detecting the best focus position. Accordingly, a pattern image is formed in superposition on the pattern TP. That is, the transmissive pattern TP is illuminated with the light beams owing to the image of the pattern TP.

The light beams from the pattern image through the transmissive pattern TP are incident on the end 53b of the 2-way bifurcation light guide 53 through the condenser lens 56, the light guide 55 and the relay lens system 54. The light beams incident on the end 53b of the light guide 53 are diverged into two fluxes of light beams and led to the first diverged end 53a and the second diverged end 53c. The light beams led to the second diverged end 53c emerge from the second diverged end 53c and fall upon the light receiving sensor 57.

Thus, the condenser lens 56, the light guide 55, the relay lens system 54, the two-way bifurcation light guide 53 and the light receiving sensor 57, constitute a light receiving optical system for receiving the light beams from the pattern image via the transmissive pattern TP. Then, the condenser lens 56, the light guide 55, and the lens 54a are fixedly provided inwardly of the wafer stage 14, and constitute a light lead-out portion for leading, outside the wafer stage 14, the detection light beams from the pattern image through the transmissive pattern TP. Further, the lens 54b, the two-way bifurcation light guide 53 and the light receiving sensor 57 are located outside of the wafer stage 14, and constitute a light receiving portion for receiving the detection light beams led outside the wafer stage 14.

Figure 13:
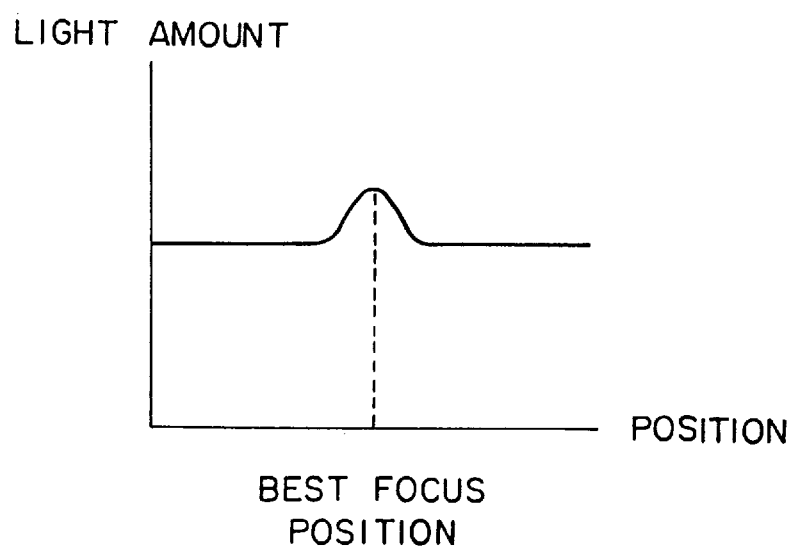
FIG. 13 is a graph showing how a quantity of light beams received by a light receiving sensor changes when the wafer stage is moved in an optical-axis direction of the projection optical system in FIG. 11.
Figure 14:
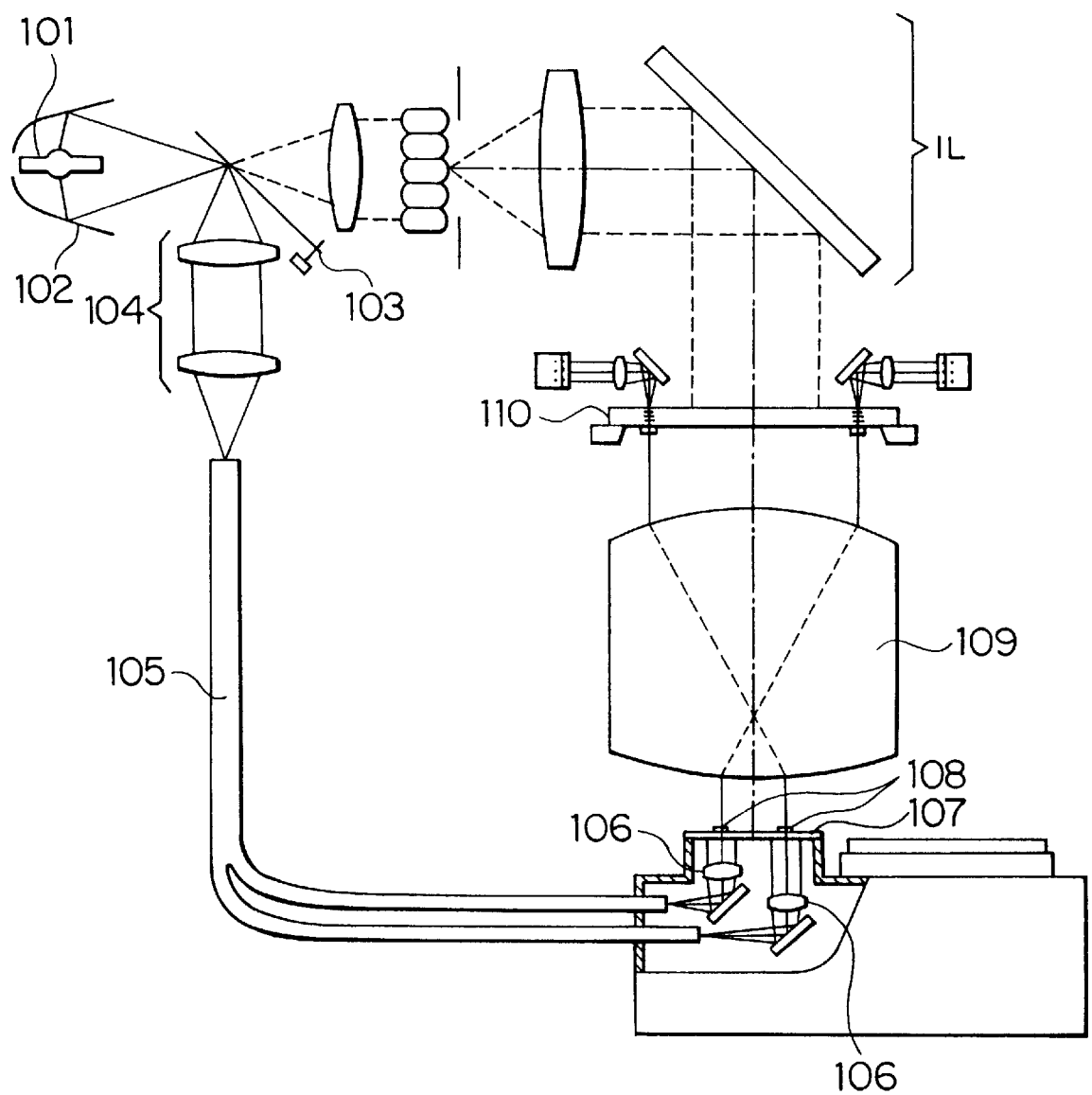
FIG. 14 is a view schematically showing a construction of a prior art projection exposure apparatus including a movable light sending optical system using a flexible light guide.
Figure 15:
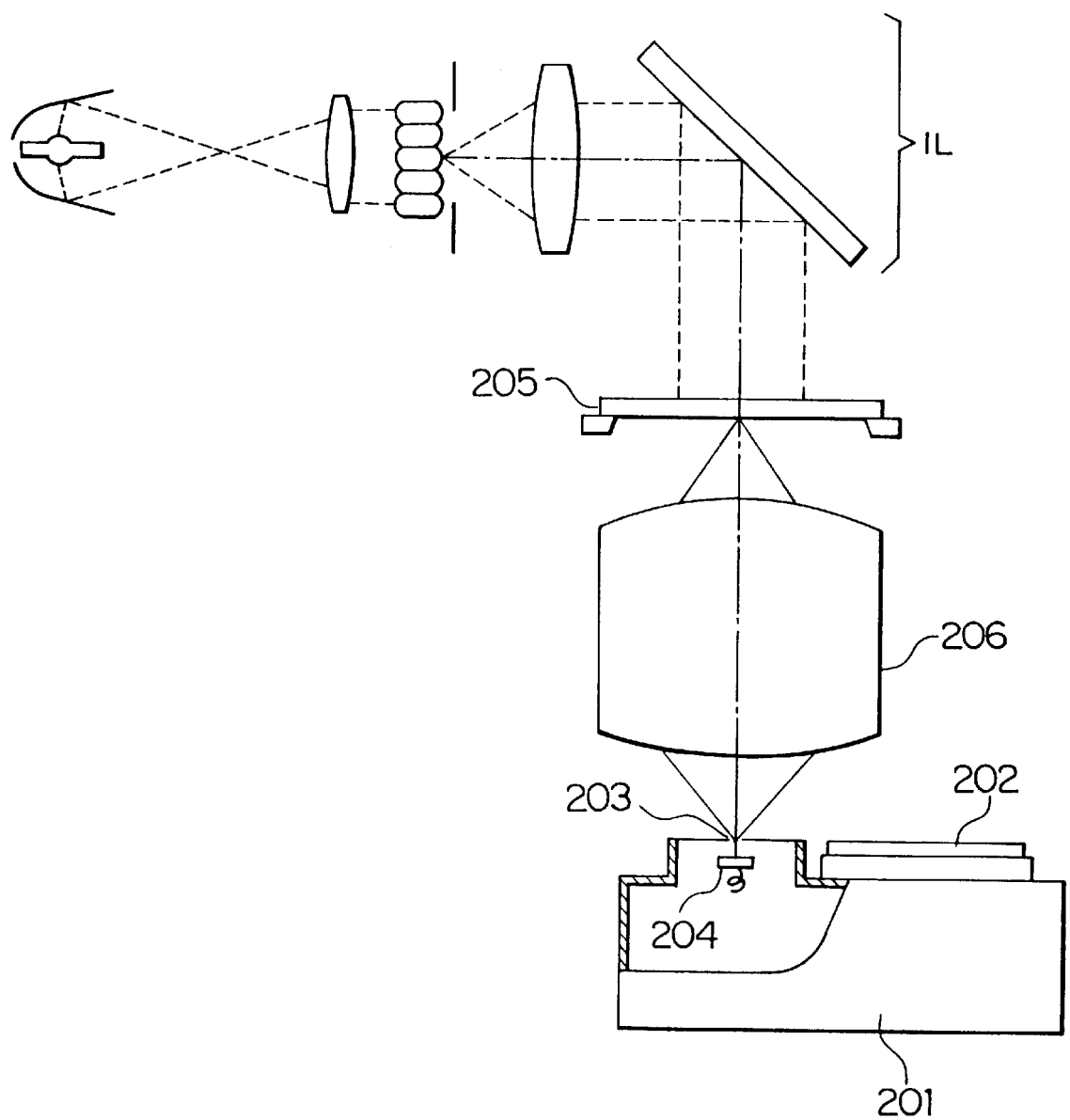
FIG. 15 is a view schematically showing a construction of the prior art projection exposure apparatus including an illuminance scatter sensor system.
Figure 16:
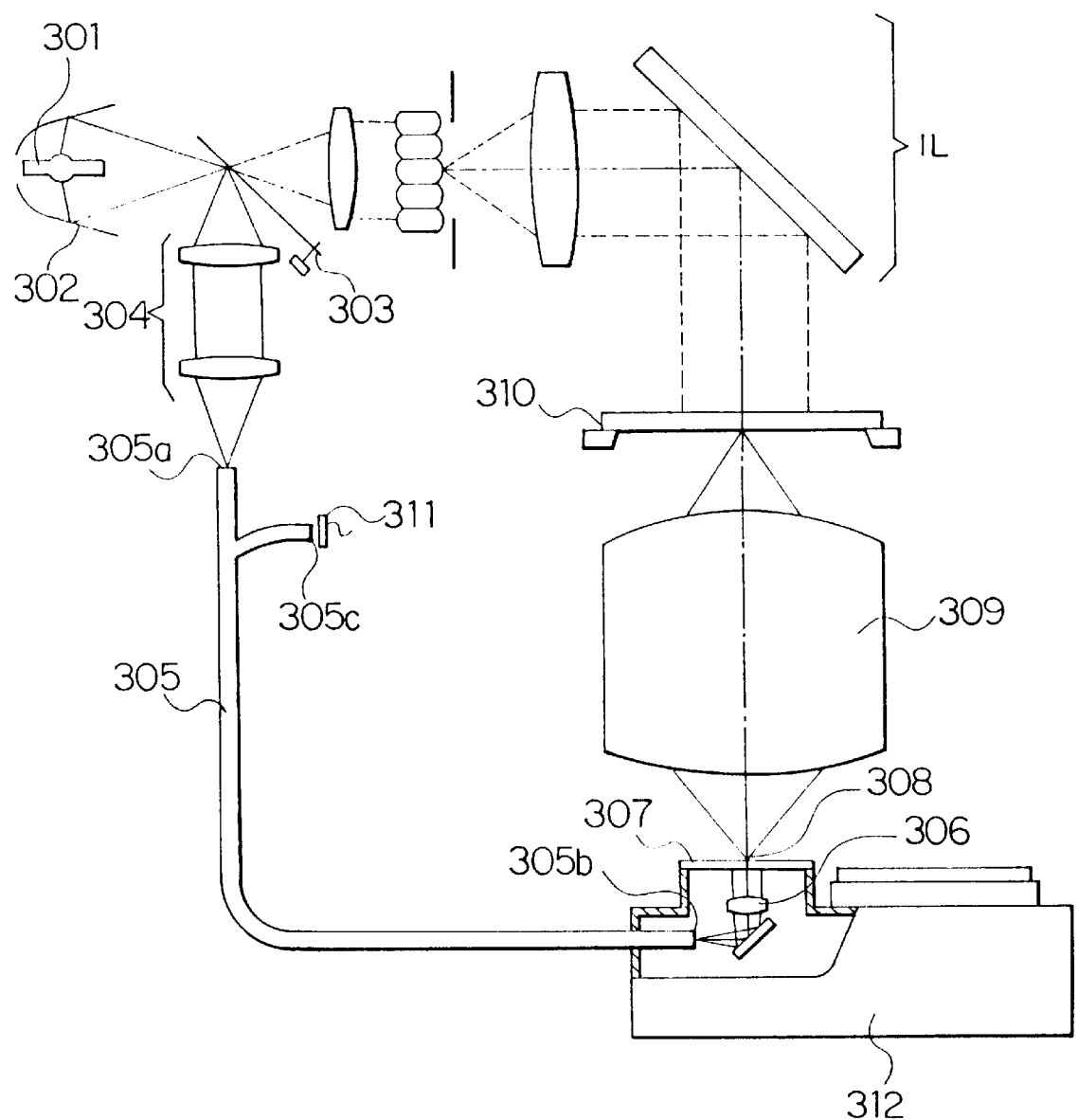
FIG. 16 is a view schematically illustrating a construction of the prior art projection exposure apparatus incorporating a focus calibration mechanism based on a contrast detection method.

FIG. 13 shows how a quantity of light beams received by the light receiving sensor varies when the wafer stage is moved in the optical-axis direction of the projection optical system in FIG. 11.

As shown in FIG. 13, when the wafer stage 14 is moved along the optical axis AX of the projection optical system 10, the quantity of the light beams received by the light receiving sensor 57 changes. Then, a light quantity maximum position is the best contrast state of the pattern image formed in the stage substrate 15, i.e., the best focus position in which the pattern surface of the mask 9 becomes conjugate to the upper surface of the substrate stage 15 through the projection optical system 10. Thus, the best focus position for the projection optical system 10 can be detected without performing the actual exposure. Note that the projection exposure apparatus incorporates an autofocus mechanism (with an omission of detailed description) separately from the focus calibration mechanism. Accordingly, this autofocus mechanism is capable of locating the wafer exposure surface in the best focus position at all times.

Note that there has been explained so far the case of executing the focus calibration about only the optical axis AX of the projection optical system 10 for explanatory simplicity, however, the best focus position is required to be detected while two-dimensionally moving the wafer stage 14 within the plane perpendicular to the optical axis AX of the projection optical system 10 when detecting the best focus position at a plurality of points within the exposure area of the projection optical system. In this case, with the two-dimensional movement of the wafer stage 14, it follows that the lens 54b moves with respect to the lens 54a.

Then, in accordance with the fourth embodiment, as in the modified embodiment of the first embodiment, sizes of the respective lenses are specified so that the light beams incident on the incident end 55a of the light guide 55 do not vary due to the movement of the wafer stage, and that all the light beams passing through the lens 54b are incident on the lens 54a. Alternatively, a plurality of lenses 54b and a multi-bifurcation light guide 55 having a plurality of incident ends 55a may be provided corresponding to a plurality of measuring point positions within the exposure area of the projection optical system 10 to be capable of mechanically following up the two-dimensional movements of the wafer stage 14.

As discussed above, as in the first embodiment, the components outside the wafer stage 14 are mechanically separated from and unconnected to the components inside the wafer stage 14 in the light sending optical system and the light receiving optical system in the fourth embodiment also. Then, only when detecting the best focus position, the components provided outside of the wafer stage 14 are optically connected to the components provided inwardly of the wafer stage 14 through the relay lens system 54. Accordingly, unlike the prior art in which the exterior and interior of the wafer stage 14 are connected through the light guide, it is feasible to actually provide the light sending optical system having an extremely high degree of freedom of the light sending and the light receiving optical system exhibiting an extremely high degree of freedom of the light receiving without influencing the driving accuracy of the wafer stage. Further, the light receiving sensor 57 is provided in the desired position outside the wafer stage 14, and hence there is no possibility to exert any damaging influence by the emission of heat of the light receiving sensor 57 upon the accuracies of other alignment systems as well as upon the accuracy of the wafer stage laser interferometer.

Incidentally, in the fourth embodiment, the two light guides 53, 55 are optically connected through the relay lens system 54. If there is no particular spatial constraint, however, the optical connection may be attained by making the end 53b of the two-way bifurcation light guide 53 sufficiently proximal to the incident end 55a of the light guide 55 through no intermediary of the relay lens system 54.

Figure 20A:
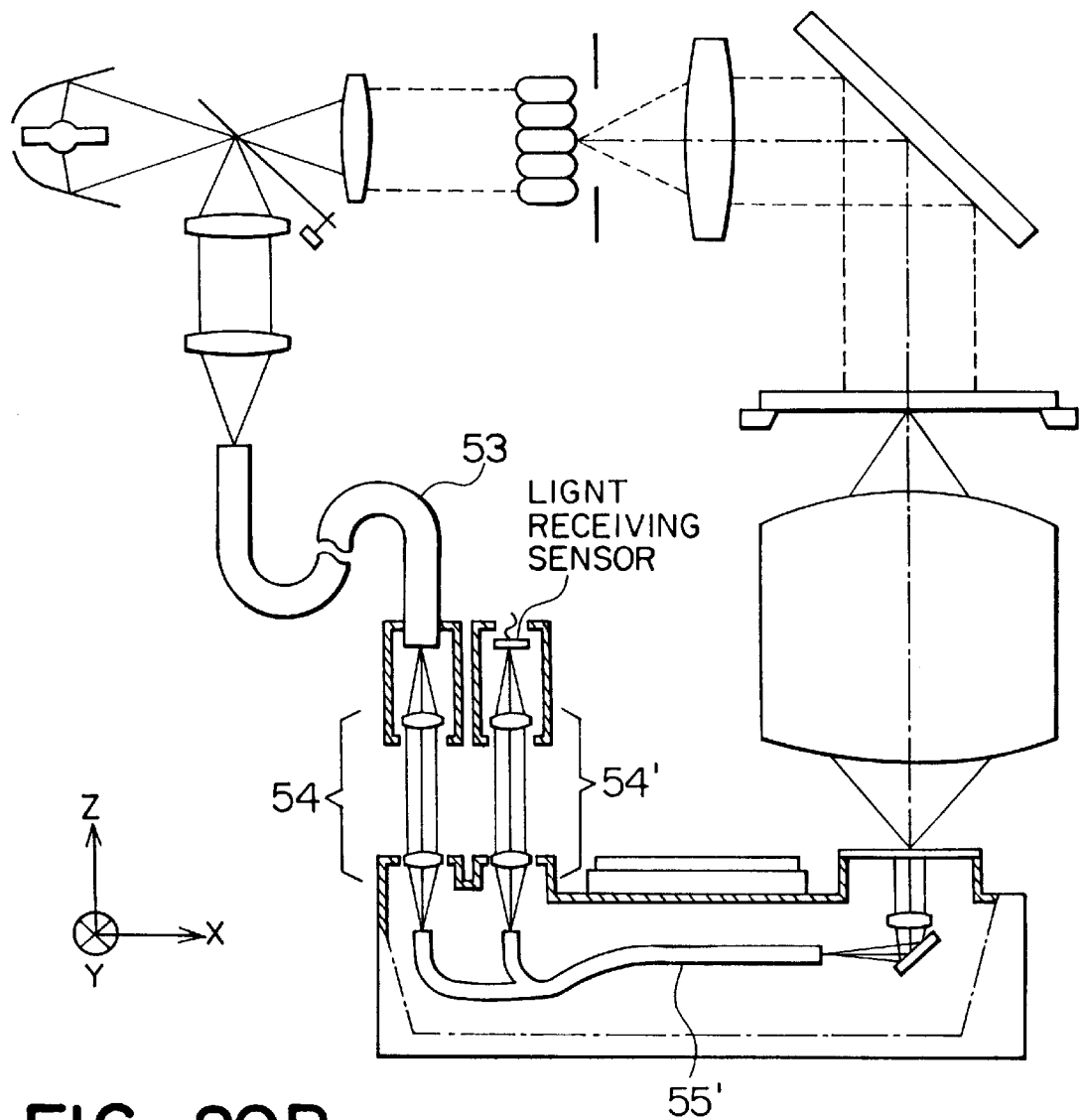
FIGS. 20A and 20B are views illustrating modified embodiments of a fourth embodiment shown in FIG. 11.
Figure 20B:
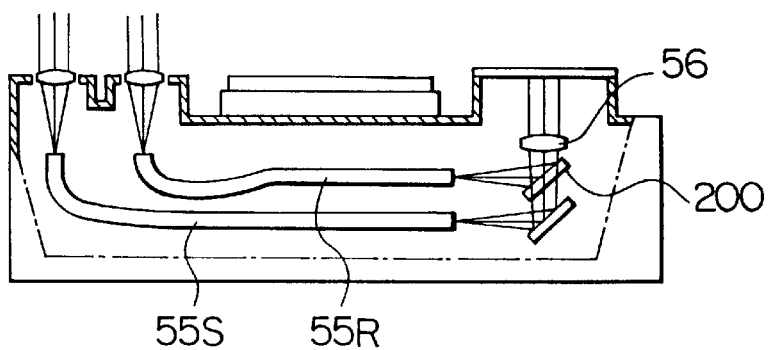

Further, in accordance with the fourth embodiment, the light guide 53 is diverged into two ways, and the relay lens system 54 is used in common by the light sending optical system and the light receiving optical system. As illustrated in FIG. 20A, however, the light guide 55 is constructed as a two-way bifurcation light guide 55', and the light introducing portion and the light lead-out portion may be separately disposed. This arrangement corresponds to an embodiment into which the first and third embodiments are combined. Further, as depicted in FIG. 20B, an additional light guide is disposed within the wafer stage; i.e., two lengths of light guides 55, 55R are provided; and a half-mirror 200 is disposed in the vicinity of a condenser lens 56, whereby the same system as that shown in FIG. 20A can be also actually provided. How the relay lens system is constructed and whether or not the same system is provided are pursuant to the first and third embodiments in the above-described cases.

FIG. 29 illustrates how an optimal flux of light is supplied to the optical system inside the wafer stage by switching over a magnification of the lens of the light introducing portion.

According to the present invention, there might be carried out a variety of modified embodiments into which the embodiments discussed above are properly combined. Hence, in accordance with, e.g., the first and fourth embodiments, there might be conceived a modified embodiment wherein two light irradiating portions disposed inside the wafer stage are employed for one light introducing portion disposed outside the wafer stage. Further, there might be considered a modified embodiment as a combination of the first and fourth embodiments, in which the light irradiating portion in the first embodiment and the light irradiating portion in the fourth embodiment that are disposed inwardly of the wafer stage, are employed for one light introducing portion disposed outside of the wafer stage.

Figure 29A:
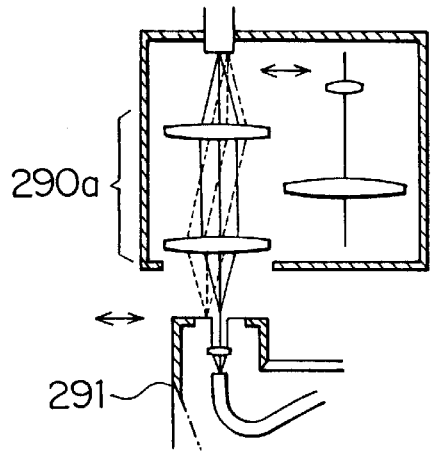
FIGS. 29A and 29B are views illustrating how an optical system within the wafer stage is supplied with optimum light beams by switching over a magnification of the lens of the light introducing portion.
Figure 29B:
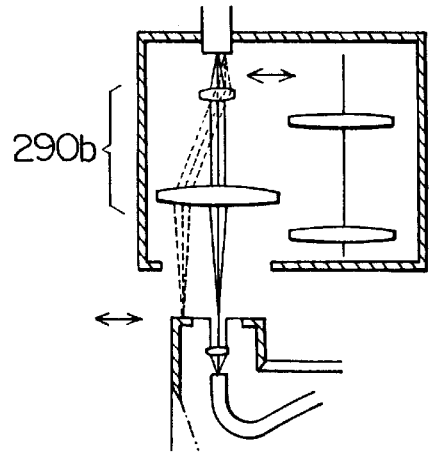

In this case, as illustrated in FIG. 29, with a switchover of a magnification of a lens 290 (the switchover from a lens 290a to a lens 290b) of the light introducing portion, the light beams having a large illuminance (a large illumination numerical aperture) can be supplied in FIG. 29A, and the light beams having a small illuminance (a small illumination numerical aperture) but a large illumination area can be supplied in FIG. 29B. That is, the light beams optimal to the optical system within the wafer stage 291 can be supplied by switching over the magnification of the lens 290 of the light introducing portion.

FIG. 30 shows how a movement of the lens disposed outside the wafer stage corresponds to the movement of the wafer stage in the first, third and fourth embodiments.

Figure 30A:
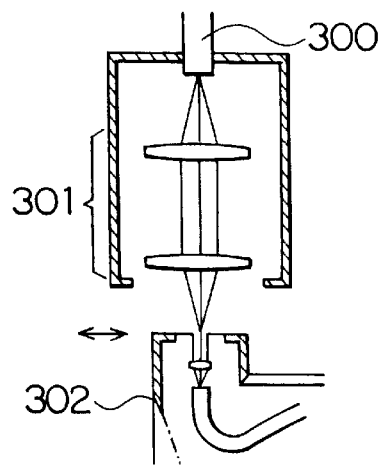
FIGS. 30A and 30B are views showing how a movement of the lens disposed outside the wafer stage corresponds to a movement of the wafer stage in first, third and fourth embodiments.
Figure 30B:
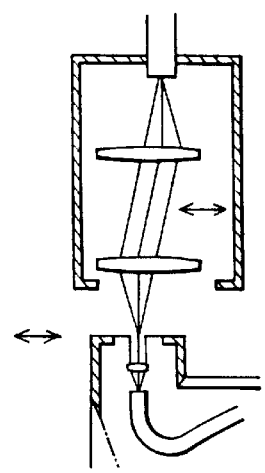

Referring to FIG. 30, in the light introducing portion or the light receiving portion, only a lens 301 is moved in the crosswise direction in FIG. 30 without moving a light guide (or a light receiving sensor) 300 from a state shown in FIG. 30A to a state shown in FIG. 30B. Accordingly, in the case of the light introducing portion, the movement of the lens 301 can be made to correspond to the movement of the wafer stage 302 by shifting the illumination area, with the light beam illuminance remaining large (without decreasing the illumination numerical aperture). Moreover, in the case of the light receiving portion, owing to the movement of the lens 301, it is feasible to receive the light beams having the large illuminance without moving the light receiving guide (or sensor) 300 even when the wafer stage 302 moves.

FIG. 31 illustrates how the movement of the light guide disposed outside the wafer stage corresponds to the movement of the wafer stage in the first, third and fourth embodiments.

Figure 31A:
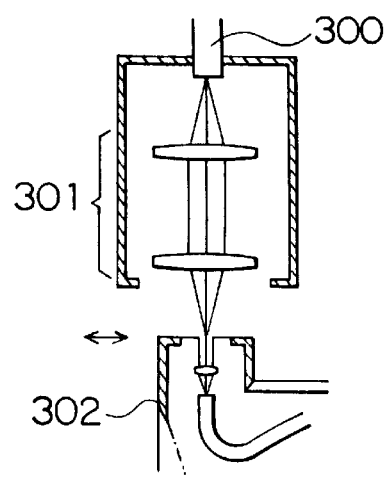
FIGS. 31A and 31B are views showing how a movement of the light guide disposed outside the wafer stage corresponds to the movement of the wafer stage in the first, third and fourth embodiments.
Figure 31B:
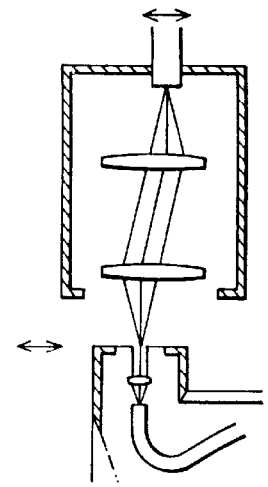

Referring to FIG. 31, in the light introducing portion or the light receiving portion, only a light guide (or a light receiving sensor) 300 is moved in the crosswise direction in FIG. 31 without moving a lens 301 from a state shown in FIG. 31A to a state shown in FIG. 31B. Therefore, in the case of the light introducing portion, the movement of the light guide (or sensor) 300 can be made to correspond to the movement of the wafer stage 302 by shifting the illumination area, with the light beam illuminance remaining large. Furthermore, in the case of the light receiving portion, owing to the movement of the light receiving guide (or sensor) 300, it is possible to receive the light beams having the large illuminance even when the wafer stage 302 moves.

Note that an enlargement effect of the illumination area owing to the movement of the light guide is smaller than an enlargement effect of the illumination area owing to the movement of the lens.

Incidentally, the present invention has been described by exemplifying the projection exposure apparatus including the alignment system in the first and second embodiments discussed above but is, without being limited to this, applicable to a projection exposure apparatus having another proper light sending optical system.

Further, the present invention has been explained by exemplifying the projection exposure apparatus including the illuminance scatter sensor system in the third embodiment discussed above but is, without being confined to this, applicable to a projection exposure apparatus including another proper light receiving optical system.

Moreover, the present invention has been described by exemplifying the projection exposure apparatus provided with the focus calibration mechanism based on the contrast detection method in the fourth embodiment discussed above but is, without being confined to this, applicable to a projection exposure apparatus including other proper light sending optical and light receiving optical systems.

As discussed above, in the light sending optical system incorporated into the projection exposure apparatus of the embodiment, the light introducing system and the light irradiating system are mechanically separated from and unconnected to each other, but are so constructed as to be optically connectable when in the specified positional relationship. Hence, unlike the prior art wherein the exterior and the interior of the substrate stage are connected via the light guide, the light sending optical system exhibiting the extremely high degree of freedom of light sending can be attained with simple construction.

Additionally, in the light receiving optical system incorporated into the projection exposure apparatus of an embodiment, the light lead-out system and the light receiving system are mechanically separated from and unconnected to each other, but are so constructed as to be optically connectable. Therefore, the light receiving optical system exhibiting the extremely high degree of freedom of the light receiving can be attained. Further, the light receiving portion can be located in the desired position outside the substrate stage, and it is therefore possible to restrain the influence by the emission of heat when receiving the light.

As described above, according to an embodiment, it is feasible to secure the extremely high degrees of freedom of the light sending and of the light receiving irrespective of the flexibility of the light guide. Accordingly, any restrictions in the number of optical fibers of the light guide partly constituting the light sending and receiving systems are eliminated particularly the flexibility of the optical fibers.

Furthermore, according to an embodiment, the thermal source such as the light receiving sensor, etc. can be spaced a desired distance from the substrate stage, and hence a cooling mechanism for the thermal source can be easily installed without being particularly in the close proximity to the substrate stage.

Figure 32:
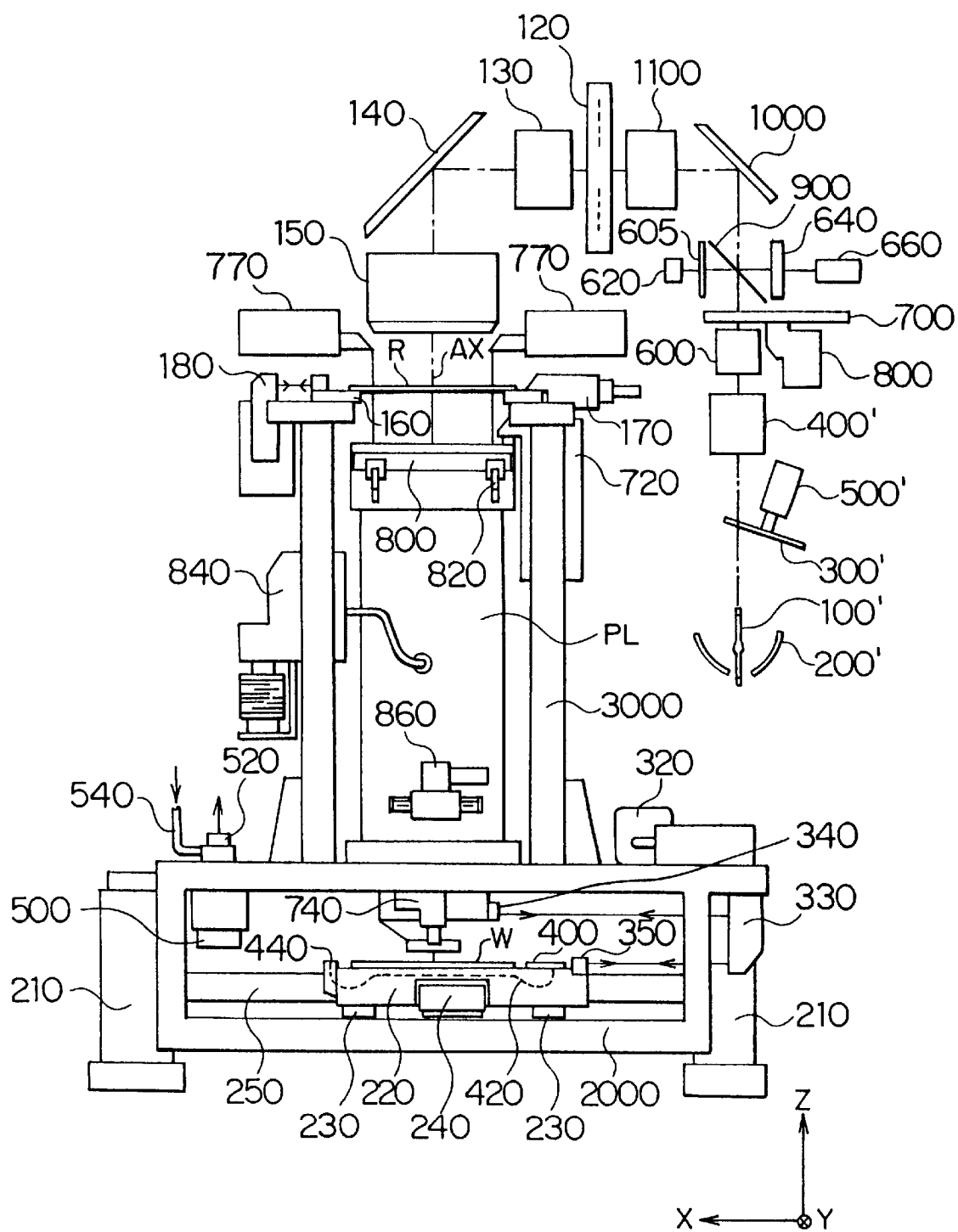
FIG. 32 is a schematic view showing a construction of the projection exposure apparatus in the fifth embodiment of the present invention.

FIG. 32 illustrates a whole construction of the projection exposure apparatus in a fifth embodiment suitable for carrying out the present invention. Herein, it is assumed that each of a plurality of shot areas on a semiconductor wafer W defined as a sensitive substrate is exposed to an image of a circuit pattern area of a reticle R through a reduction projection lens system PL by a step-and-repeat method or a step-and-scan method. Furthermore, in the projection exposure apparatus shown in FIG. 32, illumination light beams for the exposure are produced by ultraviolet rays (e.g., i-lines having a wavelength on the order of 365 nm) emitted from a mercury discharge lamp. Other similarly available light beams are, however, ultraviolet pulse beams from an excimer laser light source, and ultraviolet rays into which laser beams from a YAG laser light source are converted into higher harmonic waves. That is, the "illumination light beam" is a general term of the ultraviolet rays, X-rays, laser beams, and energy lines such as electron beams.

Now, referring to FIG. 32, spectral lines containing the i-line from a mercury lamp 100' are, after being converged at a position of a rotary shutter 300' by an elliptical reflecting mirror 200', diverged and then incident on an input optical system 400'. A shutter 300' has a light shielding blade at every 90°, and alternately switches over a transmission and interception of the light beams emitted from the light source (lamp) 100' for each rotation through 45° by a motor 500'. Further, the input optical system 400' contains an interference filter for extracting i-line spectrum for the exposure, and a collimator lens for collimating the i-line illumination light beams into substantially parallel light beams.

The thus collimated i-line illumination light beams fall upon a fly-eye lens system 600 functioning as an optical integrator, and a multiplicity of secondary light source images are uniformly distributed within a substantially square or circular area on the emerging side thereof. Disposed on the emerging side of the fly-eye lens system 600 is a stop changeover member 700 mounted with a plurality of illumination σ (sigma) stops for changing an effective shape of the secondary light source image to an annular shape, a small circular shape, a normal circular shape and a 4-aperture shape. This changeover member 700 is so driven by a motor 800 as to effect the changeover to a desired illumination σ stop.

The illumination light beams penetrating the illumination a stop travel through a beam splitter 900 having a reflectance on the order of 100% or less, then are reflected by a mirror 1000 and incident upon a first relay lens system 1100. A movable reticle blind 120 for specifying a configuration and a position of the illumination area on the reticle R is irradiated with the illumination light beams with a uniform illuminance distribution. The reticle blind 120 is set to have an aperture analogous to the circuit pattern area on the reticle R in the case of the exposure based on the step-and-repeat method. The reticle blind 120 is also set to have such a slit-like or rectangular shape as to traverse the center of a circular field of the projection lens system PL as disclosed in, e.g., U.S. Pat. No. 5,194,893 in the case of the exposure based on the step-and-scan method.

Now, the circuit pattern area of the reticle R is irradiated with the illumination light beams passing through the aperture of the reticle blind 120, with an uniform intensity distribution through a second relay lens system 130, a mirror 140 and a main condenser lens system 150. Herein, the aperture of the reticle blind 120 is set conjugate to the pattern surface of the reticle R by a synthetic system of the second relay lens system 130 and the main condenser lens system 150. Further, in this embodiment, the optical axis AX of the illumination optical system ranging from the lamp 100' to the main condenser lens system 150 is so set as to be coincident with the optical axis of the projection lens system PL.

The circuit pattern of the reticle R irradiated with the illumination light beams emerging from the illumination optical system is projected on the wafer W on the XYZ-stage 220 constructed within a first column 2000 through the projection lens system PL. The projection lens system PL and a second column 3000 are mounted on the upper portion of the first column 2000, and an anti-vibration base 210 for supporting the whole apparatus on the floor surface is installed at four corners peripheral to the first column 2000.

A reticle stage 160, movable in X- Y- and θ-directions, for holding the reticle R, is provided on the upper portion of the second column 3000. The reticle stage 160 is moved by a driving system 170 provided on the upper portion of the second column 3000, and X- and Y-positions and a rotary (θ) position thereof are sequentially measured by a laser interferometer system 180 attached to the second column 3000. One example of the laser interferometer system 180 is disclosed in Japanese Patent Laid-Open Publication No.62-150721.

By the way, the XYZ-stage 220 constructed within the first column 2000 is supported through air bearings 230 on a plate base of the first column. The XYZ-stage 220 is so constructed as to move in a direction (Y-direction) perpendicular to the sheet surface along a movable rectilinear guide 240 extending in the direction perpendicular to the sheet surface in FIG. 32. The XYZ-stage 220 is also so constructed as to be moved with traction in the X-direction by the movable rectilinear guide 240 moving in the crosswise direction (X-direction) along a fixed rectilinear guide 250. Further, a linear motor for moving the XYZ-stage 220 in the Y-direction is provided between the XYZ-stage 220 and the movable rectilinear guide 240. A linear motor for moving the movable rectilinear guide 240 in the X-direction is provided between the fixed rectilinear guide 250 and the movable rectilinear guide 240.

The stage structure described above is, as disclosed in, e.g., Japanese Patent Laid-Open Publication No.61-209831, of a type that all the driving systems are of a complete non-contact system as in the case of the linear motor, wherein the XYZ-stage 220 is supported on all the guide surfaces based on the air bearing system. Consequently, no mechanical frictions are caused enough to attain the smooth moving and locating operations. Provided furthermore on the XYZ-stage 220 is a wafer table for minutely moving the wafer W in the Z-direction by adsorptively fixing the wafer W and minutely tilting the wafer W around the X-and Y-axes.

Then, X- and Y-directional coordinate positions and a θ-directional displacement quantity of the XYZ-stage 220, are sequentially measured by a laser interferometer system 330 making use of the laser beams emitted from a frequency stabilized laser light source 320. This laser interferometer system 330 interferes the beams reflected perpendicularly by a reference mirror 340 fixed to a lens barrel lower edge portion of the projection lens system PL, with the beams reflected perpendicularly by a movable mirror 350 fixed to the edge portion of the XYZ-stage 220. The laser interferometer system 330 then photoelectrically detects an interference fringe thereof, thereby measuring the coordinate positions of the XYZ-stage 220.

Now, fixed on the XYZ-stage (or the wafer table) is a fiducial plate 4000 formed with a minute aperture (knife edge) for photoelectrically detecting the mark image on the reticle R that is projected through the projection lens system PL, calibrations of a variety of alignment systems, and a plurality of mark patterns used for focus checking and baseline measuring. Then, one end of an optical fiber 420 for leading image-forming light beams and the illumination light beams is disposed under the fiducial plate 400. The other end of the optical fiber 420 is disposed in a photo coupler 440 fixed to a peripheral portion of the XYZ-stage 220.

A small lens having an optical axis extending in the Z-direction in FIG. 32 is provided on the upper portion of the photo coupler 440, the arrangement being such that the end surface of the optical fiber 420 is positioned downwardly of the small lens. Then, a light projecting/receiving system 500, which can be disposed in a face-to-face relationship with the photo coupler 440 is attached to the lower side of an upper plate portion of the first column 2000. The light projecting/receiving system 500 includes a light projecting lens or a light receiving lens having a field substantially equal to a projection-image-surface-side field area (e.g., a diameter on the order of 34 mm) of the projection lens system PL. Photo coupling (optical communication) is performed between the photo coupler 440 and the small lens via the light projecting or receiving lens.

Although described in greater detail later on, when in a state where the light emission pattern and the minute aperture on the fiducial plate 400 on the XYZ-stage 220 (or the wafer table) are positioned within the projection field of the projection lens system PL, the small lens of the photo coupler 440 is so set as to be always positioned within the field of the light projecting or receiving lens of the light projecting/receiving system 500. That is, in this embodiment, the light emission pattern and/or the minute aperture on the fiducial plate 400 corresponds to the predetermined area according to the present invention. Then, when emitting the light emission pattern on the fiducial plate 400, the light projecting/receiving system 500 is constructed so that some of the illumination light beams (i-lines) for the exposure that are led via the optical fiber 540 are projected on the photo coupler 440 via the light projecting lens. When receiving the mark projection image of the reticle R via the minute aperture of the fiducial plate 400, the light projecting/receiving system 500 is constructed so that the image-forming light beams projected upward from the photocoupler 440 are received by a photoelectric detector 520 through the light receiving lens of the light projecting/receiving system 500.

Now, in accordance with this embodiment, some of the illumination light beams from the illumination σ stop (within a switchover member 700) that are reflected by a beam splitter 900 provided in the illumination optical system, penetrate a scattering plate 605 and are received by the photoelectric detector 620 for monitoring an exposure quantity for determining a closing timing of the shutter 300'. Further, the light beams (i-lines) from the light emission pattern of the fiducial plate 400 pass through the projection lens system PL and the reticle R in this sequence, and are thereafter incident upon the illumination optical system. These light beams are, after being reflected by the beam splitter 900 in the illumination optical system, received by the photoelectric detector (a photomultiplier) 660 through a field lens 640. Thus, a construction of the photoelectric detector 660 for detecting the light emission pattern on the XYZ-stage 220 is disclosed as one example in U.S. Pat. No. 4,829,193.

Further, the projection exposure apparatus in this embodiment incorporates a reticle alignment system (TTRA system) 770 for detecting a reticle alignment mark formed in the peripheral portion of the reticle R from above of the reticle R under the exposure illumination light beams. The same exposure apparatus also incorporates a wafer alignment system (TTLA system) 720, based on the Through-The-Lens method, for detecting marks incidental to the shot areas on the wafer W under non-photosensitive illumination light beams through only the projection lens system PL. the exposure apparatus further incorporates a wafer alignment system (OFA system) 740, based on the off-axis method and disposed outside the projection field of the projection lens system PL in the first column 2000, for detecting a variety of marks on the wafer W with the light beams having a non-photosensitive broadband wavelength.

The projection exposure apparatus including these TTRA system 770, TTLA system 720 and OFA system 740 an measures the baseline of each alignment system by use of the fiducial plate 400. This projection exposure apparatus is disclosed in detail in, e.g., U.S. Pat. No. 5,243,195. This embodiment does not deal with the measurement of the baseline and the position measurement (focus checking) of the projection image plane in the Z-direction themselves as principal subjects, but is characterized by making use of the photo coupler 440 and the light projecting/receiving portion 500 when measuring that kind of calibration.

Then, the projection lens system PL in this embodiment is constructed so that lens elements composed of plural kinds of optical lens materials are coaxially disposed to correct an aberration with respect to the i-lines having a wavelength of 365 nm. The projection lens system PL is also so constructed as to be telecentric on both sides, having a circular projection field. In the case of the projection optical system with a target at the ultraviolet rays (KrF excimer laser beams having a wavelength of 248 nm, and ArF excimer laser beams having a wavelength of 193 nm) with a wavelength of 250 nm or under, however, the glass materials quartz and fluorite are desirably used. If a chromatic aberration can not be corrected by only these two kinds of glass materials, there is employed a projection optical system in which the lens elements composed of the above glass materials are combined with a single or a plurality of concave mirrors.

Further, the projection lens system PL shown in FIG. 32 is provided with a driving mechanism 820 containing a piezo element for minutely moving in the optical-axis direction and/or minutely tilting with respect to the optical axis at least a single lens element in a field lens unit (telecentric unit) 800 consisting of a given number of lens elements of the projection lens system PL that exist on the side of the reticle R. Furthermore, this projection lens system PL incorporates a pressure control mechanism 840 for controlling a pressure in a specified lens chamber (a space between the lens elements) within the projection lens system PL, and a variable stop mechanism 860 for automatically continuously changing a effective diameter of an exit pupil (changing the numerical aperture (NA) on the side of the wafer W) of the projection lens system PL.

Each of these mechanisms 820, 840, 860 serves to control quality of the projected image of the pattern of the reticle R, and is used for finely adjusting a projection magnification, a distortion characteristic, an image-forming surface position, and a focal depth and a resolution.

Figure 33:
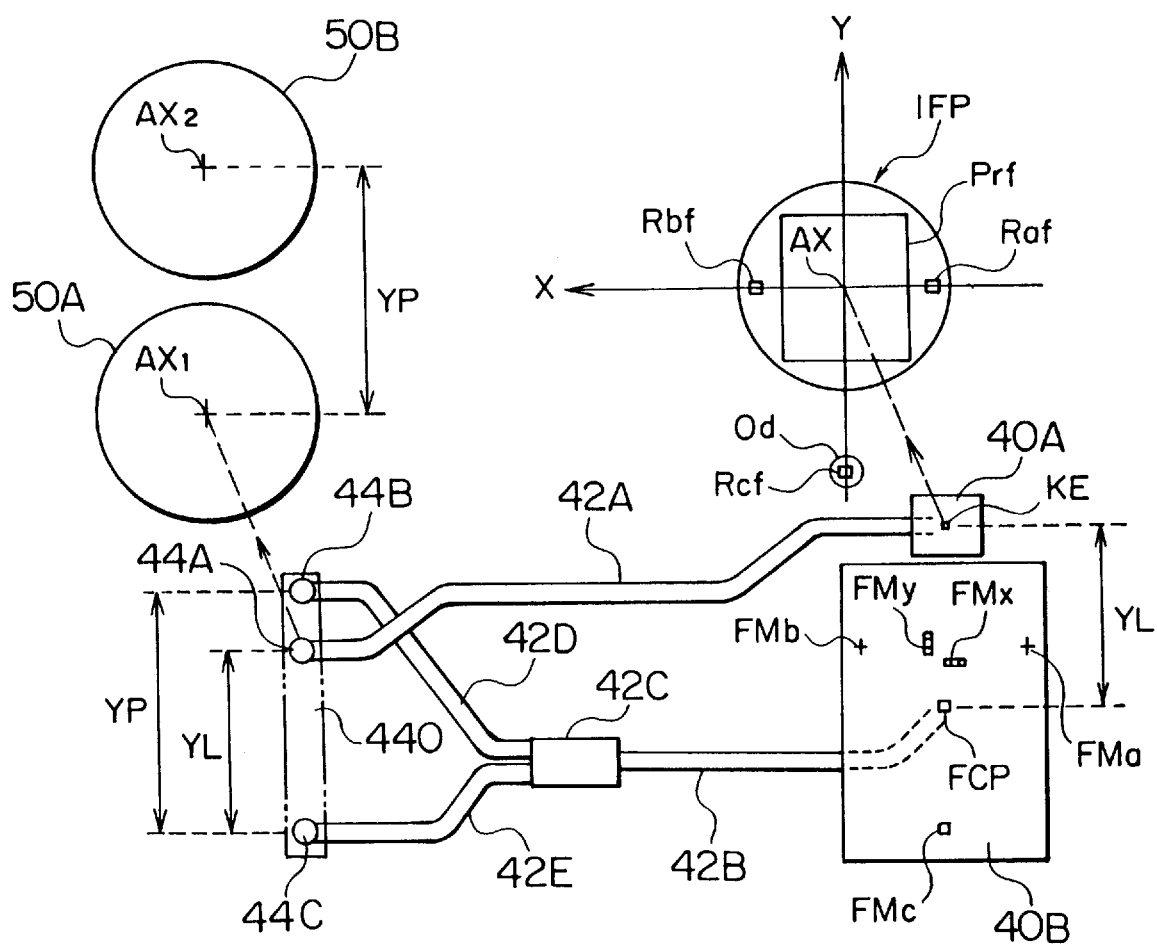
FIG. 33 is a view illustrating an optical image forming system as viewed from within a projection image forming plane of the projection lens system in FIG. 32.

Next, the photo coupling system defined as a characteristic construction in this embodiment will be explained with reference to FIG. 33. FIG. 33 shows a relationship in layout between a projection field IFP as viewed within the projection image plane of the projection lens system PL, a detection field Od of an OFA system 740, the fiducial plate 400 (40A, 40B), the photo coupler 440 (small lenses 44A, 44B, 44C), and the light projecting/receiving portion 500 (a light receiving lens 50A, and a light projecting lens 50B). The positional relationship between the projection field IFP, the detection field Od and the light projecting/receiving portion 500 (the light receiving and projecting lenses 50A, 50B), is fixed on the first column 2000 in FIG. 32. The positional relationship between the fiducial plate 400 (40A, 40B) and the photo coupler 440 (the small lenses 44A, 44B, 44C), is fixed on the XYZ-stage 220 in FIG. 32.

Now, an image Prf of the rectangular circuit pattern area formed on the reticle R in FIG. 32 and images Raf, Rbf of the reticle alignment marks, are positioned within the projection field IFP of the projection lens system PL. An image Rcf of an index pattern when detecting the marks on the wafer W is positioned within the detection field Od of the OFA system 740. Herein, the image Rcf of the index pattern is positioned at a point spaced a fixed distance in the Y-direction away from a position (substantially the central point of the image Prf of the circuit pattern area) of the optical axis AX of the projection lens system PL.

Moreover, an optical axis AX1 of the light receiving lens 50A and an optical axis AX2 of the light projecting lens 50B of the light projecting/receiving portion 500, are both spaced a fixed distance in the X-direction away from the optical axis AX of the projection lens system PL, and spaced a distance YP in the Y-direction from each other. An X-directional interval between the optical axis AX1 of the light receiving lens 50A and the optical axis AX of the projection lens system PL, is set equal to an X-directional interval between a light emission pattern FC for focus checking on the fiducial plate 40B serving as the fiducial plate 400, or a knife edge minute aperture KE on the light receiving plate 40A serving as the fiducial plate 400, and each of the small lenses 44A–44C in the photo coupler 440.

The knife edge minute aperture KE on the light receiving plate 40A receives the image-forming light beams of the projected mark image of the reticle R. The image-forming light beams penetrating the minute aperture KE are led to the small lens 44A of the photo coupler 440 via the optical fiber 42A the incident end of which is disposed under the light receiving plate 40A.

Moreover, a focus checking method using the light emission pattern FCP on the fiducial plate 40B is disclosed in, e.g., U.S. Pat. No. 4,829,193. Herein, however, the illumination light beams (i-lines) emerging from the small lens 44B of the photo coupler 440 are led to a converging portion 42C via the optical fiber 42D, and further are emitted from beneath upon the light emission pattern FCP of the fiducial plate 40B via the optical fiber 42B.

Then, the light beams projected from the light emission pattern FCP reach an arbitrary position of the reticle R through the projection lens system PL, and the light beams reflected therefrom return to the light emission pattern FCP again via the projection lens system PL. The light beams penetrating the light emission pattern FCP and reflected from the reticle R reach the small lens 44C of the photo coupler 440 via the converging portion 42C and the optical fiber 42E. With the construction described above, the Y-directional interval between the small lenses 44B and 44C of the photo coupler 440 is set to YP. When the XYZ-stage 220 is located in the XY-direction so that the small lens 44B is position on the optical axis AX2 of the light projecting lens 50B, the small lens 44C is positioned on the optical axis AX1 of the light receiving lens 50A, and the light emission pattern FCP of the fiducial plate 40B is positioned on the optical axis AX of the projection lens system PL.

Accordingly, when the light emission pattern FCP is in any position within the projection field IFP due to the movement of the XYZ stage 220, it follows that the small lens 44B of the photo coupler 440 is always positioned within the field of the light projecting lens 50B, while the small lens 44C is positioned within the field of the light receiving lens 50A.

By the way, in accordance with this embodiment, there are not simultaneously executed the measurement using the minute aperture KE of the light receiving plate 40A and the measurement using the light emission pattern FCP of the fiducial plate 40B. Therefore, a Y-directional interval YL between the minute aperture KE of the light receiving plate 40A and the light emission pattern FCP of the fiducial plate 40B, is set larger than a diameter (or a maximum size of the image Prf of the circuit pattern area) of the projection field IFP of the projection lens system PL.

When the minute aperture KE of the light receiving plate 40A is positioned within the projection field IFP of the projection lens system PL, the light emission pattern FCP is positioned outside the projection field IFP. When the light emission pattern FCP is positioned within the projection field IFP of the projection lens system PL, the minute aperture KE is positioned outside the projection field IFP.

Herein, a Y-directional interval between the small lens 44A in the photo coupler 440 that corresponds to the minute aperture KE and the small lens 44C corresponding to the light emission pattern FCP, is also set to YL. Hence, when the small lens 44C of the photo coupler 440 is positioned within the field of the light receiving lens 50A (when the light emission pattern FCP is positioned within the projection field IFP of the projection lens system PL), the small lens 44A corresponding to the minute aperture KE is positioned outside the field of the light receiving lens 50A. Further, when the minute aperture KE is positioned within the projection field IFP of the projection lens system PL, the small lens 44A corresponding to the minute aperture KE is positioned within the field of the light receiving lens 50A.

Thus, the light receiving lens 50A on the side of the first column 2000 serves to receive the reflected light beams from the reticle R that have been received by the light emission pattern FCP and transmitted upward from the small lens 44C as well as receiving the mark image-forming light beams of the reticle R that have been received by the minute aperture KE and transmitted upward from the small lens 44A on the XYZ-stage 220.

Accordingly, an emerging end composed of a plurality of optical fibers for emitting the illumination light beams from the light projecting lens 50B and an incident end composed of a plurality of optical fibers for leading the light beams from the light emission pattern FCP to the light receiving lens 50A, are arranged at random on the edge surface, positioned downwardly of the fiducial plate 40B, of the optical fiber 42B.

Further, a variety of fiducial marks FMa, FMb, FMc, FMx, FMy for measuring the baseline are formed on the surface of the fiducial plate 40B. A tangible method of arranging and using these fiducial marks is disclosed in Japanese Patent Laid-Open Publication Nos.4-324923 and 5-21314 which have been previously given, and is therefore briefly explained herein.

The fiducial marks FMa, FMb are disposed so that positional deviations thereof from the reticle alignment mark images Raf, Rbf are detected by two TTRA systems 770 shown in FIG. 32. When the XYZ-stage 220 is located so that the two TTRA systems 770 are capable of detecting the fiducial marks FMa, FMb and the reticle alignment mark images Raf, Rbf, a fiducial mark FMc is disposed so that an OFA system 740 simultaneously detects a positional deviation of an index pattern image Rcf within the OFA system from a fiducial mark FMc.

Moreover, fiducial marks FMx, FMy are so disposed as to be detected by a TTLA system 720 shown in FIG. 32. When the XYZ-stage 220 is located so that the OFA system 740 detects the fiducial mark FMc, however, the respective fiducial marks FMx, FMy may be disposed so that the TTLA system 720 simultaneously detects the fiducial marks FMx, FMy.

Figure 34:
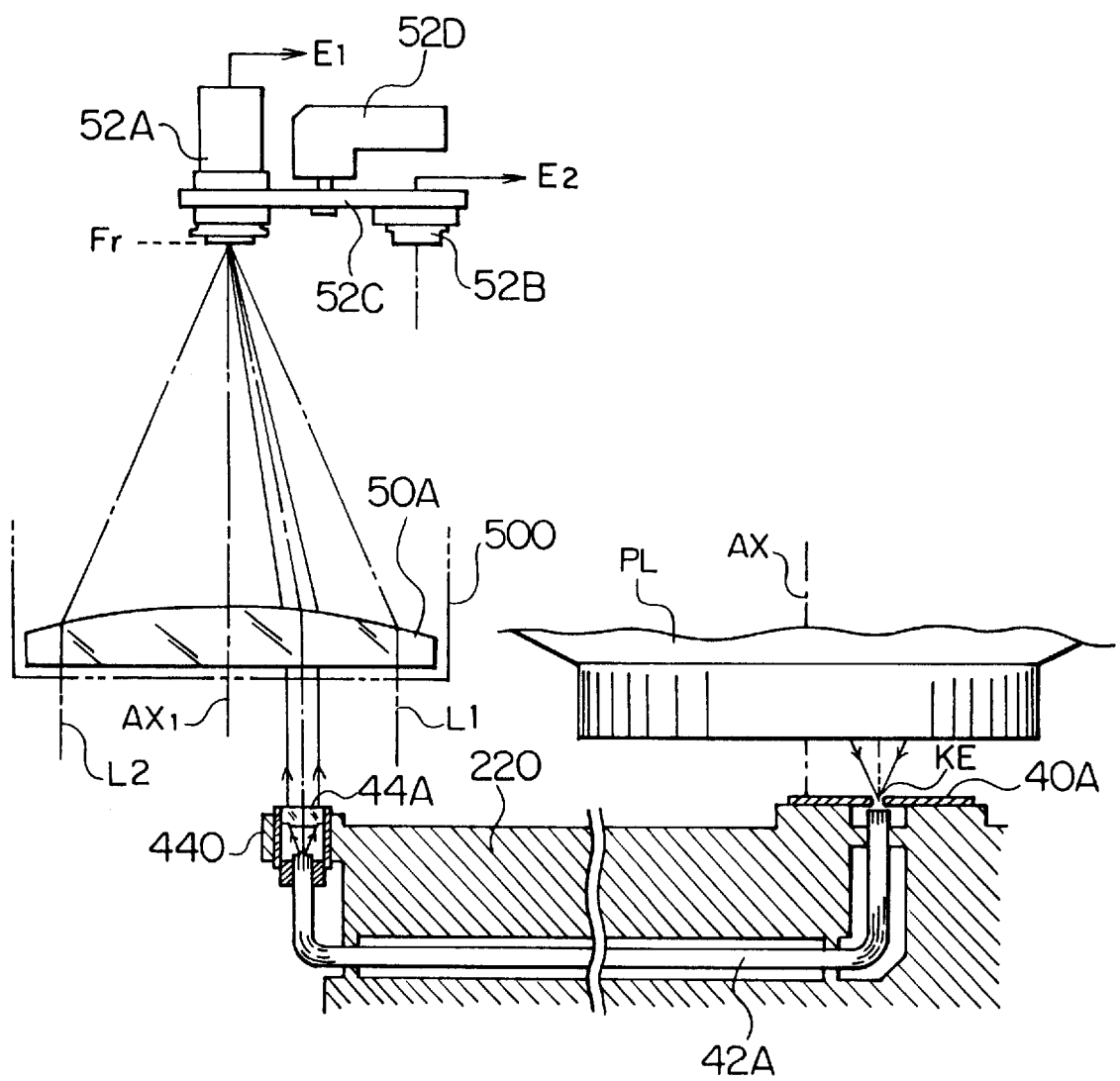
FIG. 34 is an explanatory view illustrating a detailed construction showing how the light beams from a minute aperture KE of a light receiving plate 40A shown in FIG. 33 are detected by a photoelectric detector 52 through a light receiving lens 50A.

Herein, referring to FIG. 34, there will be explained a detailed construction using a photoelectric detector 520 illustrated in FIG. 32 to detect the light beams from the minute aperture KE of the light receiving plate 40A shown in FIG. 33 through the light receiving lens 50A. Referring to FIG. 34, the same members as those shown in FIGS. 32 and 33 are marked with the like numerals. The minute aperture KE of the light receiving plate 40A receives the mark image of the reticle R that is projected through the projection lens system PL, and the image-forming light beams passing through the minute aperture KE are led to the small lens 44A of the photo coupler 440 via the optical fiber 42A. Then, the image-forming light beams from the small lens 44A are, after falling upon the light receiving lens 50A of the light projecting/receiving portion 500, received by a photomultiplier 52A serving as the photoelectric detector 520.

A light receiving surface of this photomultiplier 52A is disposed on a focal surface Fr (hereinafter referred to as a Fourier transform surface Fr) on the rear side (on the side of the photomultiplier 52A) of the light receiving lens 50A, or disposed in the vicinity thereof. With this arrangement, even when the XYZ-stage 220 moves within the XY plane so that the small lens 44A exists in a field (a range defined by principal light beams L1 and L2) of the light receiving lens 50A, the image of the emerging end of the optical fiber 42A is formed at the center (the optical axis AX1) of the Fourier transform surface Fr without any positional change. Thus, the photomultiplier 52A with the small light receiving surface can be adopted. Note that the emerging end of the optical fiber 42A is disposed on the focal surface on the front side (on the side of the optical fiber 42A) of the small lens 44A.

Now, referring to FIG. 34, the transmitting light beams from the minute aperture KE are photoelectrically detected by the photomultiplier 52A. In the actual case, however, the projected image of the mark of the reticle R through the projection lens system PL has a comparatively large light intensity, and hence an output signal E1 is saturated, because of the sensitivity being too high in the photomultiplier 52A. Then, as illustrated in FIG. 34, a semiconductor photoelectric device 52B of a silicon photo diode, etc. is fixed together with the photomultiplier 52A to a switchover plate 52C. This switchover plate 52C is driven by a driving mechanism 52D as the necessity arises, thus switching over the photomultiplier 52A and the photoelectric device 52B. Then, when the light receiving lens 50A photoelectrically detects the transmitting light beams from the minute aperture KE, the photoelectric device 52B is disposed at the center of the Fourier transform surface Fr, and an output signal E2 from the photoelectric device 52B is used.

On the other hand, according to the focus checking method employing the light emission pattern FCP of the fiducial plate 40B shown in FIG. 33, the illuminance of the illumination light beams incident upon the small lens 44B is reduced by a factor of several number to several ten number of the illumination energy distributed over the entire field of the light projecting lens 50B; a quantity of the light beams, reflected by the reticle R and returning, of the illumination light beams emitted from the light emission pattern FCP, depends on a reflectance (a high reflectance in the chrome portion, whereas a low reflectance in the glass portion) of a corresponding portion on the reticle R; and therefore a quantity of light beams traveling toward the light receiving lens 50A from the small lens 44C remarkably decreases. For this reason, when the light receiving lens 50A photoelectrically detects the transmitting light beams from the light emission pattern FCP, the output signal E1 may be used by disposing the photomultiplier 52A at the center of the Fourier transform surface Fr as shown in FIG. 34.

Figure 35:
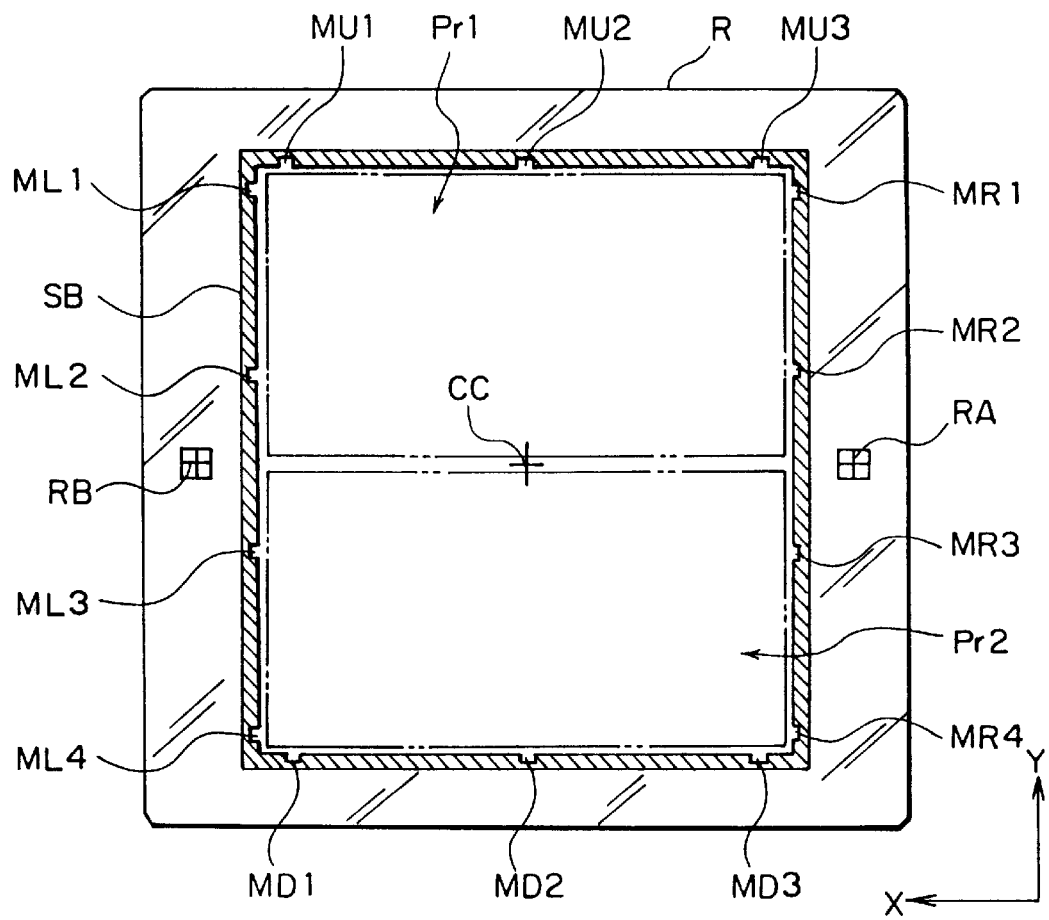
FIG. 35 is a view illustrating a layout of marks of a reticle R that are detected through the minute aperture KE of the light receiving plate shown in FIG. 34.

Herein, a layout of the marks on the reticle R that are detected through the minute aperture KE of the light receiving plate 40A illustrated in FIG. 34, is explained with reference to FIG. 35. FIG. 35 shows a layout in plan of two circuit pattern areas Pr1, Pr2 identical with each other and formed on the reticle R, a light shielding band SB (corresponding to a street line on the wafer W) surrounding the above areas, and reticle alignment marks RA, RB detected by the TTRA systems 770 shown in FIG. 32. Then, marks ML1, ML2, ML3, ML4, MR1, MR2, MR3, MR4, MU1, MU2, MU3, MD1, MD2, MD3 detectable through the minute aperture KE are written in the layout illustrated in FIG .35 within the light shielding band SB together with writing data within the circuit pattern areas Pr1, Pr2 by, e.g., an EB exposure apparatus.

Referring again to FIG. 35, a geometrical center CC of the two circuit patterns Pr1, Pr2 on the reticle R is disposed at the central point of a line segment (parallel to the X-axis) connecting central points of the cross-shaped reticle alignment marks RA, RB. When the reticle R is precisely aligned by the TTRA system 770, the center CC is set coincident with the optical axis AX of the projection lens system PL. In general, however, the EB exposure apparatus is constructed so that the reticle alignment marks RA, RB outside the light shielding band SB are written separately from the data for writing the circuit pattern. Hence, it might happen that a minute disposition error (on the order of, e.g., ±0.1 μm) is produced between the central point of the line segment connecting the central points of the marks RA, RB and the geometrical center CC of the circuit pattern areas Pr1, Pr2.

It follows that this minute disposition error finally remains to be a superposition error when the shot area on the wafer W is exposed to the circuit pattern of the reticle R even if the baseline is precisely measured. The superposition error is a approximately 20± nm on the wafer when a reduction ratio of the projection lens system PL is 1/5. Whether or not this residual error is allowable is substantially determined by a value of an on-wafer-W minimum line width of the pattern for the projection exposure. When a projectable minimum line width is, e.g., 0.2–0.25 μm, a total superposition accuracy required is ±20–25 nm. It can be understood that this value is substantially equal to the above disposition error (approximately ±20 nm on the wafer) produced when writing the reticle R, and this, when remaining as it is, will become a serious error.

Then, positions of respective projected images of the marks ML$n$, MR$n$, MY$m$, MD$m$ (n=1 to 4, m=1 to 3), formed in a plurality of positions of the peripheral portion of the circuit pattern area of the reticle R, are sequentially measured by use of the minute aperture KE of the light receiving plate 40A. Based on measured data thereof, a position of the projecting point of the center CC of the circuit pattern area on the reticle R is statistically determined on average. Thereafter, a central position of each of the projected images of the reticle alignment marks RA, RB is measured by using the minute aperture KE of the light receiving plate 40A. A central position of the line segment connecting the respective central points of the marks RA, RB is determined based on measured data thereof. A difference ΔEP (x, y) between the central position and the position of the projecting point of the center CC is calculated as the above disposition error.

Thereafter, a baseline quantity determined, as done in U.S. Pat. No. 5,243,195, by use of the fiducial plate 40B, is corrected by the value of the above-calculated error ΔEP (x, y). It is thus possible to prevent a deterioration in terms of the superposition precision, which is attributed to the disposition error of the marks RA, RM that is caused when writing the reticle R.

Now, referring to FIG. 35, the right-and-left marks ML$n$, MR$n$ (n=1 to 4) in the light shielding band SB that extend in the Y-direction, are each formed in a line-and-space configuration wherein a plurality of transparent lines extending in the X-direction within the light shielding area are arrayed at a fixed pitch in the Y-direction. Further, the up-and-down marks MU$m$, MD$m$ (m=1 to 3) in the light shielding band SB that extend in the X-direction, are each formed in the line-and-space configuration wherein a plurality of transparent lines extending in the Y-direction within the light shielding area are arrayed at a fixed pitch in the X-direction. These marks are formed as shown in, e.g., FIG. 36.

Figure 36:
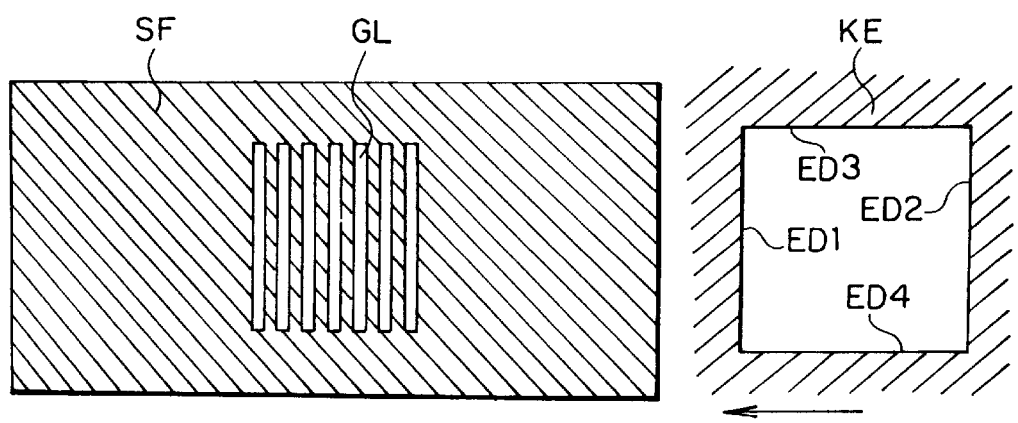
FIG. 36 is an explanatory view illustrating a shape of the mark shown in FIG. 35.

Referring to FIG. 36, each mark is formed of seven transparent lines GL arrayed at the fixed pitch within a light shielding area SF. Herein, it is assumed that a width of the light shielding line formed between the respective transparent lines GL, is set substantially equal to a width of the transparent line GL. Then, on both sides of the light shielding area SF in a pitch direction of the transparent lines GL, the light shielding area extends with such an areal size as to light-shield images formed when reversely projecting, on the side of the reticle R, the minute aperture KE formed in the light receiving plate 40A on the XYZ-stage 220 through the projection lens system PL.

The minute aperture KE is, as illustrated in FIG. 36, formed substantially in a square defined by rectilinear edges ED1, ED2, ED3, ED4 extending in the X- and Y-directions. Accordingly, in a state where the seven transparent lines GL of the mark are projected by the projection lens system PL, when movement-scanning the projected images thereof through the minute aperture KE, the projected images of the transparent lines GL appear line by line in the minute aperture KE from the left or right side, and eventually all appear within the minute aperture KE. At this time, as shown in FIG. 34, a quantity of light beams received by the photoelectric detector 520 (the semiconductor light receiving device 52B) through the optical fiber 42A, the small lens 44A and the light receiving lens 50A, increases (or decreases) substantially stepwise each time the projected image of the transparent line GL is scanned by the edge ED1 or ED2 of the minute aperture KE.

Figure 37A:
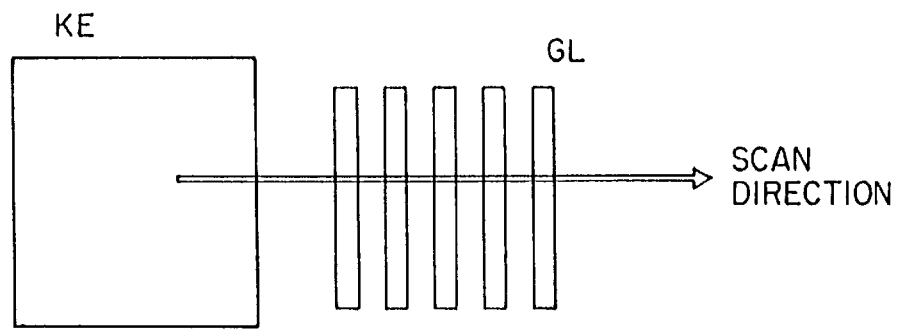
FIG. 37(a) and (b) are diagrams showing one example of a waveform of a signal E2 outputted from a photo electric device 52B serving as a photoelectric detector 520 when projected images of a plurality of transparent lines are scanned through the minute aperture KE shown in FIG. 36.
Figure 37B:
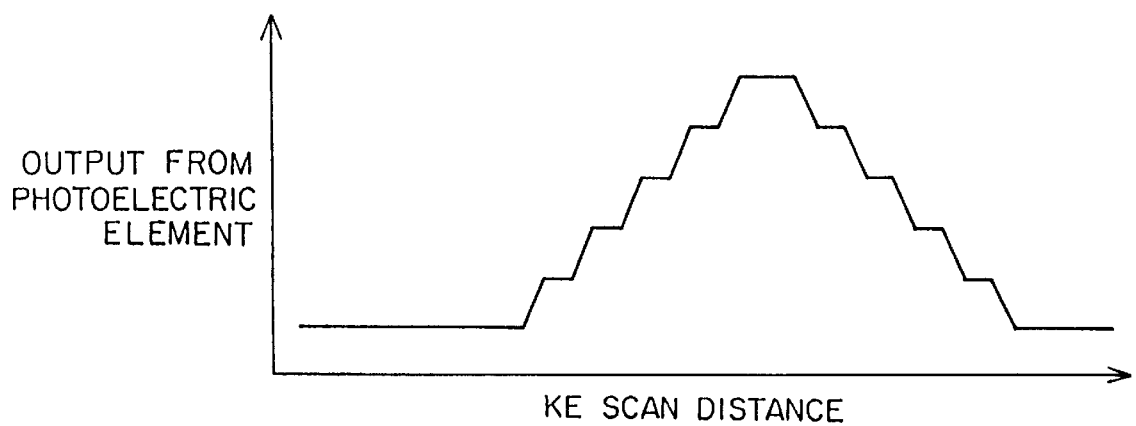

FIG. 37 shows one example of a waveform of the signal E2 outputted from the photoelectric device 52B serving as the photoelectric detector 520 when the projected images of the seven transparent lines GL shown in FIG. 36 pass through the minute aperture KE. Note that a plurality of minute apertures KE can be provided on the light receiving plate 40A as desired. With this arrangement, the plurality of minute apertures KE can be simultaneously or selectively employed, thereby exhibiting such an effect as to increase a detection speed.

When differentiating the waveform of the signal E2 shown in FIG. 37(*b*) by a scan distance (coordinates of the XYZ-stage 220) of the knife edge KE, a distribution of light intensities of the projected images of the transparent lines GL in the scan direction can be obtained. In this embodiment, the thus obtained light intensity distribution takes a periodic pattern, and hence positions of the transparent lines GL can be detected by a phase difference detection method of detecting the position depending on how far a phase component of the periodic pattern deviates from the fiducial position.

More specifically, there can be used the method disclosed in Japanese Patent Laid-Open No.1-299402 filed by the present applicant. A brief description of this method will be given. In the waveform E2 differentiated by the scan distance, supposing that a certain is set as an origin O, this differentiated waveform is a function f (scan) with respect to the scan direction. Obtained subsequently are a Fourier coefficient S of the function f (scan) relative to a sine function having the same period as the function f (scan) in a predetermined area, and a Fourier coefficient C of the function f (scan) relative to a cosine function having the same period as the function f (scan). It is feasible to obtain, from these two Fourier coefficients, a phase difference component (a positional deviation from the origin in the scan direction for the projected images of the transparent lines GL) of the light intensity distribution in the scan direction for the projected images of the transparent lines GL.

Figure 38:
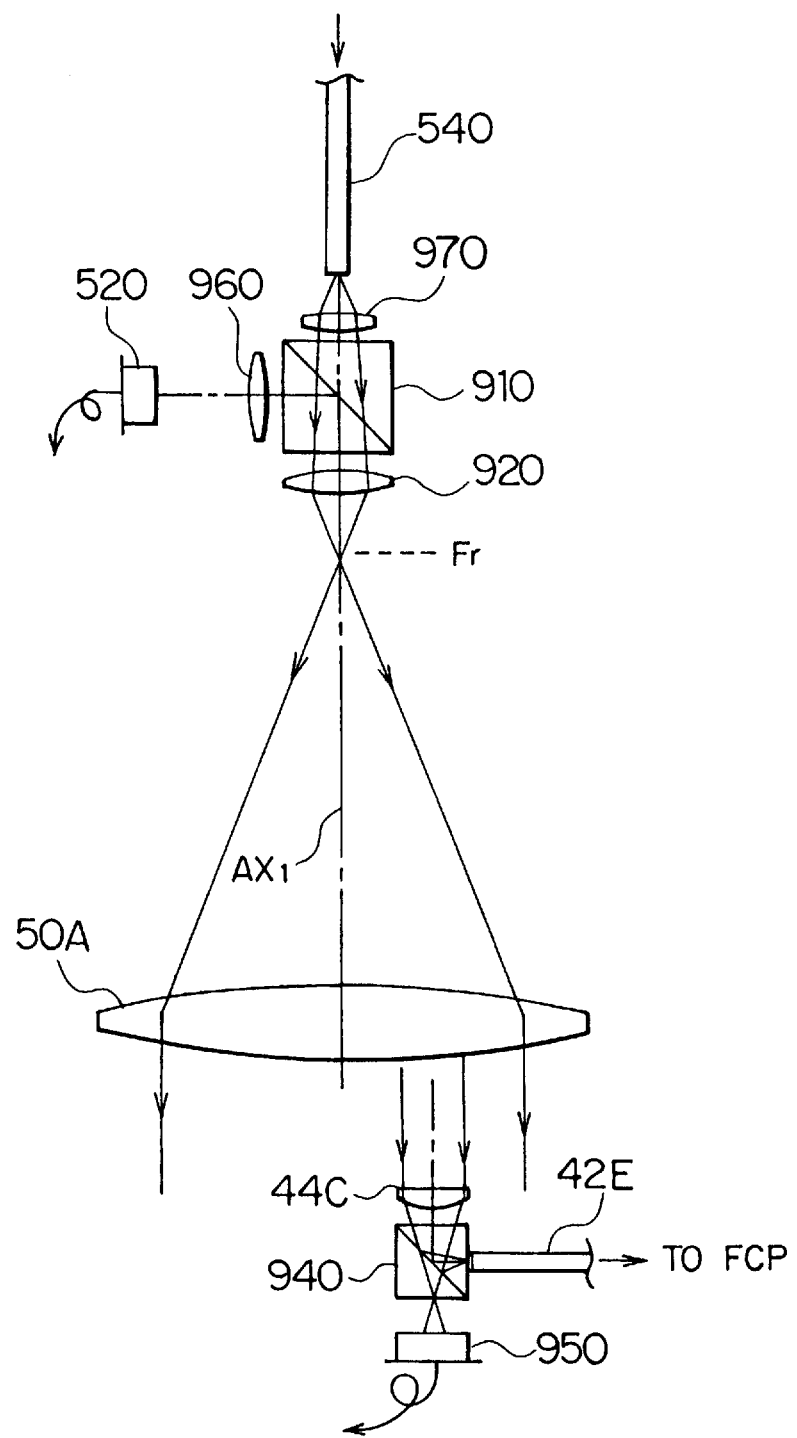
FIG. 38 is a view illustrating a construction in a sixth embodiment of the present invention, wherein the light receiving lens 50A constituting a light projecting/receiving system 500 serves to project the illumination light beams to a light emission pattern FCP and to receive the image forming light beams from the minute aperture KE.

Next, a sixth embodiment will be discussed with reference to FIG. 38. Referring to FIG. 38, the same constructive members as those previously shown in FIGS. 32, 33 and 34 are marked with the like numerals. Then, the construction in the sixth embodiment is that the light receiving lens 50A constituting the light projecting/receiving system 500 serves to project the illumination light beams on the light emission pattern FC and to receive the image-forming light beams emerging from the minute aperture KE.

Referring to FIG. 38, the illumination light beams (which are the i-lines herein) for the exposure are incident upon a lens system 970 via the optical fiber 540 and then fall upon a lens system 920 after penetrating a beam splitter 910. Then, a spatial image at the emerging end of the optical fiber 540 is formed within the Fourier transform surface Fr posterior to the lens system 920. The illumination light beams from the lens system 920 are projected with a uniform illuminance distribution toward the photo coupler 440 an the side of the XYZ-stage 220 via the light receiving lens 50A. A proportion of the illumination light beams are incident on the small lens 44C of the photo coupler 440, and another proportion of the light beams are reflected by the beam splitter 940 and incident on the optical fiber 42E for transmitting the illumination light beams to the light emission pattern FCP.

On the other hand, the system is constructed so that some of the illumination light beams penetrating the beam splitter 940 are received by a photoelectric device 950. This photoelectric device 950 monitors a quantity of the illumination light beams received by the small lens among the fluxes of illumination light beams projected from the optical fiber 540. Now, in accordance with the sixth embodiment, the optical fiber 42E is led directly just under the light emission pattern FCP, and the light emission pattern FCP is illuminated with the illumination light beams led to the emerging end of the optical fiber 42E. Then, when the transmitting light beams passing through the light emission pattern FCP are reversely projected on the reticle R through the projection lens system PL, the reflected light beams from the reticle R again pass through the transparent portion (i.e., the plurality of transparent lines) within the light emission pattern FCP and are incident on the optical fiber 42E. The light beams are then reflected by the beam splitter 940 and reach the beam splitter 910 via the small lens 44C, the light receiving lens 50A and the lens system 920. Subsequently, the light beams reflected by the beam splitter 910 an coming from the reticle R are received by the photoelectric detector 520 via the lens system 960.

It is desirable that the photoelectric detector 520 be set in the switchover system to the photomultiplier 52A and the semiconductor photoelectric device 52B as previously shown in FIG. 34. If a dimming filter possible of being taken in and out can be disposed in front of the photomultiplier 52A, however, only the photomultiplier 52A may be enough. As discussed above, providing the beam splitter 910 eliminates the necessity for providing, as illustrated in FIG. 33, the light projecting lens 50B for sending the illumination light beams to the light emission pattern FCP, the small lens 44B of the photo coupler 440, the optical fiber 42D and the converging portion 42C, thereby yielding such advantage that the construction of the apparatus is simplified.

Furthermore, in the construction depicted in FIG. 38, the emerging end of the light sending optical fiber 540 is conjugate to the incident end of the optical fiber 42E through the lens systems 970, 920, the light receiving lens 50A and the small lens 44C. Also, as a matter of course, the detection light beams from the minute aperture KE of the light receiving plate 40A are received by the photoelectric detector 520 via the small lens 44A of the photo coupler 440, the light receiving lens 50A, the lens system 920, the beam splitter 910 and the lens system 960.

Next, a seventh embodiment will be described with reference to FIG. 39. The seventh embodiment, unlike the preceding fifth and sixth embodiments, includes a fine adjustment mechanism capable of adjusting states of connections of the first and second optical system.

Figure 39:
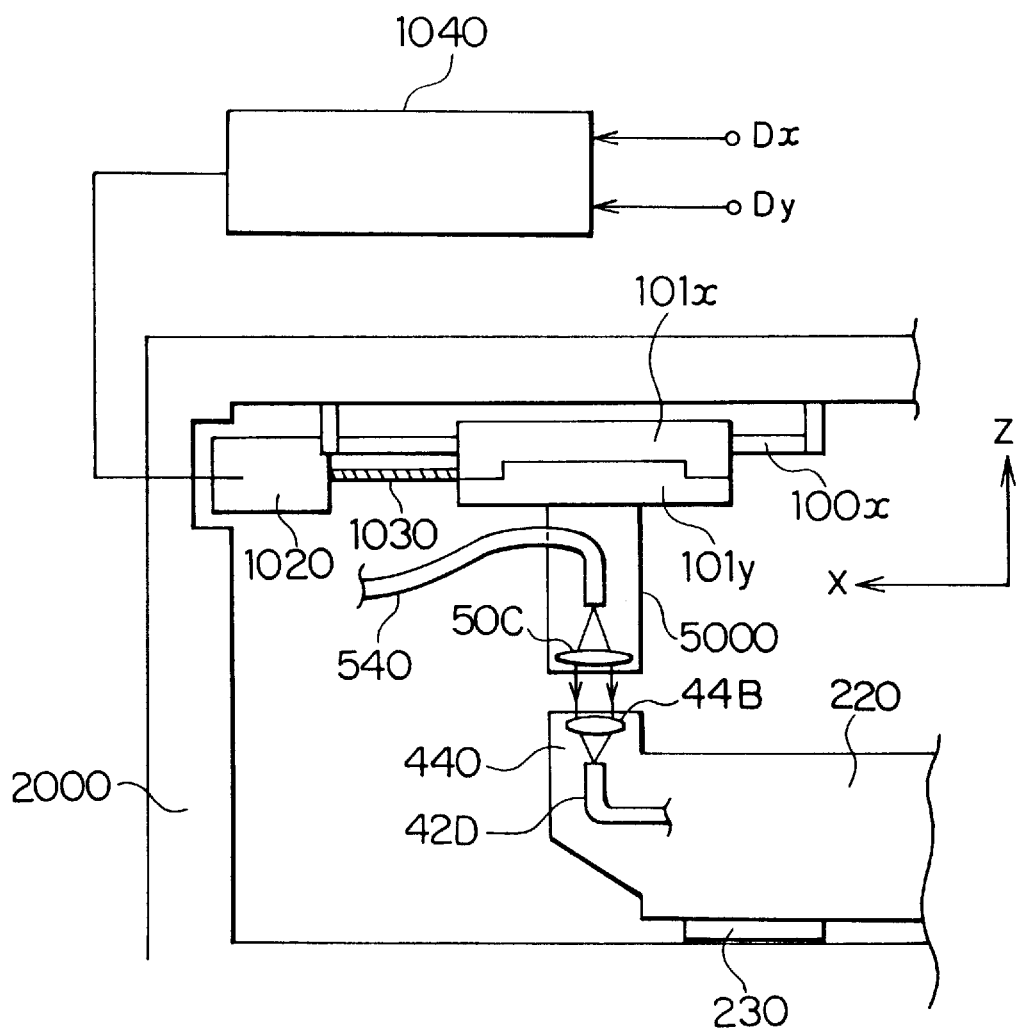
FIG. 39 is a view illustrating a construction having a fine adjustment mechanism aiming at adjusting the optical system in a seventh embodiment of the present invention.

Referring to FIG. 39, a guide rail 100x attached to the first column 2000 is equipped with a mount table 101x movable in the X-direction. This mount table 101x is finely movable in the X-direction by driving a drive portion 1020 through a feed screw 103x. Further, the mount table 101x is provided with a mount table 101y movable in the Y-direction (perpendicular to the sheet surface). This mount table 101y is finely movable in the Y-direction by an unillustrated driving portion. A locating device 1040 controls the driving portion 1020 and the unillustrated driving portion in accordance with input values of Dx, Dy. Herein, outputs of a linear encoder for detecting X- and Y-directional positions of the mount tables 101x, 101y are transferred to the locating device 1040.

Now, the mount table 101y is fitted with a box body 5000 encasing the tip end of the optical fiber 540 of the light sending optical system of the first optical system and a collimator lens 50C for collimating the light beams therefrom.

Accordingly, the mount tables 101x, 101y are located precisely by the locating device 1040 and then moved, thereby enabling the position of this light sending optical system to shift precisely. This provides such a characteristic that there can be accurately adjusted the light beams incident upon the optical fiber 42D of the light receiving portion as well as on the light receiving lens 44B of the light receiving optical system, which are disposed on an air stage 220 sustained by an air pad 230.

As shown in the fifth, sixth and seventh embodiments discussed above, with a higher accuracy of the air stage, the optical fiber for sending the light beams from a variety of light sending and receiving optical systems originally incorporated into the stage, is led outside of the stage, whereby there is such a situation that the control accuracy of the stage might be influenced by stress of that fiber.

Moreover, when the light receiving sensor is provided inwardly of the wafer stage, and even if a high-performance air-conditioning mechanism is prepared around the wafer stage, there can not be ignored the influences exerted, on the precision of the wafer stage laser interferometer and precision of other alignment systems, by the heat evolved from the light receiving sensor.

Provided in accordance with the seventh embodiment is the projection exposure apparatus having the light sending/receiving optical systems exhibiting the high degrees of freedoms of the light sending and receiving, and it is feasible to actualize the stage capable of the high-accuracy locating operation without exerting any influence on the control precision of the stage due to the stress of the fiber.

Further, as seen in the embodiments discussed above, the light receiving/sending optical systems based on the light sending/receiving transmission are attainable with the focus calibration function to calibrate the focus of the projection lens incorporated into the stage and all the functions using the optical fibers for leading the irradiation quantity monitor for measuring the irradiation quantity and the knife edge sensor capable of measuring the image-forming performance, outside the stage.

As discussed above, in the light sending optical system provided in the projection exposure apparatus of the embodiment, the light introducing portion and the light irradiating portion are so constructed as to be mechanically separated and unconnected but optically connectable. Therefore, unlike the technique of connecting the exterior and interior of the substrate stage through the optical fiber (the light guide), the light sending and receiving optical systems exhibiting the extremely high degrees of freedoms of the light sending and receiving, can be attained. Moreover, it is thus possible to ignore the influence exerted on the driving accuracies (a stepping accuracy and a scan accuracy) of the wafer stage due to the stress of the light guide.

Furthermore, when the light receiving sensor is provided inside the wafer stage, and even if the high-performance air-conditioning mechanism is prepared around the wafer stage, there can not be ignored the influences exerted, on the precision of the wafer stage laser interferometer and precision of other alignment systems, by the heat evolved from the light receiving sensor. According to the present invention, however, the heat emitting source within the stage is removed, with the result that the stable functional performance of the stage can be maintained, It is apparent that, in this invention, a wide range of different working modes can be formed based on the invention without deviating from the spirit and scope of the invention. This invention is not restricted by its specific working modes except as limited by the appended claims.

What is claimed is:

1. A projection exposure apparatus for projecting a transfer pattern on a mask onto a photosensitive substrate, comprising:

an illumination optical system having a light source;

a mask support member, disposed on a light path of illumination light beams from said illumination optical system, to support the mask formed with the transfer pattern so as to permit the illumination light beams to pass through the mask;

a projection optical system to form an image of the pattern on the substrate based on the illumination light beams from the mask;

a substrate stage, to hold the substrate, which is movable at least within a predetermined plane to locate the substrate with respect to said projection optical system; and a light sending optical system comprising:

a predetermined light source existing outside said substrate stage;

a light introducing system so constructed as to introduce light beams from said predetermined light source into said substrate stage; and a light irradiating system so constructed as to lead the light beams introduced into said substrate stage by said light introducing system, to a predetermined position on said substrate stage, wherein said light introducing system and said light irradiating system are mechanically separated, and are located so that said light introducing system and said light irradiating system are optically connectable in accordance with a positional relationship of said substrate stage versus said projection optical system.

2. The projection exposure apparatus according to claim 1, wherein said light sending optical system comprises:

a first light guide member so located as to guide the light beams from said predetermined light source to a predetermined position outside the substrate stage; and a second light guide member so located as to guide the light beams emerging from an emerging end of said first light guide member to said predetermined position on said substrate stage.

3. The projection exposure apparatus according to claim 2, further comprising:

a lens system, disposed between said emerging end of said first light guide member and an incident end of said second light guide member, to optically connect the emerging end of said first light guide member and the incident end of said second light guide member.

4. The projection exposure apparatus according to claim 2, wherein the emerging end of said first light guide member is located in close proximity to an incident end of said second light guide member.

5. The projection exposure apparatus according to claim 1, said light sending optical system comprising:

a first light guide member so located as to guide the light beams from said predetermined light source to a predetermined position between said projection optical system and the mask; and a second light guide member so located as to guide, to said predetermined position on said substrate stage, the light beams emerging from an emerging end of said first light guide member and guided into said substrate stage via said projection optical system.

6. The projection exposure apparatus according to claim 5, further comprising:

a lens system, disposed on one light path selected from a light path between the emerging end of said first light guide member and said projection optical system and a light path between said projection optical system and an incident end of said second light guide member, for optically connecting the emerging end of said first light guide member and the incident end of said second light guide member.

7. The projection exposure apparatus according to claim 1, wherein said projection optical system has a predetermined projection field on said substrate stage, and said light introducing system and said light irradiating system are optically connected in a state where the predetermined position on said substrate stage exists within the projection field.

8. The projection exposure apparatus according to claim 7, wherein a predetermined pattern area is formed in the predetermined position on said substrate stage.

9. The projection exposure apparatus according to claim 1, wherein said light introducing system introduces light beams to said light irradiating system through said projection optical system.

10. The projection exposure apparatus according to claim 1, wherein said light introducing system and said light irradiating system are optically connectable only when said substrate stage is in a specified positional relationship with respect to said projection optical system.

11. A projection exposure apparatus for projecting a transfer pattern on a mask upon a photosensitive substrate, comprising:

an illumination optical system having a light source;

a mask support member, disposed on a light path of illumination light beams from said illumination optical system, to support the mask formed with the transfer pattern so as to permit the illumination light beams to pass through the mask;

a projection optical system to form an image of the pattern on the substrate based on the illumination light beams from the mask;

a substrate stage, to hold the substrate, which is movable at least within a predetermined plane to locate the substrate with respect to said projection optical system; and a light receiving optical system comprising:
- a light lead-out system so constructed as to lead, outside said substrate stage, light beams from said projection optical system that have been introduced into said substrate stage at a predetermined position; and
- a light receiving system provided in such a position as to receive the light beams led outside said substrate stage by said light lead-out system,
- wherein said light lead-out system and said light receiving system are mechanically separated, and are located so that said light lead-out system and said light receiving system are optically connectable in accordance with a positional relationship of said substrate stage versus said projection optical system.

12. The projection exposure apparatus according to claim 11, wherein said light lead-out system and said light receiving system are optically connectable only when said substrate stage is in a specified positional relationship with respect to said projection optical system.

13. The projection exposure apparatus according to claim 12, wherein said projection optical system has a predetermined projection field on said substrate stage, and
said light lead-out system and said light receiving system are optically connected in a state where the predetermined position on said substrate stage exists within the projection field.

14. The projection exposure apparatus according to claim 11, said light receiving optical system comprising:
- a light guide member so located as to guide the light beams from said projection optical system that have been introduced into said substrate stage, to a predetermined position inside said substrate stage or outside said substrate stage; and
- a light receiving portion, located outside said substrate stage, to receive light beams emerging from an emerging end of said light guide member.

15. A projection exposure apparatus according to claim 14, further comprising:
- a lens system, disposed between the emerging end of said light guide member and a light receiving surface of said light receiving portion, to optically connect the emerging end of said third light guide member to the light receiving surface.

16. A projection exposure apparatus according to claim 14, wherein the emerging end of said light guide member is located in close proximity to a light receiving surface of said light receiving surface.

17. A projection exposure apparatus for projecting a transfer pattern on a mask upon a photosensitive substrate, comprising:
- an illumination optical system having a light source;
- a mask support member, disposed on a light path of illumination light beams from said illumination optical system, to support the mask formed with the transfer pattern so as to permit the illumination light beams to pass through the mask;
- a projection optical system to form an image of the pattern on the substrate based on the illumination light beams from the mask;
- a substrate stage, to hold the substrate, which is movable at least within a predetermined plane to locate the substrate with respect to said projection optical system;

a light sending optical system comprising:
- a predetermined light source existing outside said substrate stage;
- a light introducing system so constructed as to introduce the light beams from said predetermined light source into said substrate stage; and
- a light irradiating system so constructed as to lead the light beams introduced into said substrate stage by said light introducing system, to a predetermined position on said substrate stage,
- said light introducing system and said light irradiating system being mechanically separated and being located so that said light introducing system and said light irradiating system are optically connectable in accordance with a positional relationship of said substrate stage versus said projection optical system; and a light receiving optical system comprising:
- a light lead-out system so constructed as to lead, outside said substrate stage, light beams from said projection optical system that have been introduced into said substrate stage; and
- a light receiving system provided in such a position as to receive the light beams led outside said substrate stage by said light lead-out system,
- said light lead-out system and said light receiving system being mechanically separated and being located so that said light lead-out system and said light receiving system are optically connectable in accordance with a positional relationship of said substrate stage versus said projection optical system.

18. The projection exposure apparatus according to claim 17, wherein said light introducing system and said light irradiating system are so located as to be optically connectable only when said substrate stage is in a specified positional relationship with respect to said projection optical system, and
wherein said light lead-out system and said light receiving system are so located as to be optically connectable only when said substrate stage is in the specified positional relationship.

19. The projection exposure apparatus according to claim 18, wherein said projection optical system has a predetermined projection field on said substrate stage, and
the specified positional relationship is a state where the predetermined position on said substrate stage exists within the projection field.

20. The projection exposure apparatus according to claim 19, wherein a predetermined pattern area is formed in the predetermined position on said substrate stage.

21. The projection exposure apparatus according to claim 20, wherein said light irradiating system leads the light beams from said light introducing system to the predetermined pattern area, and
said light introducing system receives the light beams from the predetermined pattern area after the beams travel in a sequence such as said projection optical system, the mask and said projection optical system.

22. The projection exposure apparatus according to claim 19, wherein at least one of said light introducing system and said light receiving system has a field, a size of which is substantially equal to the field of said projection optical system.

23. A method of manufacturing a semiconductor device, comprising:
transferring a circuit pattern formed on a mask onto a photosensitive substrate through a projection optical system by use of said projection exposure apparatus claimed in claim 19.

24. The method of manufacturing the semiconductor device according to claim 23, further comprising:

detecting a position of the mask with respect to the predetermined pattern on said substrate stage.

25. The projection exposure apparatus according to claim 17, wherein an optical member, closest to said substrate stage, of said light introducing system and an optical member, closest to said substrate stage, of said light receiving system, are located within substantially the same plane.

26. The projection exposure apparatus according to claim 17, further comprising:

a fine adjustment mechanism for finely moving at least one of said light introducing system and said light receiving system.

27. The projection exposure apparatus according to claim 17, further comprising:

a dual-purpose optical system serving as said light introducing system of said light sending optical system and as said light receiving system of said light receiving optical system.

28. The projection exposure apparatus according to claim 17, wherein said light sending optical system comprises:

a first light guide member so located as to guide the light beams from said predetermined light source to a first predetermined position outside said substrate stare; and a second light guide member so located as to guide the light beams emerging from an emerging end of said first light guide member, and wherein said light receiving optical system comprises:

a third light guide member so located as to guide the light beams from said projection optical system that have been introduced into said substrate stage, to a second predetermined position outside said, substrate stage; and a light receiving portion, located outside said substrate stage, which receives light beams emerging from an emerging end of said third light guide member.

29. The projection exposure apparatus according to claim 28, wherein said second light guide member and said third light guide member are composed of a common dual purpose light guide member.

30. The projection exposure apparatus according to claim 28, wherein a light receiving surface of said light receiving portion is so located as to receive the light beams from said light lead-out system through said first light guide member.

31. The projection exposure apparatus according to claim 17, wherein said light introducing system leads the light beams to said light irradiating system within said substrate stage from a projection optical system side of said substrate stage.

* * * * *